US012787401B2

(12) United States Patent
Chen et al.

(10) Patent No.: US 12,787,401 B2
(45) Date of Patent: Nov. 3, 2026

(54) SHAPE OF CORE GATE ELECTRODE OF SEMICONDUCTOR DEVICE STRUCTURE AND METHODS OF FORMING THE SAME

(71) Applicant: TAIWAN SEMICONDUCTOR MANUFACTURING COMPANY, LTD., Hsinchu (TW)

(72) Inventors: Jhen-Wei Chen, Tainan (TW); Ling-Sung Wang, Tainan (TW); Yung-Yu Chen, Tainan (TW); Yi-Ming Lin, Changhua (TW)

(73) Assignee: TAIWAN SEMICONDUCTOR MANUFACUTRING COMPANY, LTD., Hsinchu (TW)

( * ) Notice: Subject to any disclaimer, the term of this patent is extended or adjusted under 35 U.S.C. 154(b) by 1207 days.

(21) Appl. No.: 17/744,756

(22) Filed: May 16, 2022

(65) Prior Publication Data

US 2023/0369455 A1 Nov. 16, 2023

(51) Int. Cl.

| | |
|---|---|
| ***H10D 64/01*** | (2025.01) |
| ***H10D 30/01*** | (2025.01) |
| ***H10D 30/62*** | (2025.01) |
| ***H10D 84/01*** | (2025.01) |
| ***H10D 84/03*** | (2025.01) |

(52) U.S. Cl.

CPC ......... *H10D 64/021* (2025.01); *H10D 30/024* (2025.01); *H10D 30/6211* (2025.01); *H10D 84/0147* (2025.01); *H10D 84/038* (2025.01)

(58) Field of Classification Search

CPC ............... H10D 64/021; H10D 30/024; H10D 30/6211; H10D 84/0147; H10D 84/038; H10D 30/797; H10D 64/017; H10D 64/015; H10D 64/518; H10D 62/82; H10D 62/822; H10D 64/256; H10D 64/667; H10D 84/0142; H10D 84/0149; H10D 84/0158; H10D 84/83; H10D 84/834; H01L 21/28114

See application file for complete search history.

(56) References Cited

U.S. PATENT DOCUMENTS 7,274,069 B2 * 9/2007 Deppe .................. H10D 64/037 257/302
7,355,244 B2 * 4/2008 Gonzalez ............. H10D 30/608 257/E29.267

(Continued)

*Primary Examiner* — Ismail A Muse
(74) *Attorney, Agent, or Firm* — NZ Carr Law Office

(57) ABSTRACT

A semiconductor device structure, along with methods of forming such, are described. The semiconductor device structure includes a first gate electrode, which includes a first section having a slanted sidewall and an imaginary sidewall, a second section extending radially from the imaginary sidewall of the first section, the second section has a curved bottom, and a third section extending downwardly from the first section, wherein the third section has a straight sidewall, and the slanted sidewall of the first section connects the straight sidewall of the third section to the curved bottom of the second section. The semiconductor device structure also includes a first gate dielectric layer in contact with the straight sidewall of the third section and the slanted sidewall of the first section, and a first gate spacer in contact with the first gate dielectric layer and the slanted sidewall of the first section.

20 Claims, 46 Drawing Sheets

(56) References Cited

U.S. PATENT DOCUMENTS

| | | | | |
|---|---|---|---|---|
| 9,029,920 | B2 * | 5/2015 | Xie | H10D 64/017<br>257/288 |
| 9,093,467 | B1 * | 7/2015 | Xie | H10D 64/021 |
| 9,093,530 | B2 | 7/2015 | Huang et al. | |
| 9,171,929 | B2 | 10/2015 | Lee et al. | |
| 9,196,495 | B2 * | 11/2015 | Utsuno | H10D 30/69 |
| 9,214,555 | B2 | 12/2015 | Oxland et al. | |
| 9,236,267 | B2 | 1/2016 | De et al. | |
| 9,496,361 | B1 * | 11/2016 | Tung | H10D 64/685 |
| 9,520,482 | B1 | 12/2016 | Chang et al. | |
| 9,548,303 | B2 | 1/2017 | Lee et al. | |
| 9,564,489 | B2 | 2/2017 | Yeo et al. | |
| 9,576,814 | B2 | 2/2017 | Wu et al. | |
| 9,601,342 | B2 | 3/2017 | Lee et al. | |
| 9,608,116 | B2 | 3/2017 | Ching et al. | |
| 10,468,411 | B2 * | 11/2019 | Chung | H10D 30/62 |
| 10,868,138 | B2 * | 12/2020 | Chang | H10D 84/038 |
| 11,411,106 | B2 * | 8/2022 | Kim | H10D 30/6735 |
| 2011/0101470 | A1 * | 5/2011 | Hempel | H01L 21/28026<br>257/E21.409 |
| 2016/0071944 | A1 * | 3/2016 | Lu | H10D 84/84<br>438/591 |
| 2017/0125534 | A1 * | 5/2017 | Hsieh | H10D 30/62 |
| 2018/0374927 | A1 * | 12/2018 | Liu | H10D 64/518 |
| 2020/0312972 | A1 * | 10/2020 | Hsieh | H10D 64/667 |

* cited by examiner

SHAPE OF CORE GATE ELECTRODE OF SEMICONDUCTOR DEVICE STRUCTURE AND METHODS OF FORMING THE SAME

BACKGROUND

An integrated circuit (IC) typically includes a plurality of semiconductor devices, such as field-effect transistors (FET) and metal interconnection layers formed on a semiconductor substrate. The semiconductor industry has experienced continuous rapid growth due to constant improvements in the performance of various electronic components, including the gates which are used to alter the flow of current between a source and a drain. With continuous gate-length scaling associated with denser device layouts, the gate resistance ($R_g$) of the FET increases. When the gate resistance is increased, the switching speed of the FET is delayed and the power consumption is increased. This has become a bottleneck in applications that require high switching speed, such as fifth generation (5G) wireless networks and radio frequency (RF) technologies. Therefore, there remains a need to reduce the gate resistance of FETs.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIGS. 5A-20A and 22A-42A are cross-sectional side views of various stages of manufacturing the semiconductor device structure of FIG. 4 taken along cross-section A-A, in accordance with some embodiments.

FIGS. 5B-20B and 22B-42B are cross-sectional side views of various stages of manufacturing the semiconductor device structure of FIG. 4 taken along cross-section B-B, in accordance with some embodiments.

DETAILED DESCRIPTION

Figure 1:
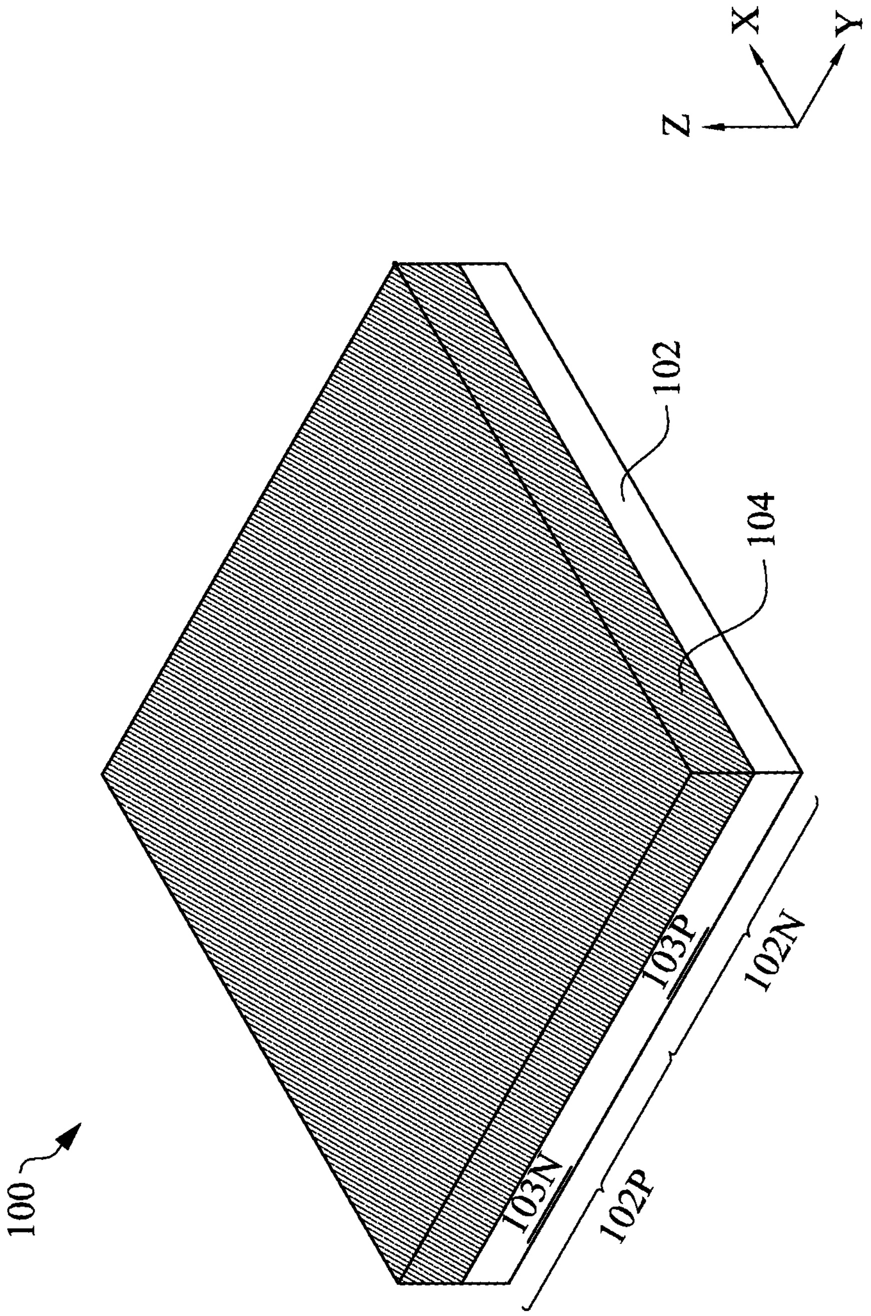
FIGS. 1-4 are perspective views of a semiconductor device structure, in accordance with some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as “beneath,” “below,” “lower,” “above,” “over,” “on,” “top,” “upper” and the like, may be used herein for ease of description to describe one element or feature’s relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

FIGS. 1-43 illustrate various stages of manufacturing a semiconductor device structure 100 in accordance with various embodiments of this disclosure. It is understood that additional operations can be provided before, during, and after processes shown by FIGS. 1-43 and some of the operations described below can be replaced or eliminated, for additional embodiments of the method. The order of the operations/processes may be interchangeable.

FIGS. 1-4 are perspective views of various stages of manufacturing a semiconductor device structure 100, in accordance with some embodiments. In FIG. 1, a first semiconductor layer 104 is formed on a substrate 102. The substrate may be a part of a chip in a wafer. In some embodiments, the substrate 102 is a bulk semiconductor substrate, such as a semiconductor wafer. For example, the substrate 102 is a silicon wafer. The substrate 102 may include silicon or another elementary semiconductor material such as germanium. In some other embodiments, the substrate 102 includes a compound semiconductor. The compound semiconductor may include gallium arsenide, silicon carbide, indium arsenide, indium phosphide, another suitable semiconductor material, or a combination thereof. In some embodiments, the substrate 102 is a semiconductor-on-insulator (SOI) substrate. The SOI substrate may be fabricated using a separation by implantation of oxygen (SIMOX) process, a wafer bonding process, another applicable method, or a combination thereof.

The substrate 102 may be doped with P-type or N-type impurities. As shown in FIG. 1, the substrate 102 has a P-type region 102P and an N-type region 102N adjacent to the P-type region 102P, and the P-type region 102P and N-type region 102N belong to a continuous substrate 102, in accordance with some embodiments. In some embodiments of the present disclosure, the P-type region 102P is used to form a PMOS device thereon, whereas the N-type region 102N is used to form an NMOS device thereon. In some embodiments, an N-well region 103N and a P-well region 103P are formed in the substrate 102, as shown in FIG. 1. For example, the N-well region 103N may be formed in the substrate 102 in the P-type region 102P, whereas the P-well region 103P may be formed in the substrate 102 in the N-type region 102N. The P-well region 103P and the N-well region 103N may be formed by any suitable technique, for example, by separate ion implantation processes in some embodiments. By using two different implantation mask layers (not shown), the P-well region 103P and the N-well region 103N can be sequentially formed in different ion implantation processes.

The first semiconductor layer 104 is deposited over the substrate 102, as shown in FIG. 1. The first semiconductor layer 104 may be made of any suitable semiconductor material, such as silicon, germanium, III-V semiconductor material, or combinations thereof. In one exemplary embodiment, the first semiconductor layer 104 is made of silicon. The first semiconductor layer 104 may be formed by an epitaxial growth process, such as metal-organic chemical vapor deposition (MOCVD), metal-organic vapor phase epitaxy (MOVPE), plasma-enhanced chemical vapor deposition (PECVD), remote plasma chemical vapor deposition (RP-CVD), molecular beam epitaxy (MBE), hydride vapor phase epitaxy (HVPE), liquid phase epitaxy (LPE), chloride vapor phase epitaxy (Cl-VPE), or any other suitable process.

Figure 2:
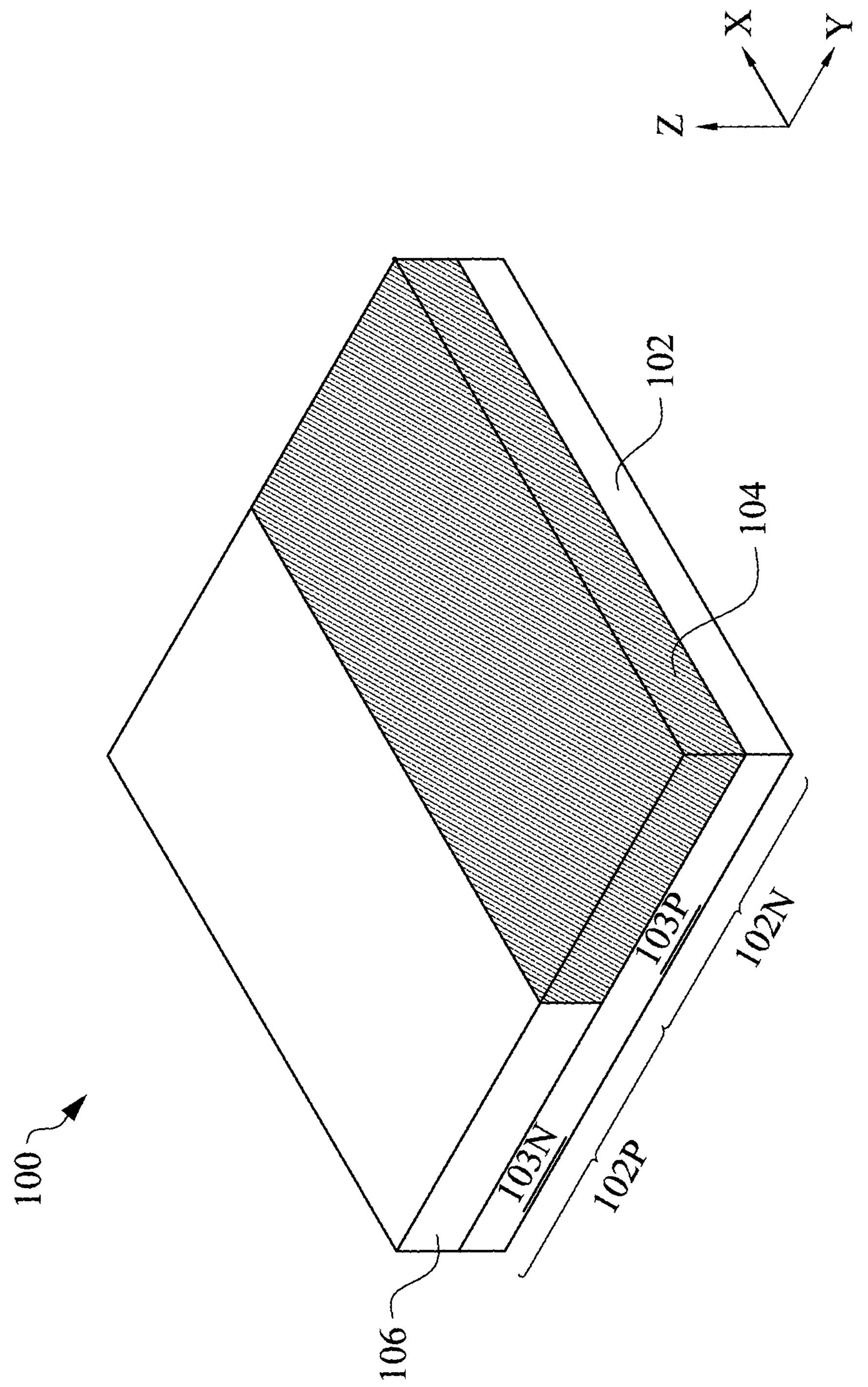

In FIG. 2, the portion of the first semiconductor layer 104 disposed over the N-well region 103N is removed, and a second semiconductor layer 106 is formed over the N-well region 103N and adjacent the portion of the first semiconductor layer 104 disposed over the P-well region 103P. A patterned mask layer (not shown) may be first formed on the portion of the first semiconductor layer 104 disposed over the P-well region 103P, and the portion of the first semiconductor layer 104 disposed over the N-well region 103N may be exposed. A removal process, such as a dry etch, wet etch, or a combination thereof, may be performed to remove the portion of the first semiconductor layer 104 disposed over the N-well region 103N, and the N-well region 103N may be exposed. The removal process does not substantially affect the mask layer (not shown) formed on the portion of the first semiconductor layer 104 disposed over the P-well region 103P, which protects the portion of the first semiconductor layer 104 disposed over the P-well region 103P. Next, the second semiconductor layer 106 is formed on the exposed N-well region 103N. The second semiconductor layer 106 may be made of any suitable semiconductor material, such as silicon, germanium, III-V semiconductor material, or combinations thereof. In one exemplary embodiment, the second semiconductor layer 106 is made of silicon germanium. The second semiconductor layer 106 may be formed by the same process as the first semiconductor layer 104. For example, the second semiconductor layer 106 may be formed on the exposed N-well region 103N by an epitaxial growth process, which does not form the second semiconductor layer 106 on the mask layer (not shown) disposed on the first semiconductor layer 104. As a result, the first semiconductor layer 104 is disposed over the P-well region 103P in the N-type region 102N, and the second semiconductor layer 106 is disposed over the N-well region 103N in the P-type region 102P.

Portions of the first semiconductor layer 104 may serve as channels in the subsequently formed NMOS device in the N-type region 102N. Portions of the second semiconductor layer 106 may serve as channels in the subsequently formed PMOS device in the P-type region 102P. In some embodiments, the NMOS device and the PMOS device are FinFETs. While embodiments described in this disclosure are described in the context of FinFETs, implementations of some aspects of the present disclosure may be used in other processes and/or in other devices, such as planar FETs, dual-gate FETs, tri-gate FETS, nanosheet channel FETs, forksheet FETs, Horizontal Gate All Around (HGAA) FETs, Vertical Gate All Around (VGAA) FETs, complementary FETs, negative-capacitance FETs, and other suitable devices.

Figure 3:
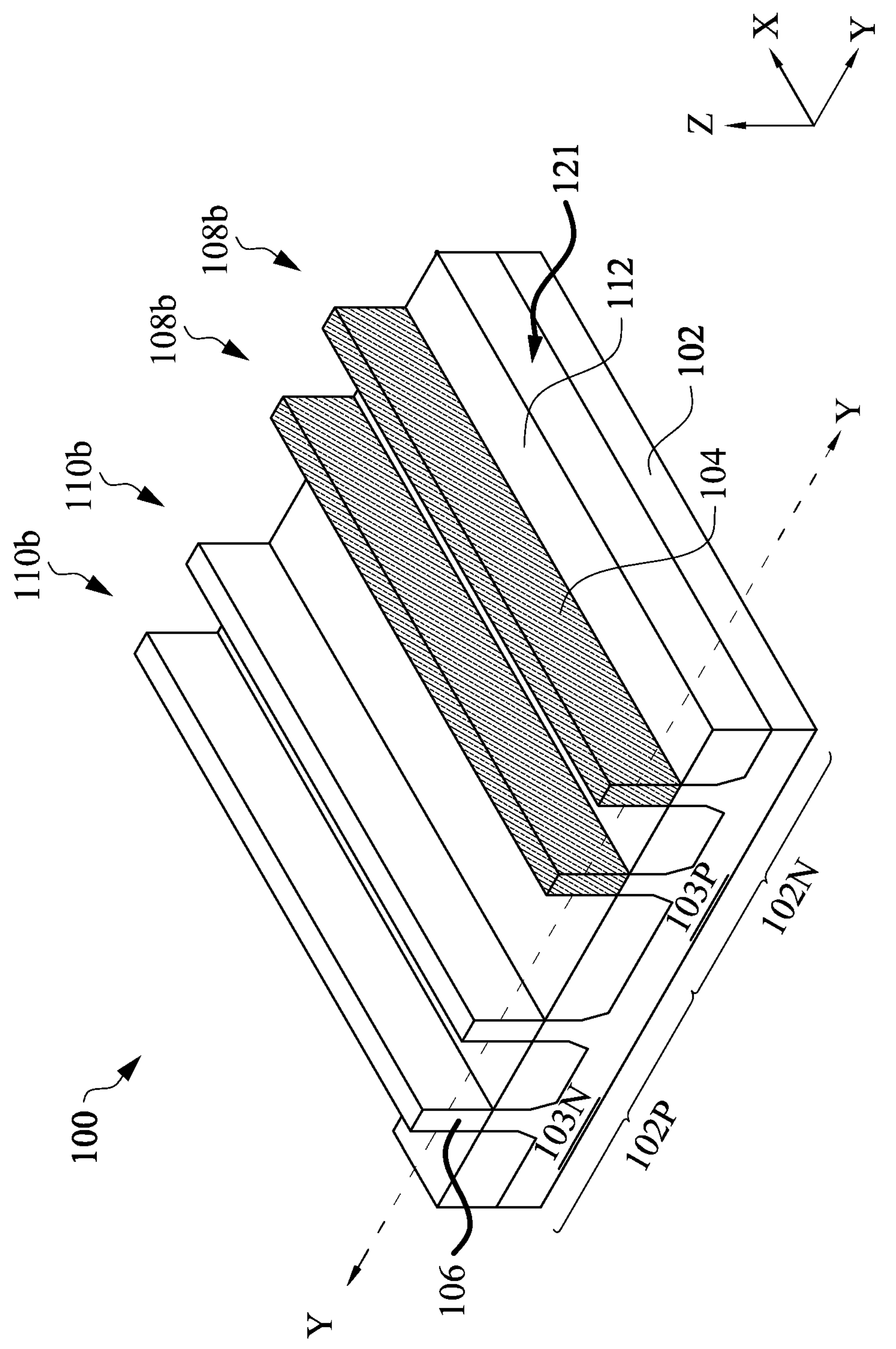

In FIG. 3, a plurality of fins 108*a*, 108*b*, 110*a*, 110*b* are formed from the first and second semiconductor layers 104, 106, respectively, and STI regions 121 are formed. The fins 108*a*, 108*b*, 110*a*, 110*b* may be patterned by any suitable method. For example, the fins 108*a*, 108*b*, 110*a*, 110*b* may be patterned using one or more photolithography processes, including double-patterning or multi-patterning processes. Generally, double-patterning or multi-patterning processes combine photolithography and self-aligned processes, allowing patterns to be created that have, for example, pitches smaller than what is otherwise obtainable using a single, direct photolithography process. For example, in one embodiment, a sacrificial layer (not shown) is formed over a substrate and patterned using a photolithography process. Spacers (not shown) are formed alongside the patterned sacrificial layer using a self-aligned process. The sacrificial layer is then removed, and the remaining spacers may then be used to pattern the substrate and form the fins.

The fins 108*a*, 108*b* may each include the first semiconductor layer 104, and a portion of the first semiconductor layer 104 may serve as an NMOS channel. Each fin 108*a*, 108*b* may also include the P-well region 103P. Likewise, the fins 110*a*, 110*b* may each include the second semiconductor layer 106, and a portion of the second semiconductor layer 106 may serve as a PMOS channel. Each fin 110*a*, 110*b* may also include the N-well region 103N. A mask (not shown) may be formed on the first and second semiconductor layers 104, 106, and may remain on the fins 108*a-b* and 110*a-b*.

Once the fins 108*a-b*, 110*a-b* are formed, an insulating material 112 is formed between adjacent fins 108*a-b*, 110*a-b*. The insulating material 112 may be first formed between adjacent fins 108*a-b*, 110*a-b* and over the fins 108*a-b*, 110*a-b*, so the fins 108*a-b*, 110*a-b* are embedded in the insulating material 112. A planarization process, such as a chemical-mechanical polishing (CMP) process may be performed to expose the top of the fins 108*a-b*, 110*a-b*. In some embodiments, the planarization process exposes the top of the mask (not shown) disposed on the fins 108*a-b* and 110*a-b*. The insulating material 112 are then recessed by removing a portion of the insulating material 112 located on both sides of each fin 108*a-b*, 110*a-b*. The insulating material 112 may be recessed by any suitable removal process, such as dry etch or wet etch that selectively removes the insulating material 112 but does not substantially affect the semiconductor materials of the fins 108*a-b*, 110*a-b*. The insulating material 112 may include an oxygen-containing material, such as silicon oxide, carbon or nitrogen doped oxide, or fluorine-doped silicate glass (FSG); a nitrogen-containing material, such as silicon nitride, silicon oxynitride (SiON), SiOCN, SiCN; a low-K dielectric material (e.g., a material having a K value lower than that of silicon dioxide); or any suitable dielectric material. The insulating material 112 may be formed by any suitable method, such as low-pressure chemical vapor deposition (LPCVD), plasma enhanced CVD (PECVD) or flowable CVD (FCVD). The insulating material 112 may be shallow trench isolation (STI) region, and is referred to as STI region 121 in this disclosure.

In some alternative embodiments, instead of forming first and second semiconductor layers 104, 106 over the substrate 102, the fins 108*a-b*, 110*a-b* may be formed by first forming isolation regions (e.g., STI regions 121) on a bulk substrate (e.g., substrate 102). The formation of the STI regions may include etching the bulk substrate to form trenches, and filling the trenches with a dielectric material to form the STI regions. The portions of the substrate between neighboring STI regions form the fins. The top surfaces of the fins and the top surfaces of the STI regions may be substantially level with each other by a CMP process. After the STI regions are formed, at least top portions of, or substantially entireties of, the fins are removed. Accordingly, recesses are formed between STI regions. The bottom surfaces of the STI regions may be level with, higher, or lower than the bottom surfaces of the STI regions. An epitaxy is then performed to separately grow first and second semiconductor layers (e.g., first and second semiconductor layers 104, 106) in the recesses created as a result of removal of the portions of the fins, thereby forming fins (e.g., fins 108*a-b*, 110*a-b*). A CMP is then performed until the top surfaces of the fins and the top surfaces of the STI regions are substantially co-planar. In some embodiments, after the epitaxy and the CMP, an implantation process is performed to define well regions (e.g., P-well region 103P and N-well region 103N) in the substrate. Alternatively, the fins are in-situ doped with impurities (e.g., dopants having P-type or N-type conductivity) during the epitaxy. Thereafter, the STI regions are recessed so that fins of first and second semiconductor layers (e.g., fins 108*a-b*, 110*a-b*) are extending upwardly over the STI regions from the substrate, in a similar fashion as shown in FIG. 3.

In some alternative embodiments, one of the fins 108*a-b* (e.g., fin 108*a*) in the N-type region 102N is formed of the second semiconductor layer 106, and the other fin 108*b* in the N-type region 102N is formed of the first semiconductor layer 104. In such cases, the subsequent S/D epitaxial features 152 formed on the fins 108*a* and 108*b* in the N-type region 102N may be Si or SiGe. In some alternative embodiments, the fins 108*a-b* and 110*a-b* are formed directly from a bulk substrate (e.g., substrate 102), which may be doped with P-type or N-type impurities to form well regions (e.g., P-well region 103P and N-well region 103N). In such cases, the fins are formed of the same material as the substrate 102. In one exemplary embodiment, the fins and the substrate 102 are formed of silicon.

Figure 4:
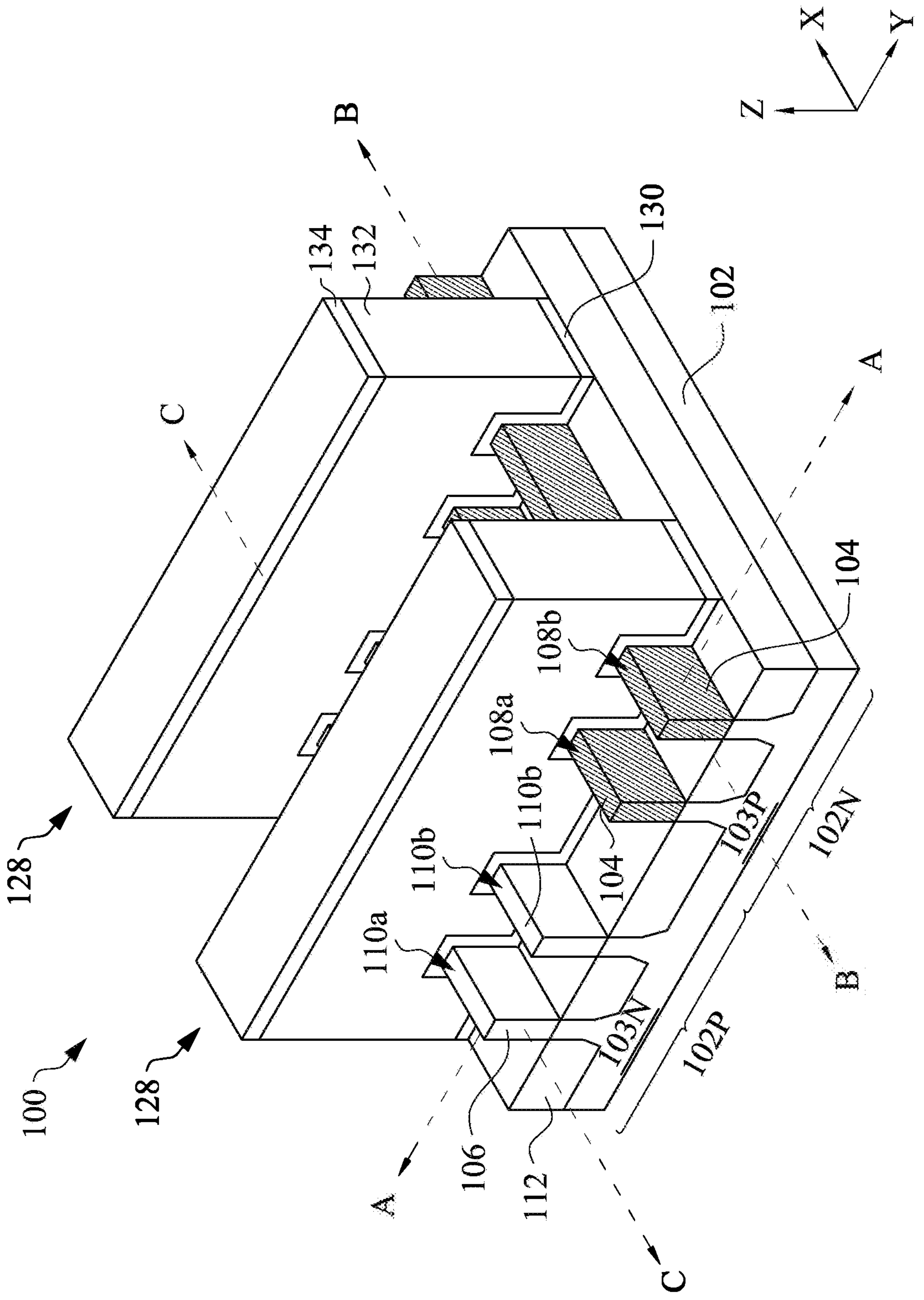

In FIG. 4, one or more sacrificial gate structures 128 are formed on a portion of the fins 108*a-b*, 110*a-b*. Each sacrificial gate structure 128 may include a sacrificial gate dielectric layer 130, a sacrificial gate electrode layer 132, and a mask structure 134. The sacrificial gate dielectric layer 130 may include one or more layers of dielectric material, such as $SiO_2$, SiN, a high-K dielectric material, and/or other suitable dielectric material. In some embodiments, the sacrificial gate dielectric layer 130 may be deposited by a CVD process, a sub-atmospheric CVD (SACVD) process, a FCVD process, an ALD process, a PVD process, or other suitable process. The sacrificial gate electrode layer 132 may include polycrystalline silicon (polysilicon). The mask structure 134 may include an oxygen-containing layer and a nitrogen-containing layer. In some embodiments, the sacrificial gate electrode layer 132 and the mask structure 134 are formed by various processes such as layer deposition, for example, CVD (including both LPCVD and PECVD), PVD, ALD, thermal oxidation, e-beam evaporation, or other suitable deposition techniques, or combinations thereof.

The sacrificial gate structures 128 may be formed by first depositing blanket layers of the sacrificial gate dielectric layer 130, the sacrificial gate electrode layer 132, and the mask structure 134, followed by pattern and etch processes. For example, the pattern process includes a lithography process (e.g., photolithography or e-beam lithography) which may further include photoresist coating (e.g., spin-on coating), soft baking, mask aligning, exposure, post-exposure baking, photoresist developing, rinsing, drying (e.g., spin-drying and/or hard baking), other suitable lithography techniques, and/or combinations thereof. In some embodiments, the etch process may include dry etch (e.g., RIE), wet etch, other etch methods, and/or combinations thereof. By patterning the sacrificial gate structures 128, the fins 108*a-b*, 110*a-b* are partially exposed on opposite sides of the sacrificial gate structures 128. While two sacrificial gate structures 128 are shown in FIG. 4, it can be appreciated that they are for illustrative purpose only and any number of the sacrificial gate structures 128 may be formed.

FIGS. 5A-20A and 22A-42A are cross-sectional side views of various stages of manufacturing the semiconductor device structure 100 of FIG. 4 taken along cross-section A-A, in accordance with some embodiments. FIGS. 5B-20B and 22B-42B are cross-sectional side views of various stages of manufacturing the semiconductor device structure 100 of FIG. 4 taken along cross-section B-B, in accordance with some embodiments. FIGS. 20C, 33C, and 42C are cross-sectional side views of one stage of manufacturing the semiconductor device structure 100 of FIG. 4 taken along cross-section C-C, in accordance with some embodiments. Cross-section B-B is in a plane of the fin 108*b* along the X direction. Cross-section C-C is in a plane of the fin 110*a* along the X direction. Cross-section A-A is in a plane perpendicular to cross-section B-B and is in the S/D epitaxial features 152, 154 (FIG. 6A) along the Y-direction.

Figure 5B:
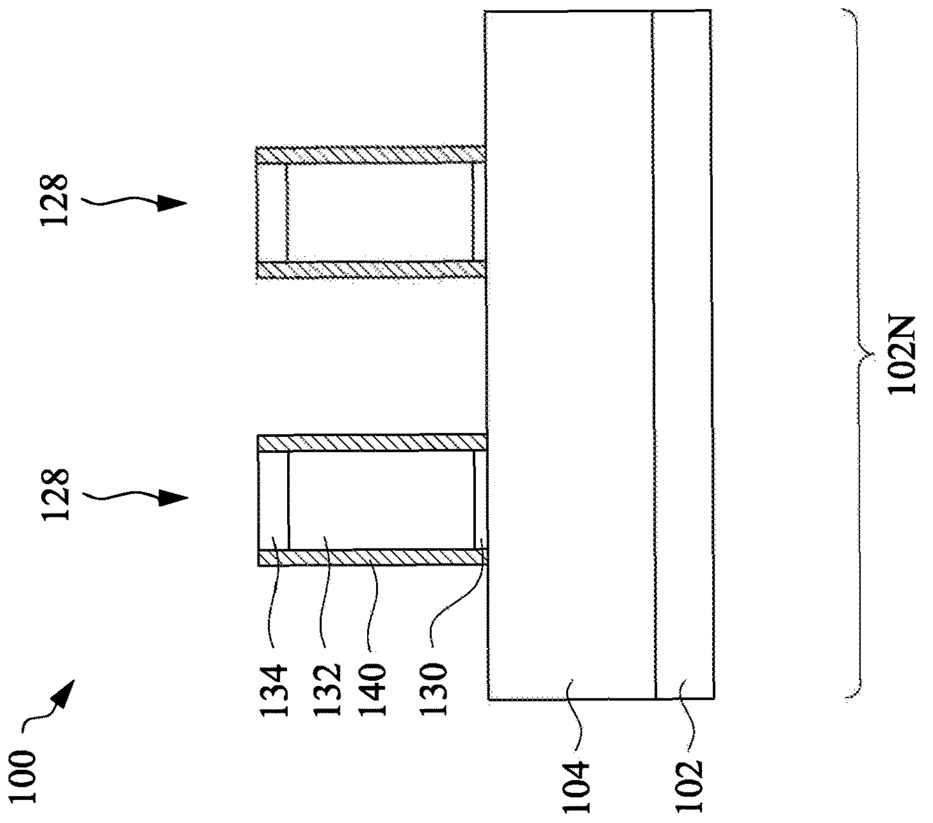
Figure 5A:
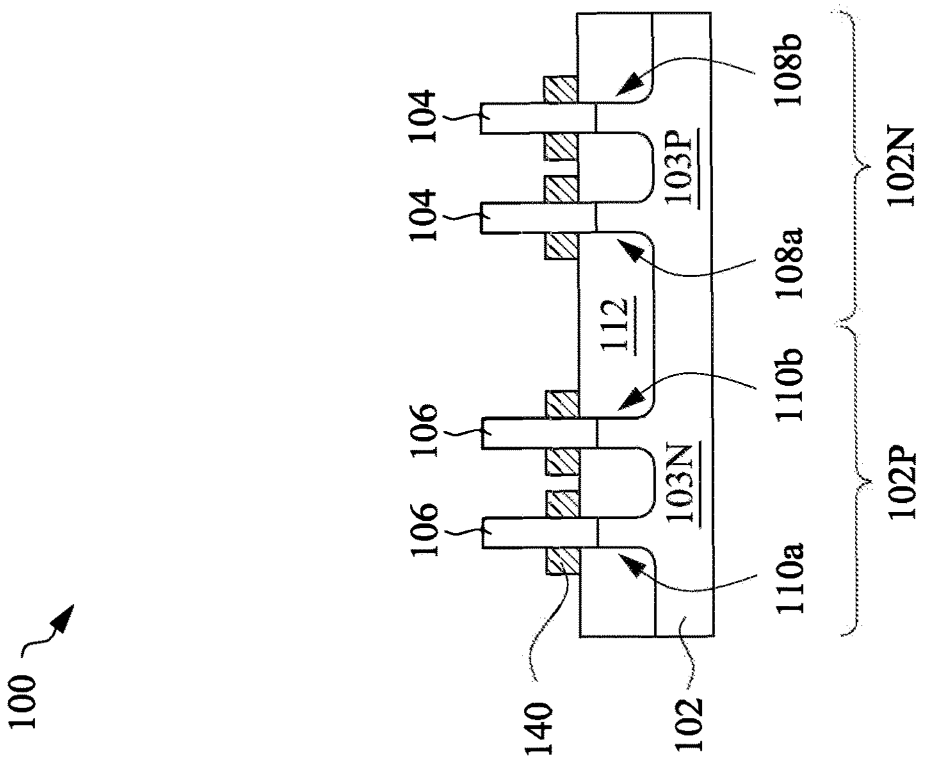

In FIGS. 5A-5B, a gate spacer 140 is formed on the sacrificial gate structures 128 and the exposed portions of the first and second semiconductor layers 104, 106. The gate spacer 140 may be conformally deposited on the exposed surfaces of the semiconductor device structure 100. The conformal gate spacer 140 may be formed by ALD or any suitable processes. An anisotropic etch is then performed on the gate spacer 140 using, for example, RIE. During the anisotropic etch process, most of the gate spacer 140 is removed from horizontal surfaces, such as tops of the sacrificial gate structures 128 and tops of the fins 108*a-b*, 110*a-b*, leaving the gate spacer 140 on the vertical surfaces, such as on opposite sidewalls of the sacrificial gate structures 128. The gate spacers 140 may partially remain on opposite sidewalls of the fins 108*a-b*, 110*a-b*, as shown in FIG. 5A. In some embodiments, the gate spacers 140 formed on the source/drain regions of the fins 108*a-b*, 110*a-b* are fully removed.

The gate spacer 140 may be made of a dielectric material such as silicon oxide ($SiO_2$), silicon nitride ($Si_3N_4$), silicon carbide (SiC), silicon oxynitride (SiON), silicon carbonnitride (SiCN), silicon oxycarbide (SiOC), silicon oxycarbonitride (SiOCN), air gap, and/or any combinations thereof. In some embodiments, the gate spacer 140 include one or more layers of the dielectric material discussed herein.

Figure 6B:
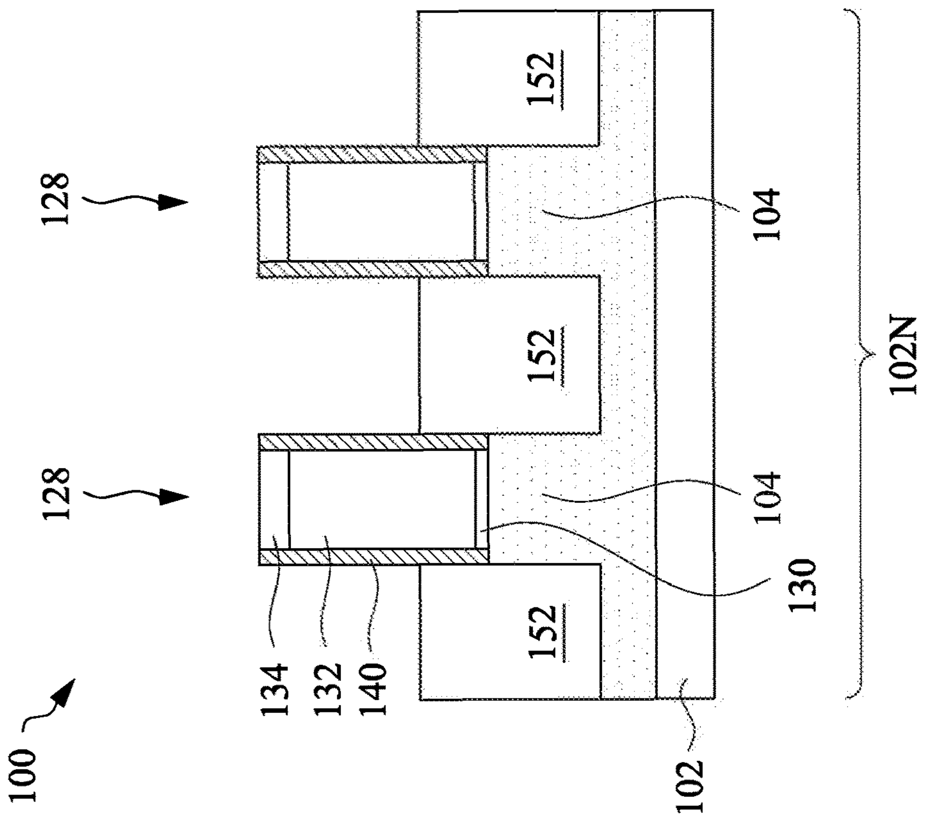
Figure 6A:
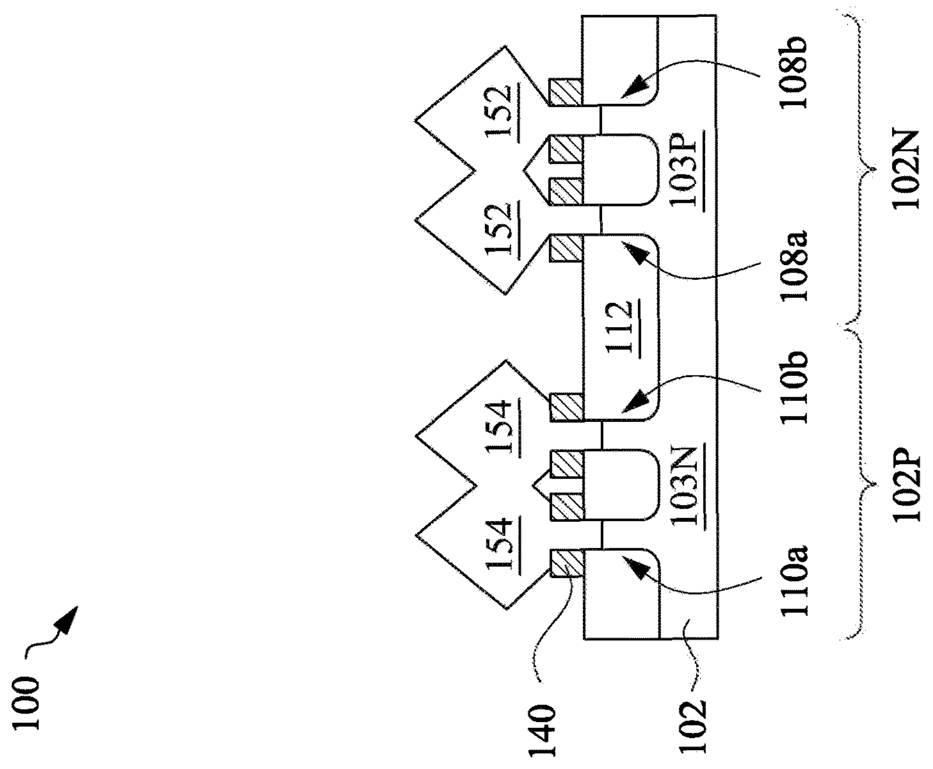

In FIGS. 6A-6B, the first and second semiconductor layers 104, 106 of the fins 108*a-b*, 110*a-b* not covered by the sacrificial gate structures 128 and the gate spacers 140 are recessed, and source/drain (S/D) epitaxial features 152, 154 are formed. For N-channel FETs, the epitaxial S/D features 152 may include one or more layers of Si, SiP, SiC, SiCP, or a group III-V material (InP, GaAs, AlAs, InAs, InAlAs, InGaAs). In some embodiments, the epitaxial S/D features 152 may be doped with N-type dopants, such as phosphorus (P), arsenic (As), etc, for N-type devices. For P-channel FETs, the S/D epitaxial features 154 may include one or more layers of Si, SiGe, SiGeB, Ge, or a group III-V material (InSb, GaSb, InGaSb). In some embodiments, the S/D epitaxial features 154 may be doped with P-type dopants, such as boron (B). The S/D epitaxial features 152, 154 may grow both vertically and horizontally to form facets, which may correspond to crystalline planes of the material used for the substrate 102. The S/D epitaxial features 152, 154 may be formed by an epitaxial growth method using CVD, ALD or MBE.

In some embodiments, the S/D epitaxial features 152, 154 of the fins 108*a*-108*b* and 110*a*-110*b* are merged. The S/D epitaxial features 152, 154 may each have a top surface at a level higher than a top surface of the first semiconductor layer 104, as shown in FIG. 6B.

Figure 7B:
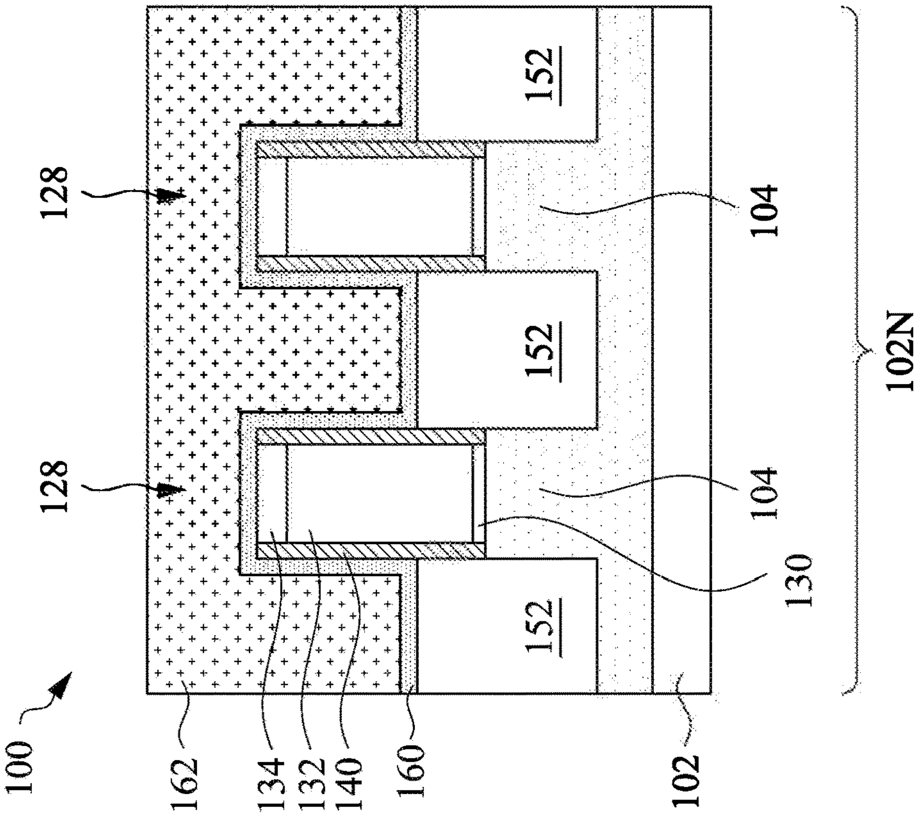
Figure 7A:
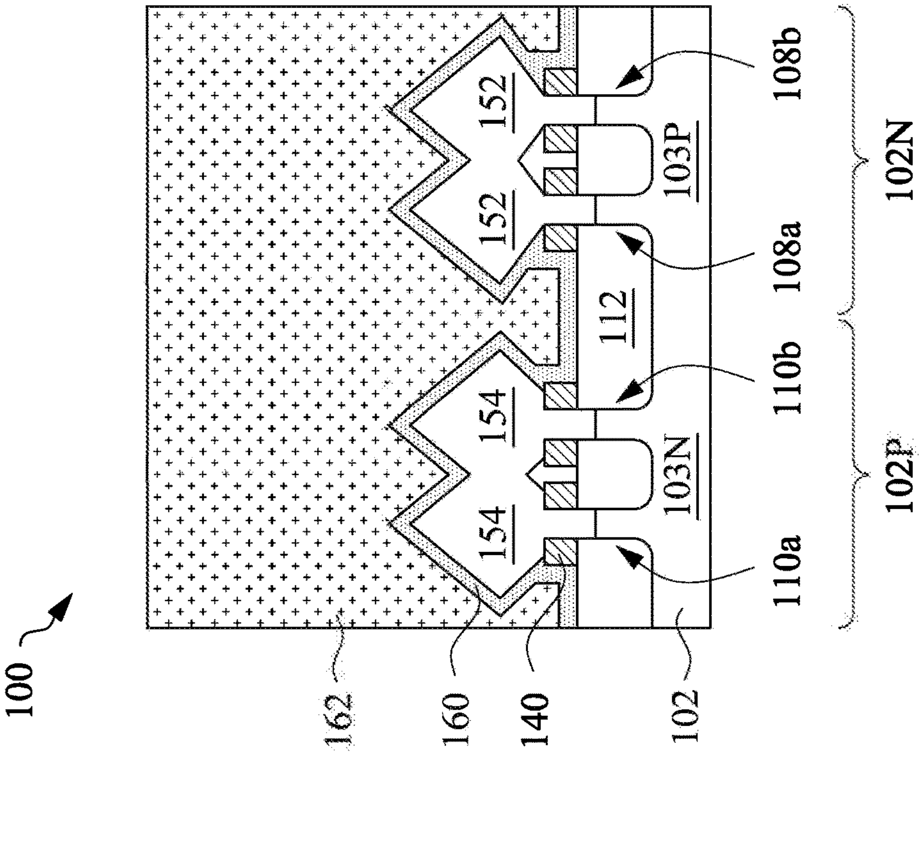

In FIGS. 7A-7B, a contact etch stop layer (CESL) 160 is conformally formed on the exposed surfaces of the semiconductor device structure 100. The CESL 160 covers the sidewalls of the sacrificial gate structures 128, the insulating material 112, and the S/D epitaxial features 152. The CESL 160 may include an oxygen-containing material or a nitrogen-containing material, such as silicon nitride, silicon carbon nitride, silicon oxynitride, carbon nitride, silicon oxide, silicon carbon oxide, or the like, or a combination thereof, and may be formed by CVD, PECVD, ALD, or any suitable deposition technique. Next, a first interlayer dielectric (ILD) 162 is formed on the CESL 160. The materials for the first ILD 162 may include compounds comprising Si, O, C, and/or H, such as tetraethylorthosilicate (TEOS) oxide, un-doped silicate glass, silicon oxide, or doped silicon oxide such as borophosphosilicate glass (BPSG), fused silica glass (FSG), phosphosilicate glass (PSG), boron doped silicon glass (BSG), and/or other suitable dielectric materials. The first ILD 162 may be deposited by a PECVD process or other suitable deposition technique. In some embodiments, after formation of the first ILD 162, the semiconductor device structure 100 may be subject to a thermal process to anneal the first ILD 162. After formation of the first ILD 162, a planarization process is performed to expose the sacrificial gate electrode layer 132. The planarization process may be any suitable process, such as a CMP process. The planarization process removes portions of the first ILD 162 and the CESL 160 disposed on the sacrificial gate structures 128. The planarization process may also remove the mask structure 134.

Figure 8B:
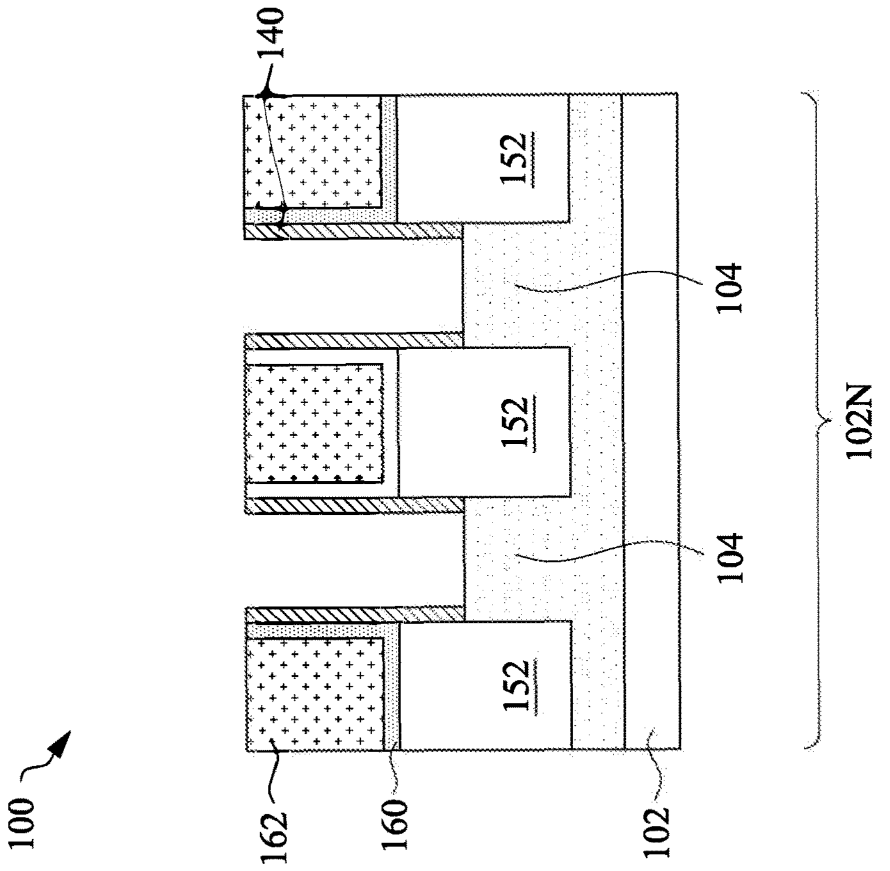
Figure 8A:
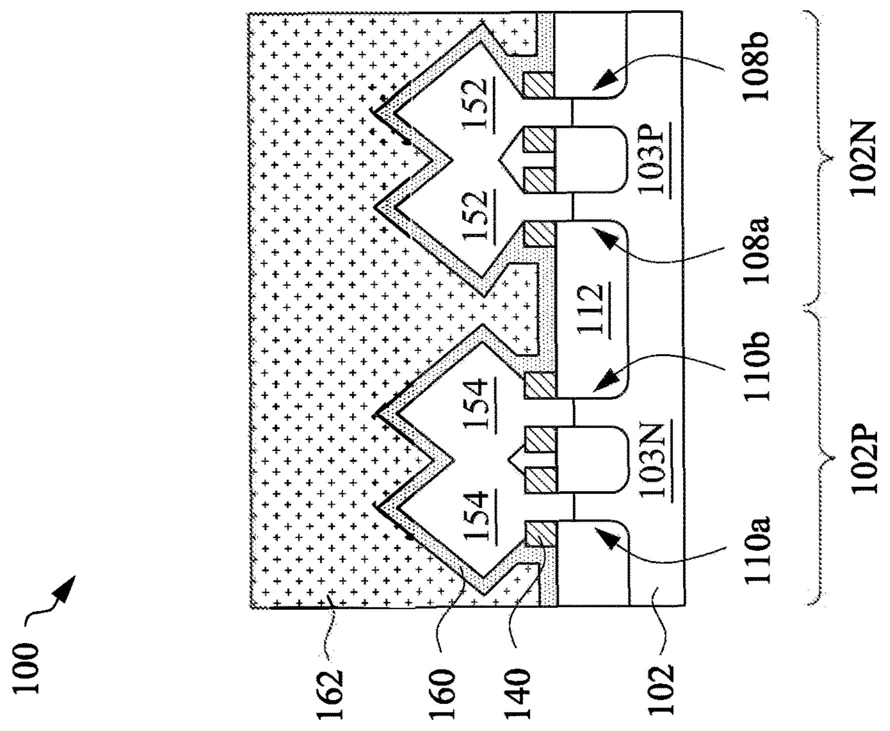

In FIGS. 8A-8B, the mask structure 134 (if not removed during CMP process), the sacrificial gate electrode layers 132 (FIG. 7B), and the sacrificial gate dielectric layers 130 (FIG. 7B) are removed. The sacrificial gate electrode layers 132 and the sacrificial gate dielectric layers 130 may be removed by one or more etch processes, such as dry etch process, wet etch process, or a combination thereof. The one or more etch processes selectively remove the sacrificial gate electrode layers 132 and the sacrificial gate dielectric layers 130 without substantially affects the gate spacer 140, the CESL 160, and the first ILD 162. The removal of the sacrificial gate electrode layers 132 and the sacrificial gate dielectric layers 130 exposes a top portion of the first and second semiconductor layers 104, 106 (only first semiconductor layers 104 is shown in FIG. 8A) in the channel region. In some embodiments, the sacrificial gate dielectric layers 130 may remain after the one or more etch processes.

Figure 9B:
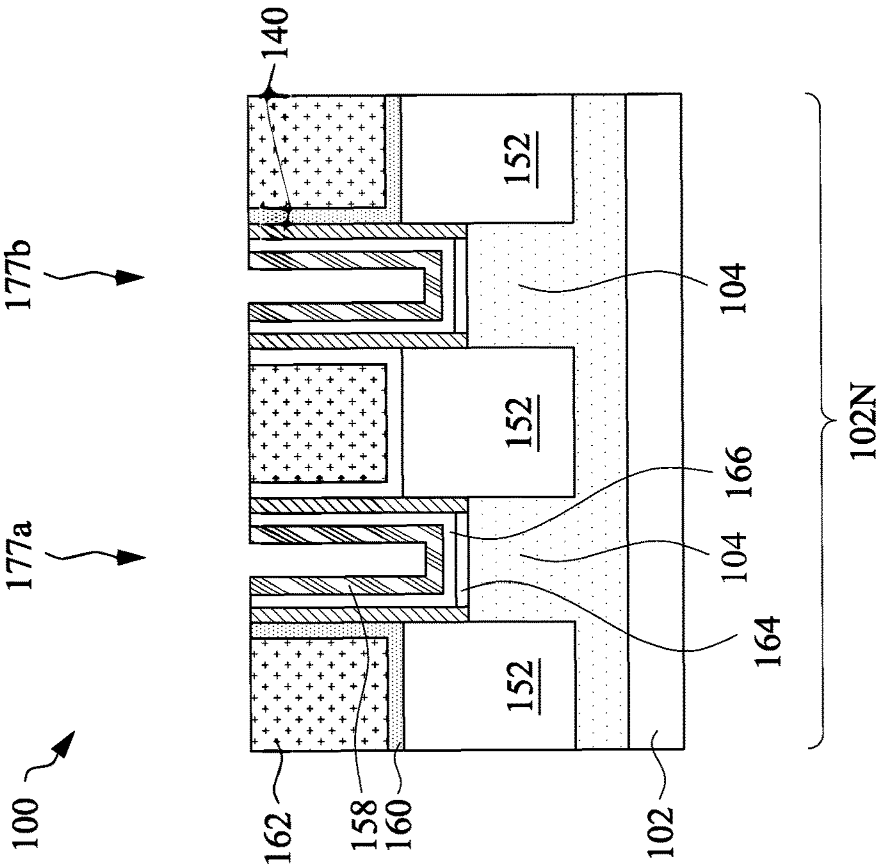
Figure 9A:
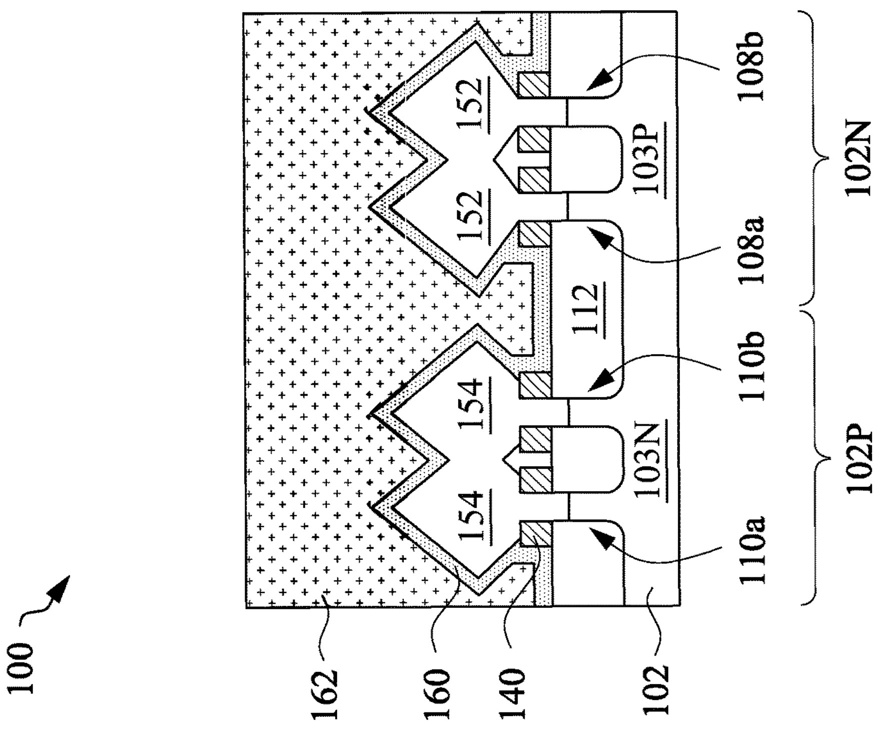

In FIGS. 9A-9B, replacement gate structures 177*a*, 177*b* (referred to herein as 177) are formed in the recesses formed as a result of the removal of the sacrificial gate electrode layers 132 and the sacrificial gate dielectric layers 130. The replacement gate structure 177 may each include an interfacial dielectric 164, a gate dielectric layer 166, one or more conformal layers 158 formed on the gate dielectric layer 166, and a gate electrode layer 168 (or a fill material) (FIG. 10B) formed on the one or more conformal layers 158. The interfacial dielectric 164 is formed on a portion of sidewalls and exposed top portions of the first and second semiconductor layers 104, 106 along the channel regions. The interfacial dielectric 164 can be, for example, the sacrificial gate dielectric layer 130 if not removed, an oxygen-containing material (e.g., silicon oxide) formed by thermal or chemical oxidation of the exposed top portions of the first and second semiconductor layers 104, 106, a nitrogen-containing material (e.g., silicon nitride), and/or any suitable dielectric material layer, and may be formed by any suitable deposition method, such as CVD, PECVD, or ALD.

The gate dielectric layer 166 can be conformally deposited on the interfacial dielectric 164 (or the sacrificial gate dielectric layer 130 if not removed), sidewalls of the gate spacers 140, and on the top surfaces of the first ILD 162 and the CESL 160. In some embodiments, the gate dielectric layer 166 can be or include silicon oxide, silicon nitride, a high-K dielectric material, multilayers thereof, or other suitable dielectric material. In some embodiments, the gate dielectric layer 166 may include the same material(s) as the sacrificial gate dielectric layer 130. A high-K dielectric material may have a k value greater than about 7.0, and may include a metal oxide of, a metal nitride of, or a metal silicate of hafnium (Hf), aluminum (Al), zirconium (Zr), lanthanum (La), magnesium (Mg), barium (Ba), Titanium (Ti), lead (Pb), multilayers thereof, or any combination thereof. The gate dielectric layer 166 may be deposited by ALD, PECVD, MBD, or any suitable deposition technique.

The one or more conformal layers 158 can include one or more barrier and/or capping layers and one or more work-function tuning layers. The one or more barrier and/or capping layers may be metal oxides, metal nitrides, metal silicates, transition metal-oxides, transition metal-nitrides, transition metal-silicates, oxynitrides of metals, metal aluminates, zirconium silicate, zirconium aluminate, combinations of these, or the like, and may be deposited by ALD, PECVD, MBD, or any suitable deposition technique. The barrier layer may be formed of a material different from the capping layer. The work-function tuning layers may be an N-metal work function metal layer or a P-metal work function layer, depending on the application. The N-metal work function layer may be formed from a metallic material such as W, Cu, AlCu, TiAlC, TiAlN, Ti, TiN, Ta, TaN, Co, Ni, Ag, Al, TaAl, TaAlC, TaC, TaCN, TaSiN, Mn, Zr, other suitable N-type work function materials, or combinations thereof. The P-metal work function layer may be formed from a metallic material such as W, Al, Cu, TiN, Ti, TiAlN, Ta, TaN, Co, Ni, TaC, TaCN, TaSiN, $TaSi_2$, $NiSi_2$, Mn, Zr, $ZrSi_2$, TaN, Ru, AlCu, Mo, $MoSi_2$, WN, other metal oxides, metal nitrides, metal silicates, transition metal-oxides, transition metal-nitrides, transition metal-silicates, oxynitrides of metals, metal aluminates, zirconium silicate, zirconium aluminate, combinations of these, or the like.

Once the N-metal work function layer and the P-metal work function layer are formed, the gate electrode layer 168 (or a fill material) is deposited on the one or more conformal layers 158, or on the gate dielectric layer 166. The gate electrode layer 168 may be formed of a material different from the one or more conformal layers 158. Depending on the application and/or conductivity type of the devices in the N-type region 102N and the P-type region 102P, the gate electrode layer 168 or the fill material may include one or more layers of electrically conductive material, such as polysilicon, aluminum, copper, titanium, tantalum, tungsten, cobalt, molybdenum, tantalum nitride, nickel silicide, cobalt silicide, TiN, WN, AlTi, AlTiO, AlTiC, AlTiN, TaCN, TaC, TaSiN, metal alloys, other suitable materials, and/or any combinations thereof. For devices in the N-type region 102N, the gate electrode layer 168 may be AlTiO, AlTiC, or a combination thereof. For devices in the P-type region 102P, the gate electrode layer 168 may be AlTiO, AlTiC, AlTiN, or a combination thereof. The gate electrode layers 168 may be formed by PVD, CVD, ALD, electro-plating, or other suitable method.

Figure 10B:
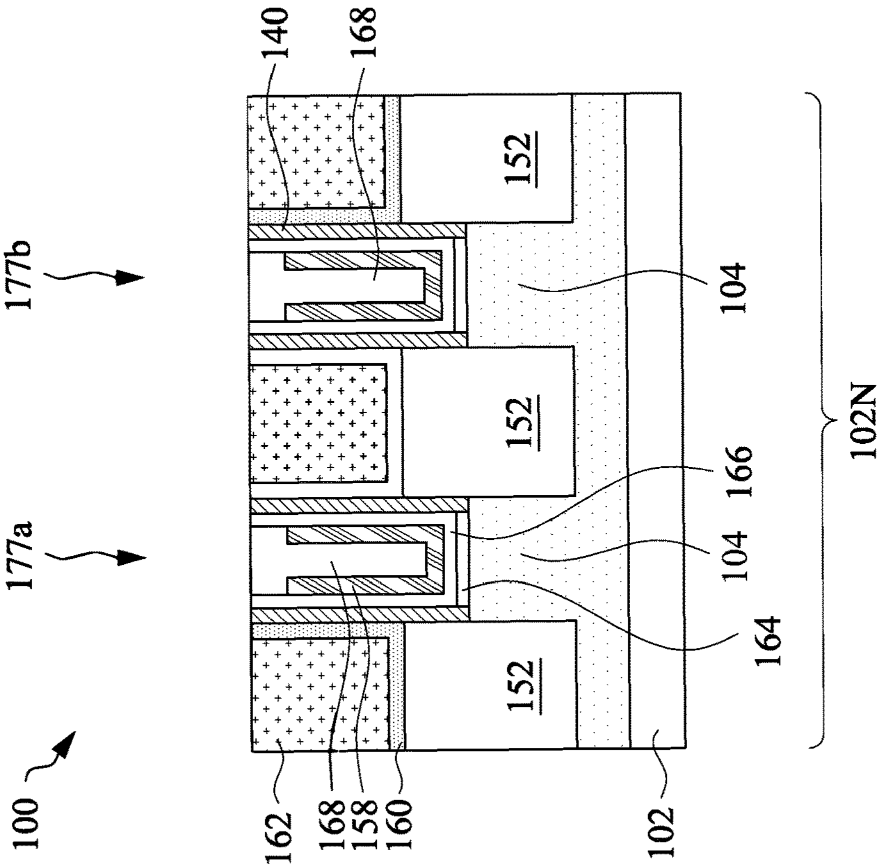
Figure 10A:
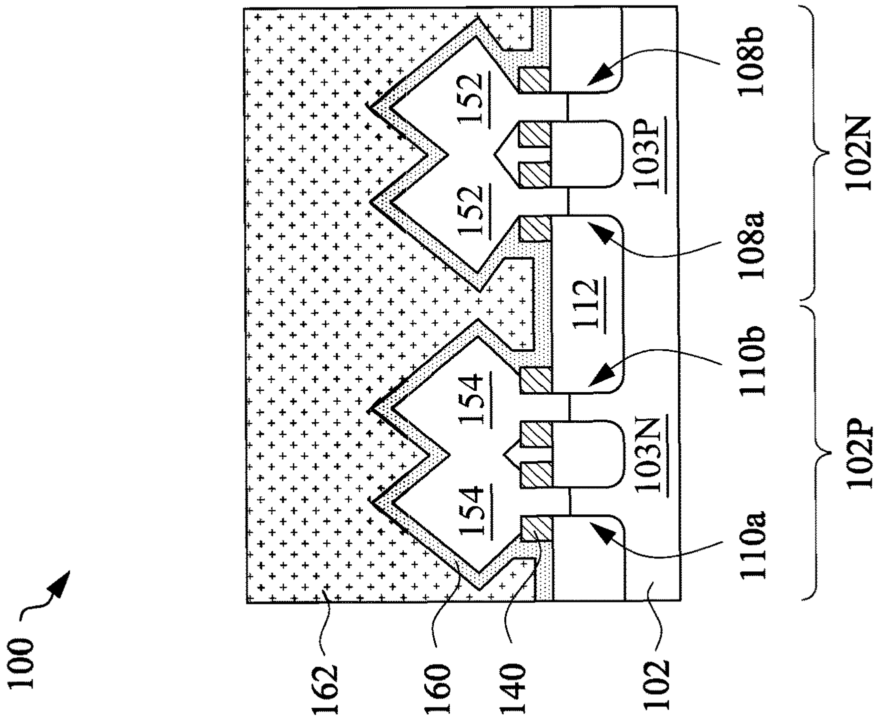

In FIGS. 10A-10B, the gate electrode layer 168 (or the fill material) is deposited on the one or more conformal layers 158 (or on the gate dielectric layer 166) to fill a remainder of the recess. In some embodiments, prior to depositing the gate electrode layer 168, an etch-back process may be performed to recess top surfaces of the one or more conformal layers 158 to a level below the top surfaces of the first ILD 162, the CESL 160, the gate spacers 140, and the gate dielectric layer 166. The etch-back process may be a RIE, wet etch, or any suitable etch process. Thereafter, the gate electrode layer 168 is deposited on the recessed one or more conformal layers 158, resulting in a T-shaped gate electrode layer 168 (or the fill material), as shown in FIG. 10B.

In FIGS. 11A-11B and 12A-12B, a metal gate etching back (MGEB) process is performed to remove portions of the gate electrode layer 168 and the one or more conformal layers 158. The MGEB process may include a first etching step followed by a second etching step. The first and second etching steps may be a wet etch, a dry etch, or combinations thereof. In some embodiments, the first and second etching steps are a plasma etching process. In some embodiments, the first and second etching steps may use one or more etchant gases such as a chlorine-containing gas, a bromine-containing gas, and/or a fluorine-containing gas. In some embodiments, the first etching step may use one or more etchant gases that are different than the one or more etchant gases of the second etching step.

Figure 11B:
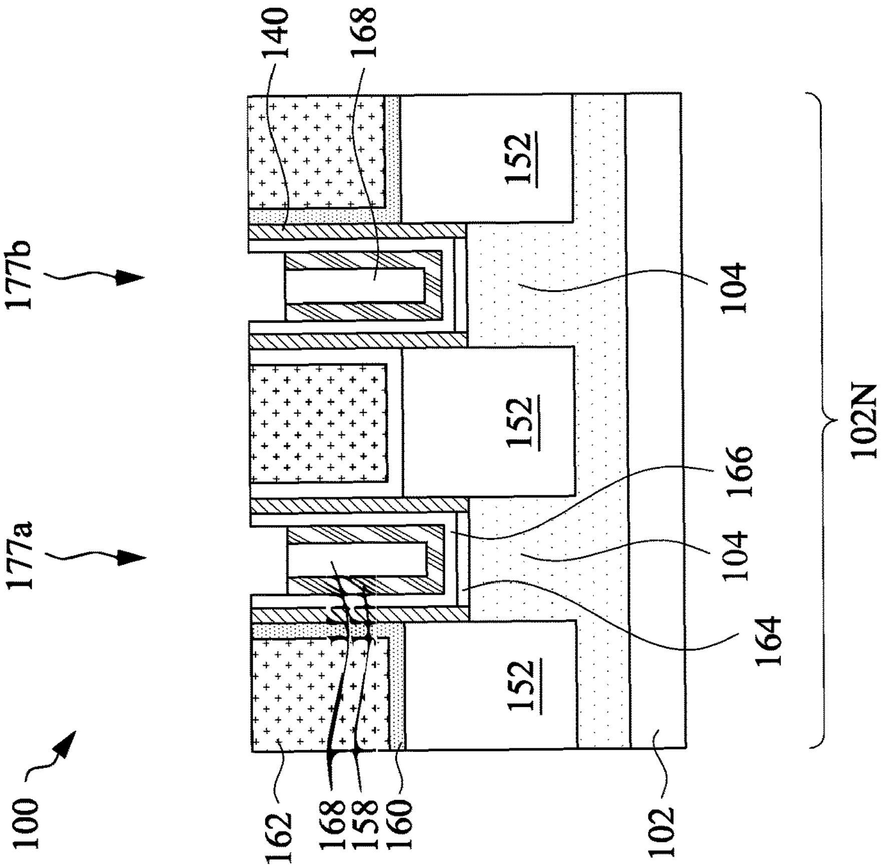
Figure 11A:
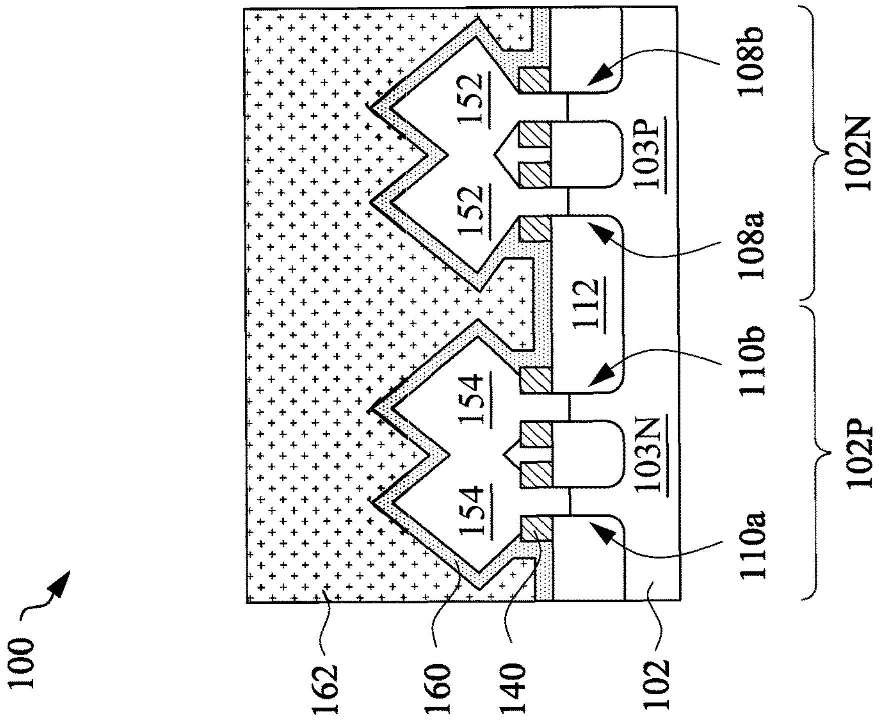
Figure 12B:
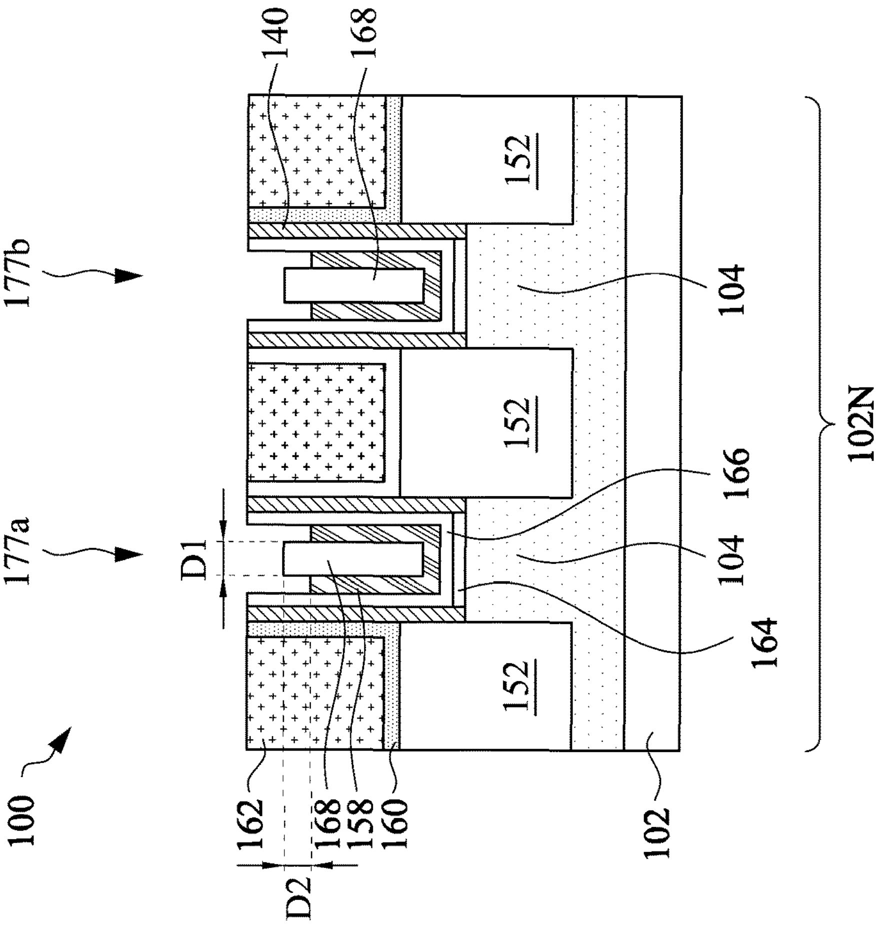
Figure 12A:
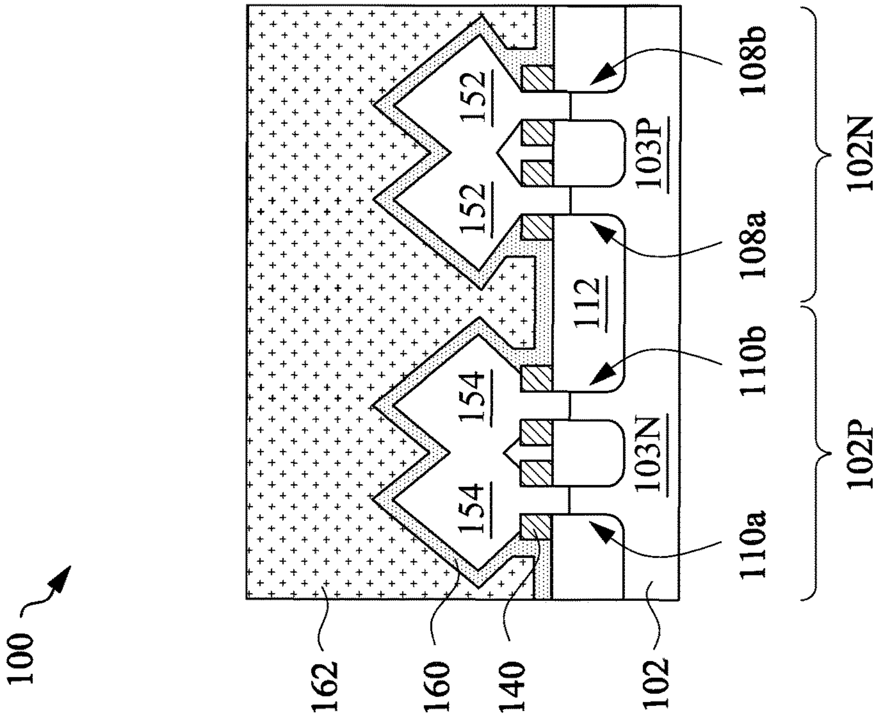

The first etching step uses a first etchant gas that selectively removes the gate electrode layer 168 without substantially affects the gate dielectric layer 166, the gate spacers 140, the CESL 160, and the first ILD 162. The first etching step may continue until a portion of the one or more conformal layers 158 are exposed. After the first etching step, a top surface of the gate electrode layer 168 and a top surface of the one or more conformal layers 158 are substantially co-planar, as shown in FIG. 11B. Once the one or more conformal layers 158 are exposed, the second etching step is performed to remove the exposed portion of the one or more conformal layers 158. The second etching step uses a second etchant gas that selectively removes the one or more conformal layers 158 without substantially affects the gate electrode layer 168, the gate dielectric layer 166, the gate spacers 140, the CESL 160, and the first ILD 162. Therefore, after the second etching step, the top surface of the gate electrode layer 168 is higher than the top surface of the one or more conformal layers 158, as shown in FIG. 12B.

Alternatively, the MGEB process may be a single etching process using an etchant that has a greater removal rate (i.e., etch rate) of the one or more conformal layers 158 than a removal rate of the gate electrode layer 168. In such cases, the etchant removes the gate electrode layer 168 until the one or more conformal layers 158 are exposed, as shown in FIG. 11B. The etchant continues to remove both the gate electrode layer 168 and the one or more conformal layers 158 at different removal rates. As a result, after the MGEB process, the top surface of the gate electrode layer 168 is higher than the top surface of the one or more conformal layers 158, as shown in FIG. 12B.

In any case, the gate electrode layer 168 is etched to have a critical dimension (CD) D1 after the MGEB process. The one or more conformal layers 158 are recessed so that the top surface of the gate electrode layer 168 is higher than the top surface of the one or more conformal layers 158 by a distance D2. In various embodiments, the critical dimension D1 and the distance D2 have a ratio (D1:D2) of about 1:1.2 to about 1:2.

Figure 13B:
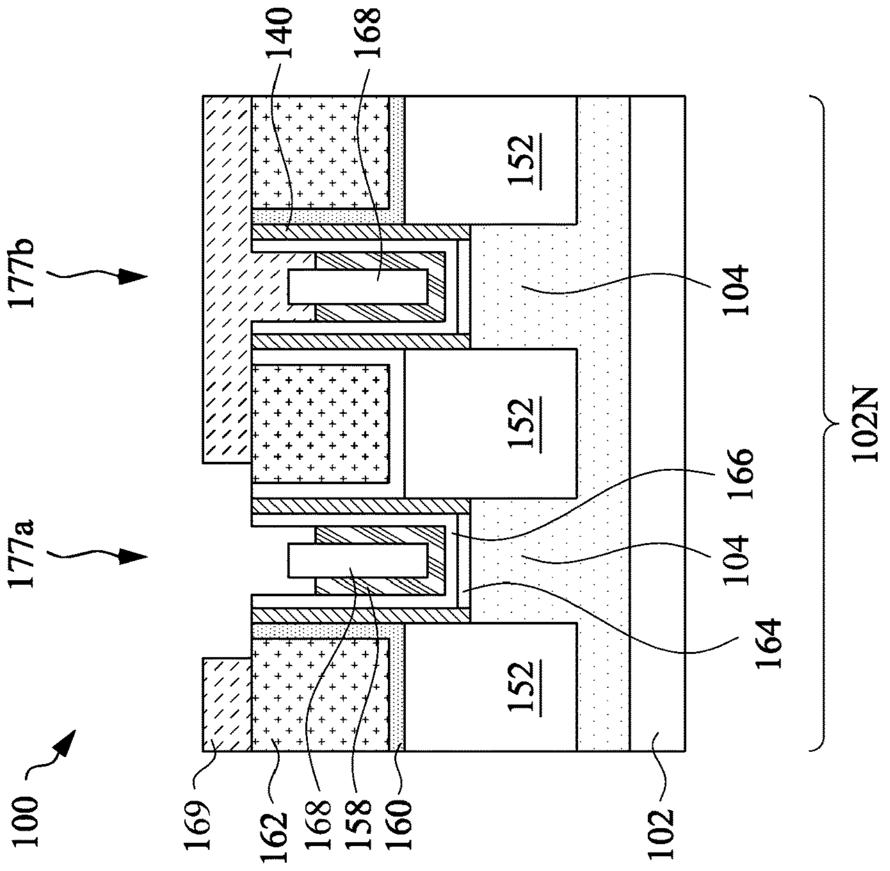
Figure 13A:
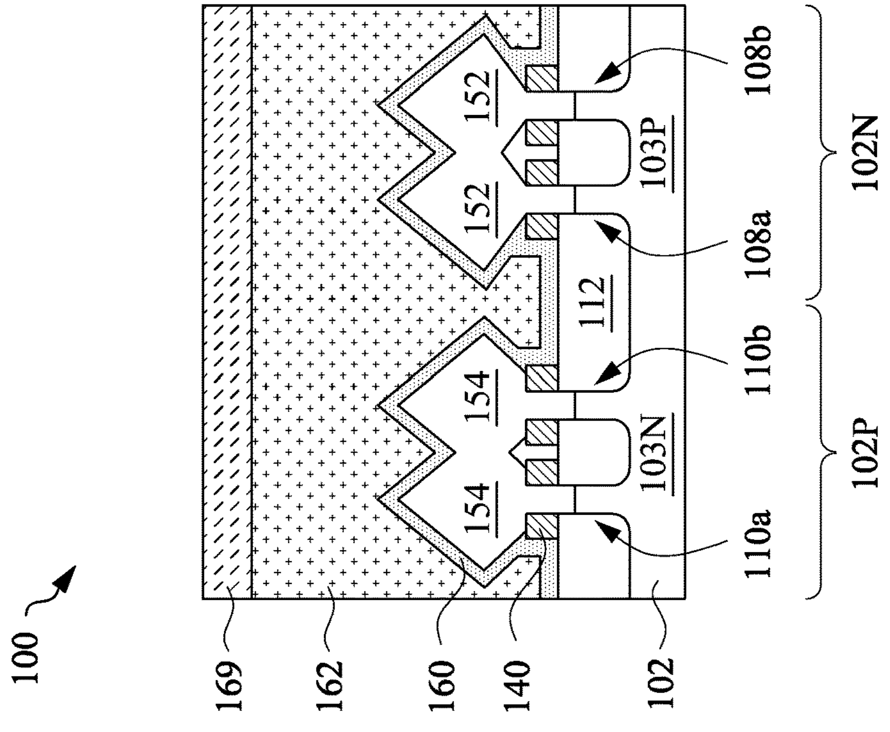

In FIGS. 13A-13B, a mask layer 169 is formed on exposed surfaces of the first ILD 162, the CESL 160, the gate spacers 140, the gate dielectric layer 166, the one or more conformal layers 158, and the gate electrode layer 168. The mask layer 169 may be any suitable masking material, such as a photoresist layer, a BARC (bottom anti-reflective coating) layer, a SOG (spin-on-glass) layer, or a SOC (spin-on-carbon) layer. A removal process, such as a dry etch, wet etch, or a combination thereof, may be performed to selectively remove a portion of the mask layer 169 disposed over the first and second semiconductor layers 104, 106. Particularly, the removal process exposes at least one gate structure 177 along the X direction, and portions of the first ILD 162, the CESL 160, and the gate spacers 140 adjacent the exposed replacement gate structure 177. The mask layer 169 protects at least one neighboring replacement gate structure 177 (e.g., replacement gate structure 177*b*) along the X direction from subsequent etching process (es).

Figure 14B:
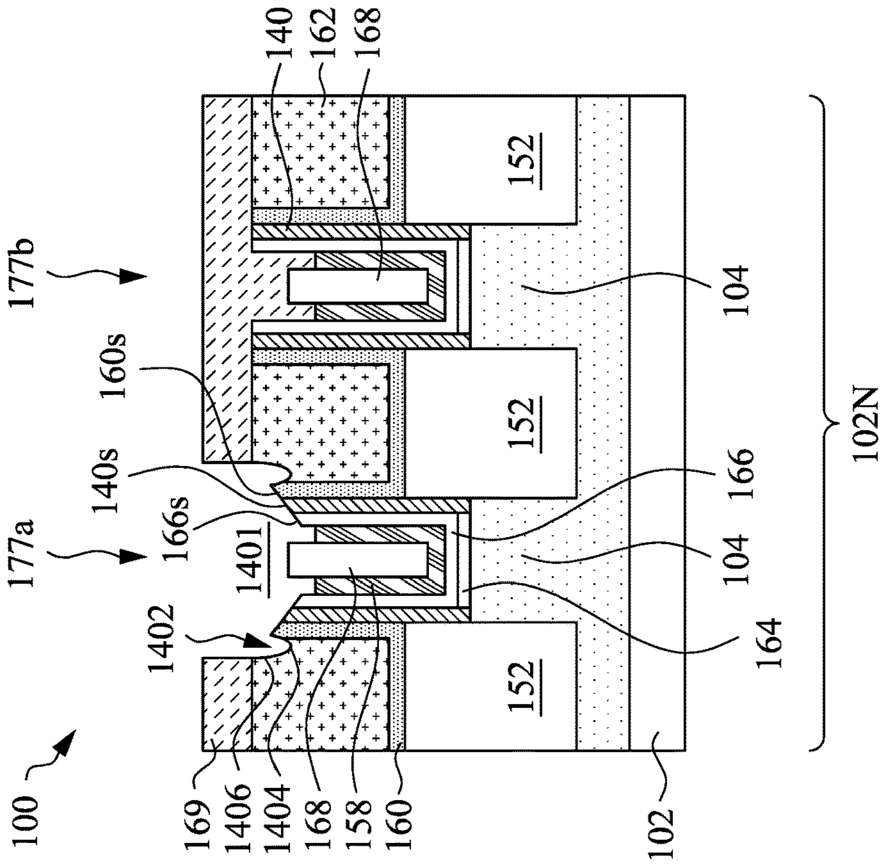
Figure 14A:
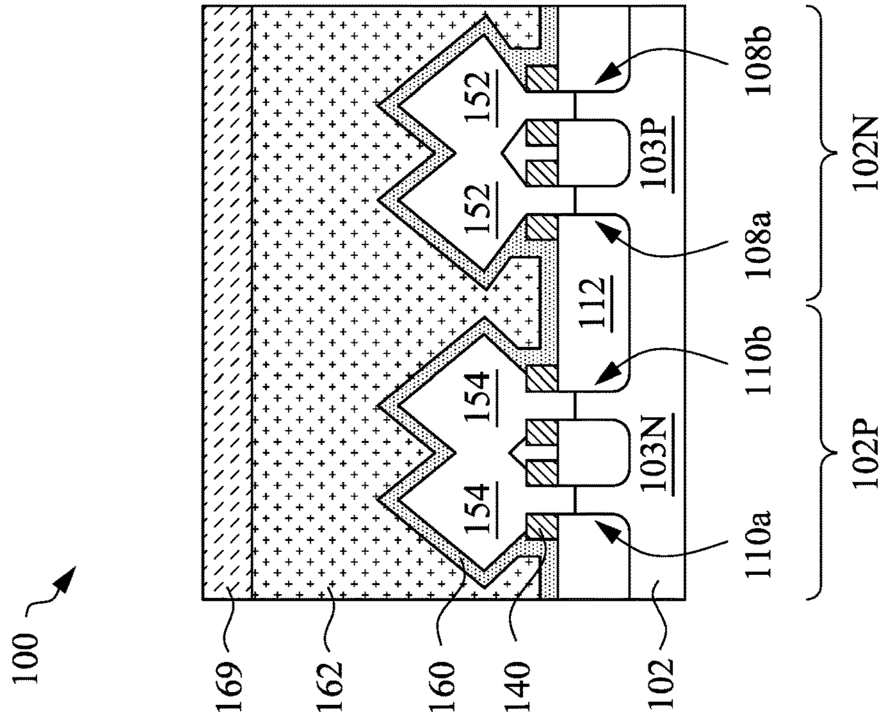

In FIGS. 14A-14B, exposed portions of the first ILD 162, the CESL 160, the gate spacers 140, and the gate dielectric layers 166 are selectively removed by an etch-back process. The etch-back process may be a dry etch, wet etch, or a combination thereof. The etch-back process is performed so that the exposed portions of the first ILD 162 are etched to form a recess 1402 in the exposed portions of the first ILD 162, while the exposed portions of each of the CESL 160, the gate spacers 140, and the gate dielectric layers 166 are etched to have a slanted top surface 160*s*, 140*s*, 166*s*, respectively. The recess 1402 includes a curved bottom 1404 and a straight sidewall 1406, and may be formed due to the effect of over-etching. The slanted top surfaces 160*s*, 140*s*, 166*s* may be formed due to different etch selectivity and removal rate (i.e., etch rate) associated with the CESL 160, the gate spacers 140, and the gate dielectric layers 166. In some embodiments, the slanted top surfaces 160*s*, 140*s*, 166*s* are substantially co-planar. Openings 1401 are formed above the exposed replacement gate structures 177 as a result of removal of the portions of the first ILD 162, the CESL 160, the gate spacers 140, and the gate dielectric layers 166. The openings 1401 and the recess 1402 are to be filled with a material, such as a fill material 179 to be discussed below with respect to FIG. 16B.

In some embodiments, the slanted top surface 160*s* is at an elevation higher than that of the slanted top surface 140*s*, and the slanted top surface 140*s* is at an elevation higher than that of the slanted top surface 166*s*. Such a gradual change in height of the slanted top surfaces 160*s*, 140*s*, 166*s* may be a result of the gate dielectric layers 166 exposing more surface area to etchant chemistries (and prolonged etching time) than the gate spacers 140 and the CESL 160 during the etch-back process. For example, when the gate dielectric layers 166 are etched, only the exposed top surfaces of the gate spacers 140 and the CESL 160 are etched. Once the portion of the gate dielectric layers 166 is removed, the sidewalls of the gate spacers 140 are exposed and etched concurrently with the top surfaces of the gate spacers 140 and the CESL 160. Since the gate dielectric layers 166 suffer more loss of material due to multiple exposure of the etchant chemistries than the gate spacers 140, and the gate spacers 140 suffer more loss of material than the CESL 160 during the etch-back process, a slanted etching profile can be formed in the top portion of the CESL 160, the gate spacers 140, and the gate dielectric layers 166, as shown in FIG. 14B. The exposed portion of the first ILD 162 may be over-etched due to multiple exposure of the etchant chemistries used during the removal of the portions of the CESL 160, the gate spacers 140, and the gate dielectric layers 166.

The etch-back process may be a single or multiple etch process. In some embodiments, the exposed portions of the first ILD 162, the CESL 160, the gate spacers 140, and the gate dielectric layers 166 are removed by a single etch process. In such cases, the one or more etchants used by the single etch process are selected so that they have a first removal rate of the gate dielectric layers 166, a second removal rate of the gate spacers 140, a third removal rate of the CESL 160, and a fourth removal rate of the first ILD 162. In some embodiments, the first removal rate is greater than the second removal rate, and the second removal rate is greater than the third removal rate. In some embodiments, the fourth removal rate is greater than the second and third removal rates. In some embodiments, the fourth removal rate is greater than the first removal rate. In some embodiments, the first removal rate is greater than the fourth removal rate.

In some embodiments, the exposed portions of the first ILD 162, the CESL 160, the gate spacers 140, and the gate dielectric layers 166 are removed by a multiple etch process. In such cases, the exposed portions of the first ILD 162 may be first removed by a first etch process, the exposed portions of the gate dielectric layers 166 may be removed by a second etch process, and the exposed portions of the CESL 160 and the gate spacers 140 may be removed by a third etch process. In some embodiments, the one or more etchants are selected so that the first etch process has a first removal rate of the first ILD 162 and a second removal rate of the CESL 160, the gate spacers 140, and the gate dielectric layers 166, wherein the first removal rate is greater than the second removal rate. The one or more etchants are selected so that the second etch process has a third removal rate of the gate dielectric layers 166 and a fourth removal rate of the first ILD 162, the CESL 160, and the gate spacers 140, wherein the third removal rate is greater than the fourth removal rate. The one or more etchants are selected so that the third etch process has a fifth removal rate of the CESL 160 and the gate spacers 140, and a sixth removal rate of the first ILD 162 and the gate dielectric layers 166, wherein the fifth removal rate is greater than the sixth removal rate.

Alternatively, the exposed portions of the first ILD 162 may be first removed by a first etch process, the exposed portions of the gate dielectric layer 166 may be removed by a second etch process, the exposed portions of the CESL 160 may be removed by a third etch process, and the exposed portions of the gate spacers 140 may be removed by a fourth etch process. In some embodiments, the one or more etchants are selected so that the first etch process has a first removal rate of the first ILD 162 and a second removal rate of the CESL 160, the gate spacers 140, and the gate dielectric layers 166, wherein the first removal rate is greater than the second removal rate. The one or more etchants are selected so that the second etch process has a third removal rate of the gate dielectric layers 166 and a fourth removal rate of the first ILD 162, the CESL 160, and the gate spacers 140, wherein the third removal rate is greater than the fourth removal rate. The one or more etchants are selected so that the third etch process has a fifth removal rate of the CESL 160 and a sixth removal rate of the first ILD 162, the gate spacers 140, and the gate dielectric layers 166, wherein the fifth removal rate is greater than the sixth removal rate. The one or more etchants are selected so that the fourth etch process has a seventh removal rate of the gate spacers 140 and an eighth removal rate of the first ILD 162, the gate dielectric layers 166, and the CESL 160, wherein the seventh removal rate is greater than the eighth removal rate.

In any case, the etch-back process may use one or more etchants that can selectively etch the first ILD 162, the CESL 160, the gate spacers 140, and the gate dielectric layers 166 (with different etch rates) but does not substantially affect the one or more conformal layers 158 and the gate electrode layer 168. In some embodiments, the etchants are chosen so that they can simultaneously remove oxides and nitrides. In some embodiments, the etch-back process is a plasma etching process employing one or more etchants such as a chlorine-containing gas, a bromine-containing gas, and/or a fluorine-containing gas. An inner gas (e.g., Ar) and/or an oxygen-containing gas may be provided with the etchants to enhance etch rates during different etch processes of the etch-back process. Exemplary chlorine-containing gas may include, but are not limited to, $Cl_2$, $CHCl_3$, $CCl_4$, $BCl_3$, or any combination thereof. Exemplary bromine-containing gas may include, but are not limited to $Br_2$, HBr, $BBr_3$, $CF_3Br$, $CF_2Br_2$, $CFBr_3$, $CBr_4$, $CHBr_3$, $CH_2Br$, or any combination thereof. Exemplary fluorine-containing gas may include, but are not limited to, $CF_4$, $SF_6$, $CH_2F_2$, $CHF_3$, $C_2F_6$, or any combination thereof. Exemplary oxygen-containing gas may include, but are not limited to, $O_2$, $O_3$, $H_2O_2$, or a combination thereof. While any one or more etchants discussed herein may be used in the first, second, third, and optional fourth etch processes to obtain the desired removal rates, the first ILD 162 may be removed using the fluorine-based etchants, the gate dielectric layers 166 may be removed using the chlorine-based or bromine-based etchants, the gate spacers 140 and CESL 160 may be removed using the fluorine-based etchants.

In some embodiments, which can be combined with one or more embodiments of the present disclosure, the etch-back process is a cyclic plasma etching process including repetitions of a first, second, third, and optional fourth plasma etching steps. The first plasma etching step may be the first etch process used to remove the first ILD 162, the second plasma etching step may be the second etch process used to remove the gate dielectric layer 166, the third plasma etching step may be the third etch process used to remove the CESL 160 (and the gate spacers 140 in some cases), and the optional fourth plasma etching step may be the fourth etch process used to remove the gate spacers 140, as discussed above. The cyclic plasma etching process may use alternating chlorine/bromine/fluorine-based plasma using the etchants discussed above. The cyclic plasma etching process may continue until predetermined etch profiles are obtained.

After the etch-back process, the curved bottom 1404 of the recess 1402 may be formed with a concave profile. The curved bottom 1404 may have the lowest point that is at an elevation higher than the lowest point of the slanted top surface **166*s* of the gate dielectric layer 166. In some embodiments, the curved bottom 1404 of the recess 1402 may have the lowest point that is at an elevation higher, equal to, or lower than the lowest point of the slanted top surface 140*s* of the gate spacers 140. In some embodiments, the curved bottom 1404 of the recess 1402 may have the lowest point that is at an elevation lower than the lowest point of the slanted top surface 160*s* of the CESL 160**.

Figure 15B:
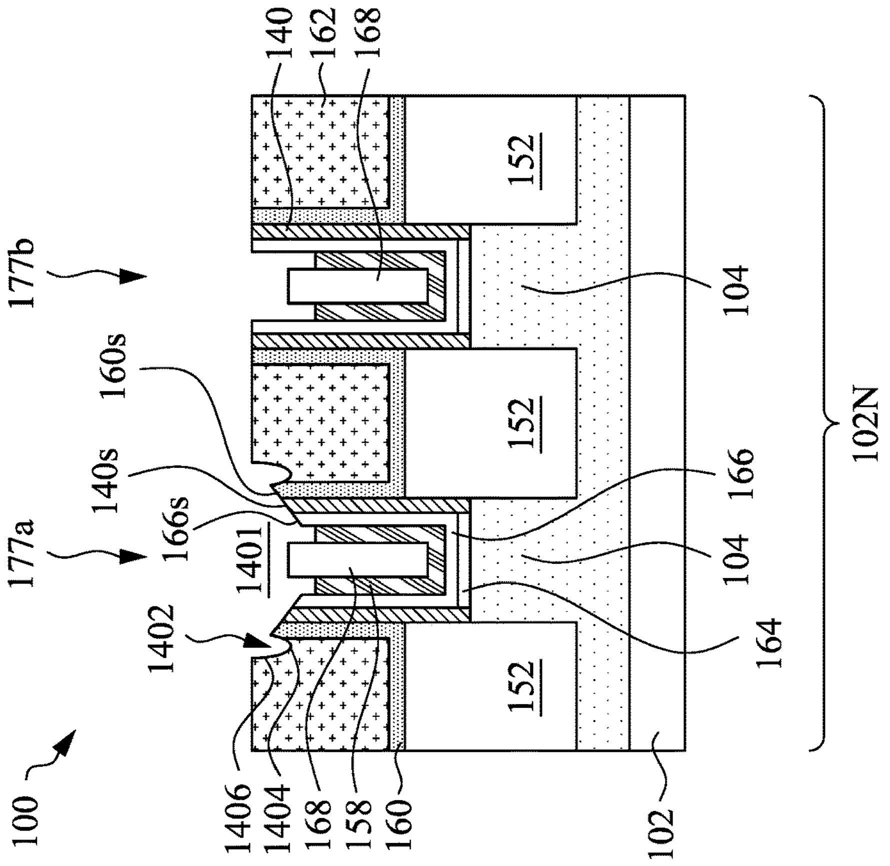
Figure 15A:
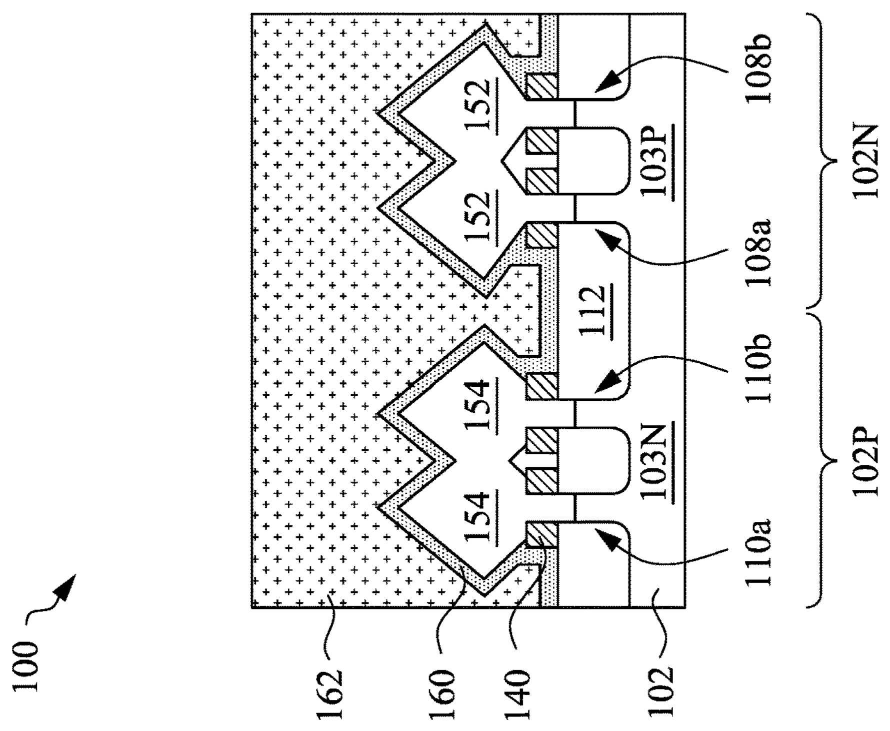

In FIGS. 15A-15B, the mask layer 169 is removed and the replacement gate structures 177 that were covered by the mask layer 169 are exposed. The mask layer 169 may be removed by any suitable removal process such as, an ashing process, a stripping process, an etching process, or the like.

Figure 16B:
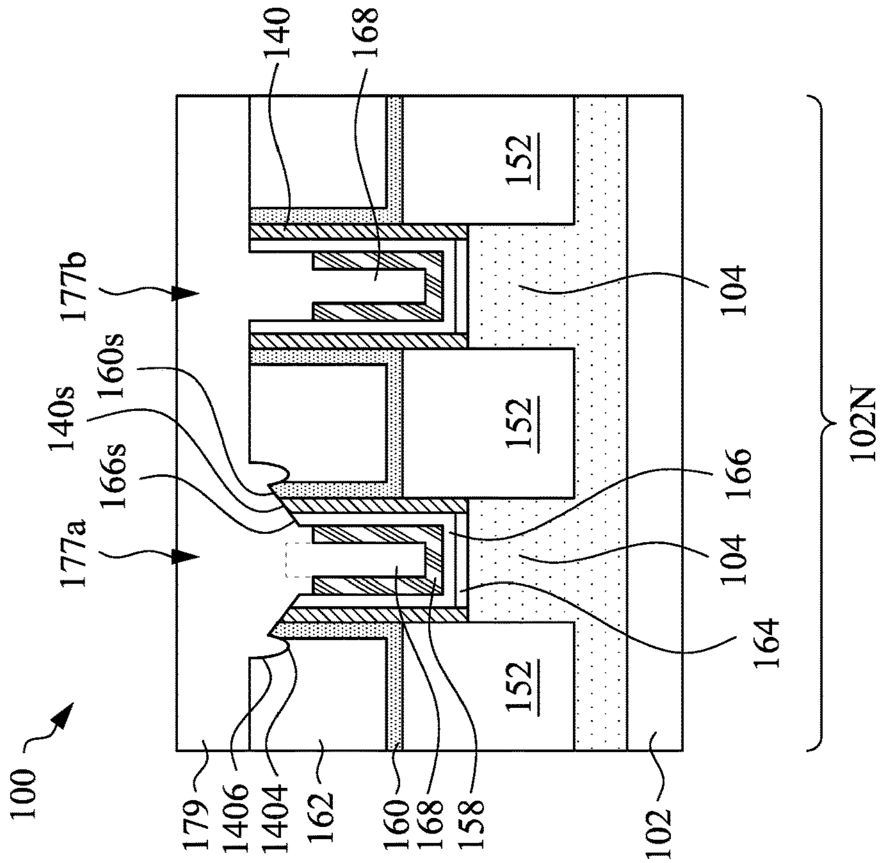
Figure 16A:
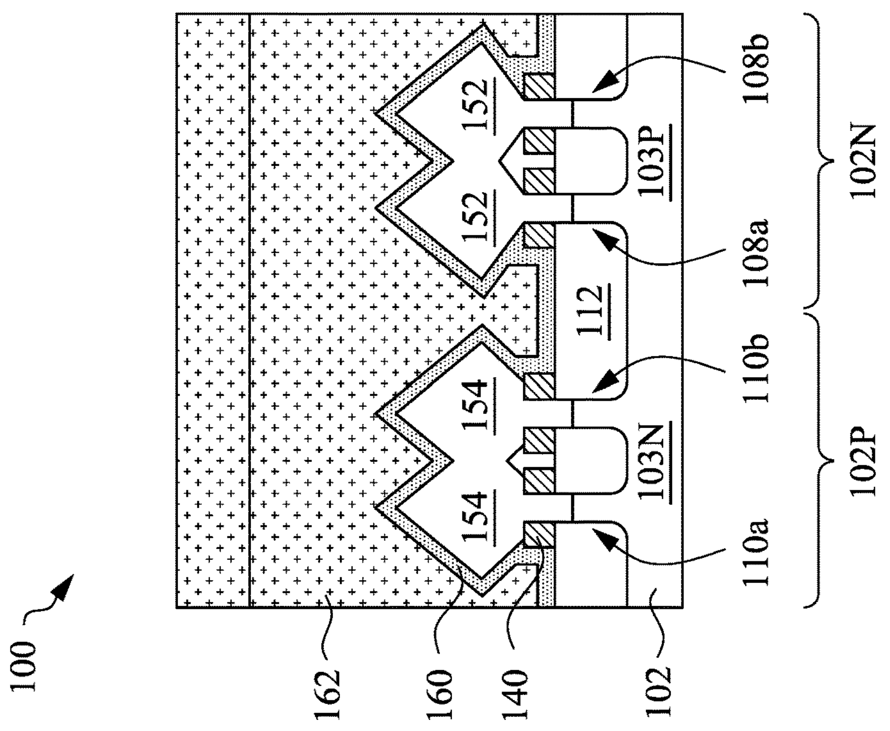
Figure 17B:
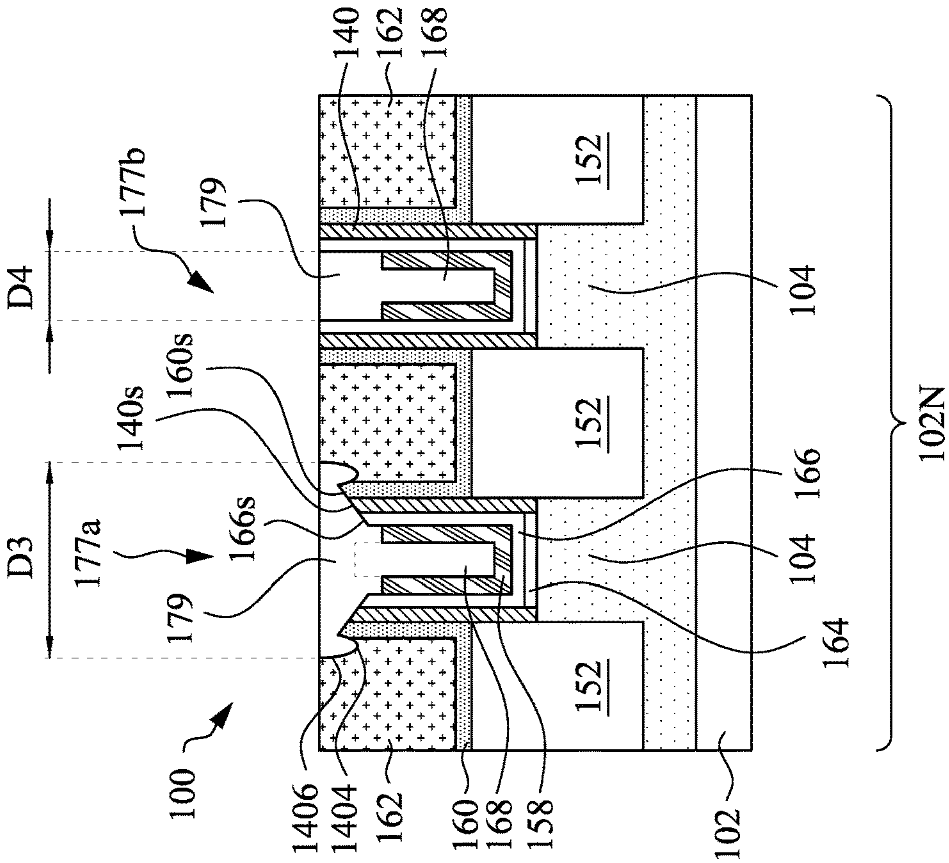
Figure 17A:
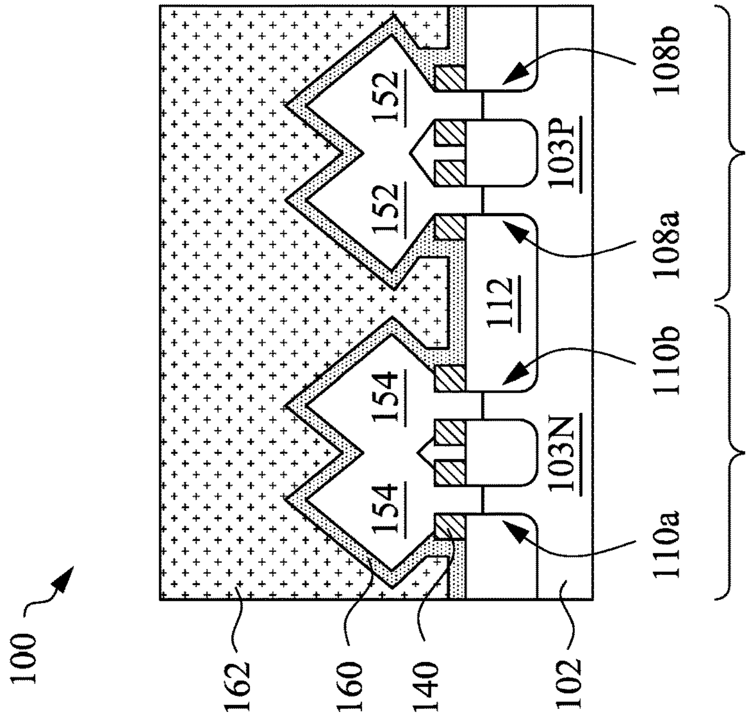

In FIGS. 16A-16B to 17A-17B, a fill material 179 is formed on the exposed surfaces of the first ILD 162, the CESL 160, the gate spacers 140, the gate dielectric layers 166, the one or more conformal layers 158, and the gate electrode layers 168. The fill material 179 fills in the recess 1402 and the openings 1401 (FIG. 15B) and over the top surface of the first ILD 162, as shown in FIG. 16B. The fill material 179 may be any suitable electrically conductive material, and may be deposited using PVD, CVD, ALD, electroplating, ELD, or other suitable deposition process, or combinations thereof. In some embodiments, the fill material 179 is formed of the same material as the gate electrode layers 168. In some embodiments, the fill material 179 and the gate electrode layer 168 may include the different material. Thereafter, a planarization process, such as a CMP process, is performed until the first ILD 162 is exposed. After the planarization process, the top surfaces of the fill material 179, the first ILD 162, the CESL 160, the gate spacers 140, the gate dielectric layers 166 are substantially co-planar, as shown in FIG. 17B. Particularly, the fill material 179 above at least one replacement gate structure 177 (e.g., replacement gate structure 177*a*) in the N-type and P-type regions 102N, 102P has a length D3 along the X direction and the fill material 179 above at least one neighboring replacement gate structure (e.g., replacement gate structure 177*b*) in the N-type and P-type regions 102N, 102P has a length D4 along the X direction, and the length D3 is greater than the length D4. In some embodiments, the length D3 and the length D4 have a ratio (D3:D4) in a range of about 1.2:1 to about 4:1, for example about 1.5:1 to about 2:1.

Figure 18A:
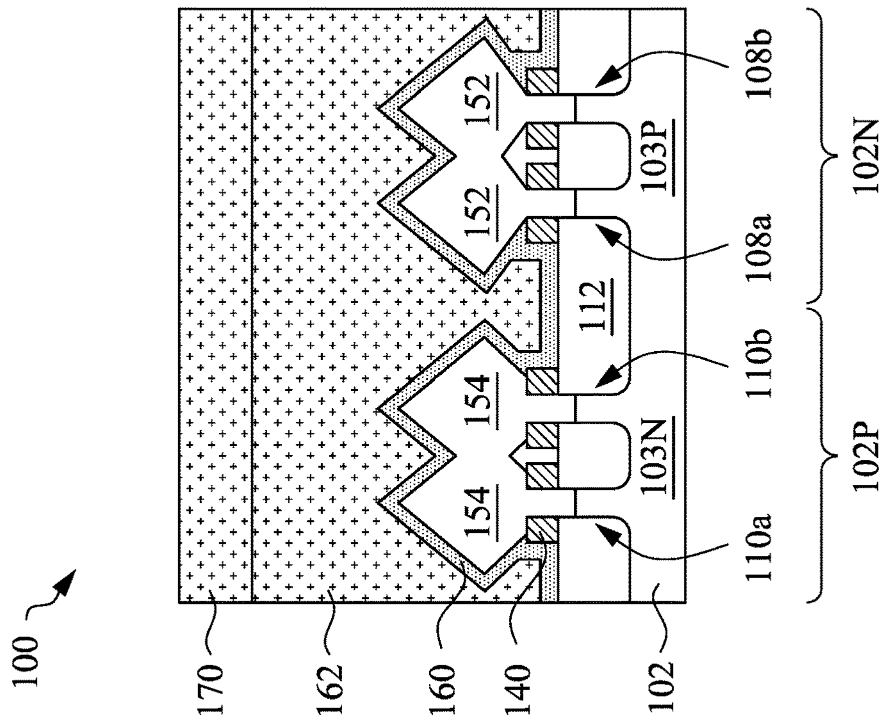
Figure 18B:
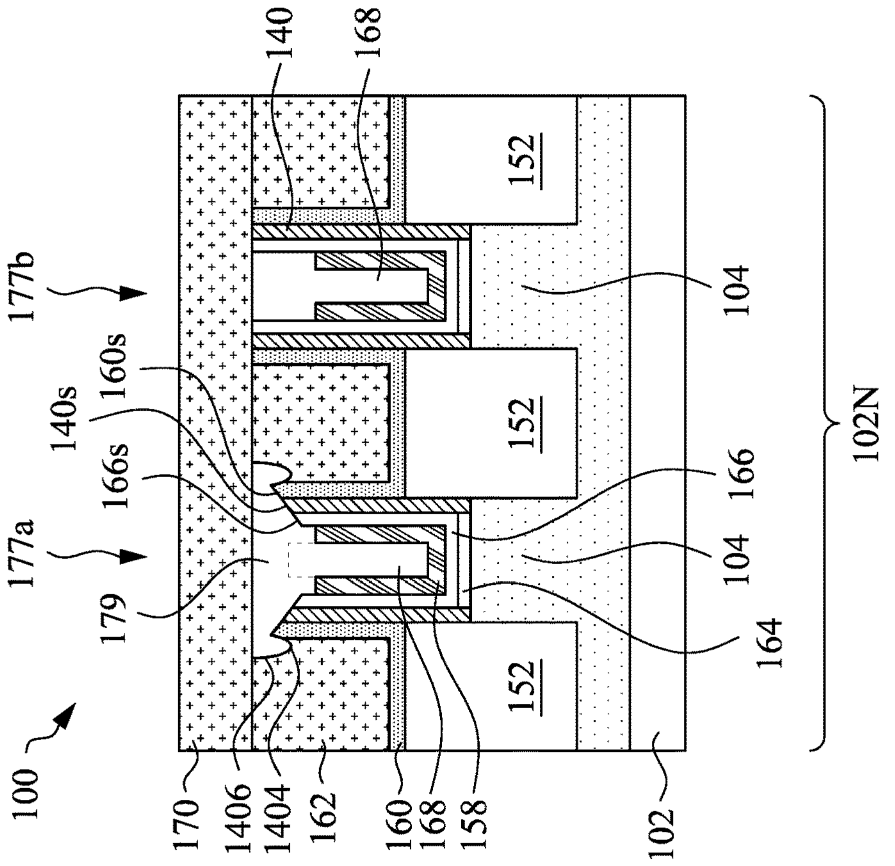

In FIGS. 18A-18B, a second ILD 170 is formed on the first ILD 162. The second ILD 170 is in contact with the fill materials 179, the CESL 160, the gate spacers 140, and the gate dielectric layers 166. The second ILD 170 may include the same material as the first ILD 162. In some embodiments, after formation of the second ILD 170, the semiconductor device structure 100 may be subject to a thermal process to anneal the second ILD 170.

Figure 19B:
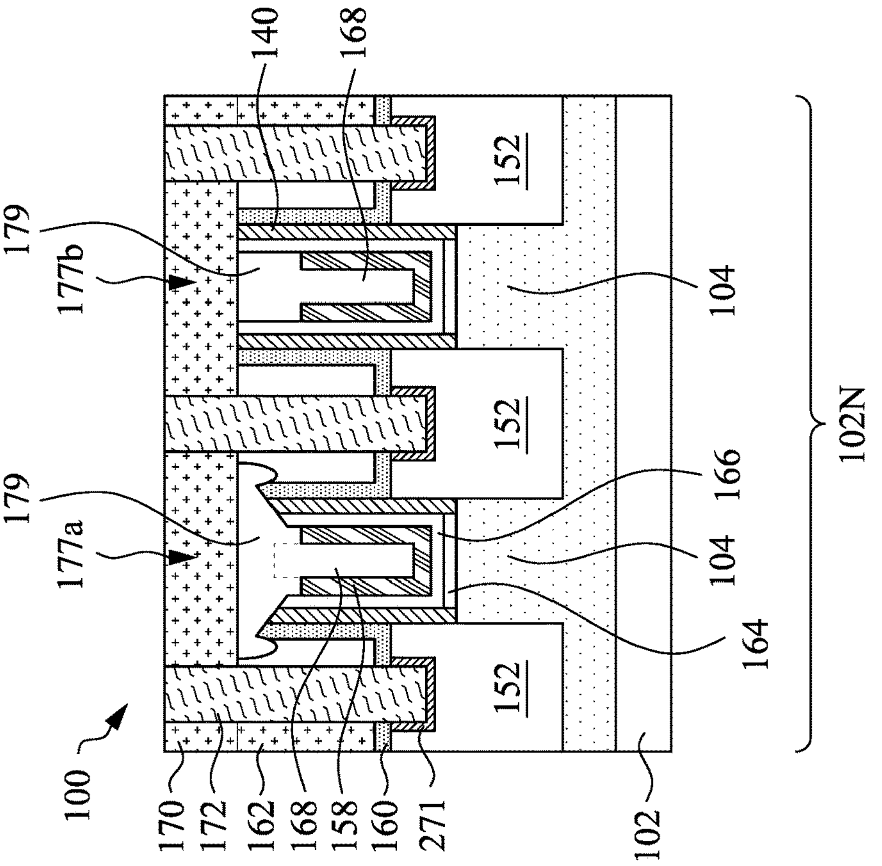
Figure 19A:
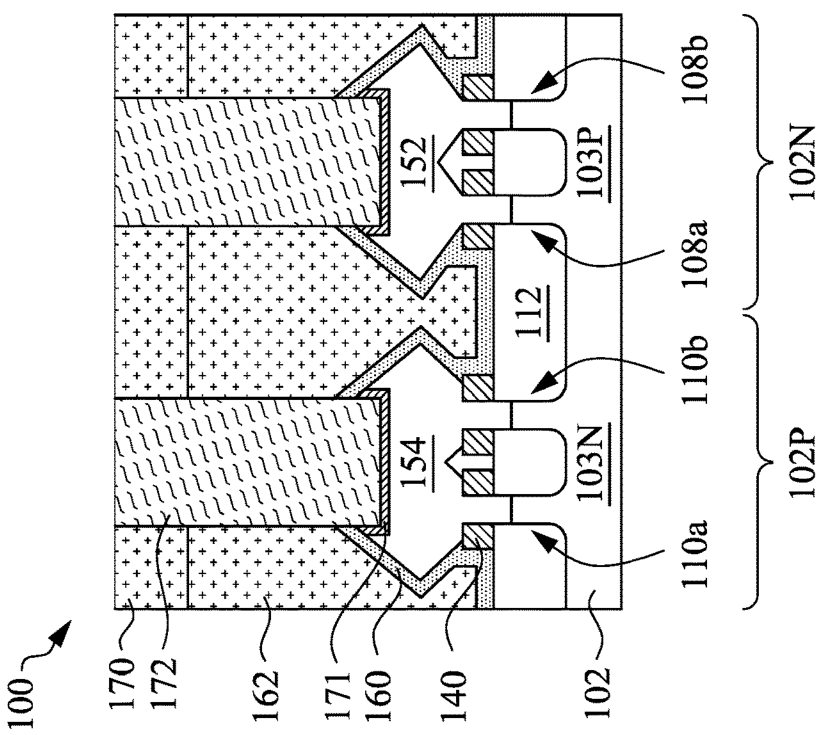

In FIGS. 19A-19B, portions of the first ILD 162, the second ILD 170, and the CESL 160 disposed on both sides of the replacement gate structures 177 are removed. The removal of the portions of the first ILD 162, the second ILD 170, and the CESL 160 forms a contact opening exposing the S/D epitaxial features 152, 154, respectively. In some embodiments, the upper portion of the exposed S/D epitaxial features 152, 154 is removed. A conductive feature 172 (i.e., S/D contacts) is then formed in the contact openings over the S/D epitaxial features 152, 154. The conductive feature 172 may include an electrically conductive material, such as one or more of Ru, Mo, Co, Ni. W, Ti, Ta, Cu, Al, TiN and TaN. The conductive feature 172 may be formed by any suitable process, such as PVD, CVD, ALD, electro-plating, or other suitable method. A silicide layer 171 may be formed between each S/D epitaxial feature 152, 154 and the conductive feature 172. The silicide layer 171 conductively couples the S/D epitaxial features 152, 154 to the conductive feature 172. The silicide layer 171 is a metal or metal alloy silicide, and the metal includes a noble metal, a refractory metal, a rare earth metal, alloys thereof, or combinations thereof. For NMOS devices, the silicide layer 171 may include one or more of TiSi, CrSi, TaSi, MoSi, ZrSi, HfSi, ScSi, Ysi, HoSi, TbSI, GdSi, LuSi, DySi, ErSi, YbSi, or combinations thereof. For PMOS devices, the silicide layer 171 may include one or more of NiSi, CoSi, MnSi, WSi, FeSi, RhSi, PdSi, RuSi, PtSi, IrSi, OsSi, or combinations thereof.

Figure 20B:
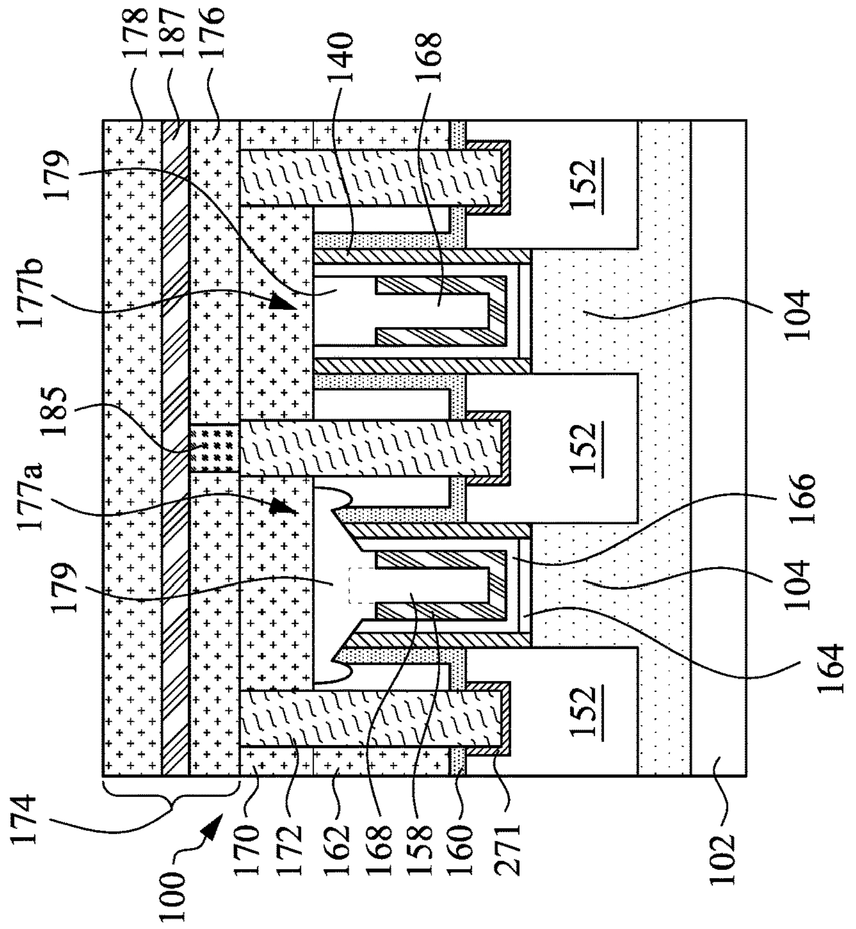
Figure 20A:
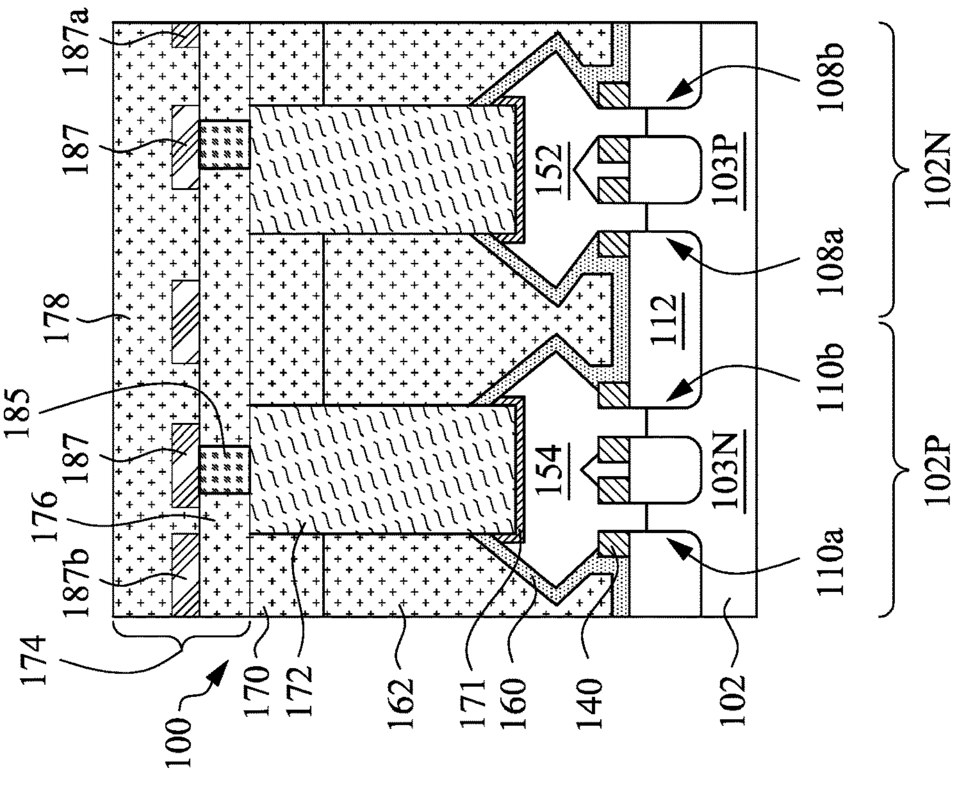
Figure 20C:
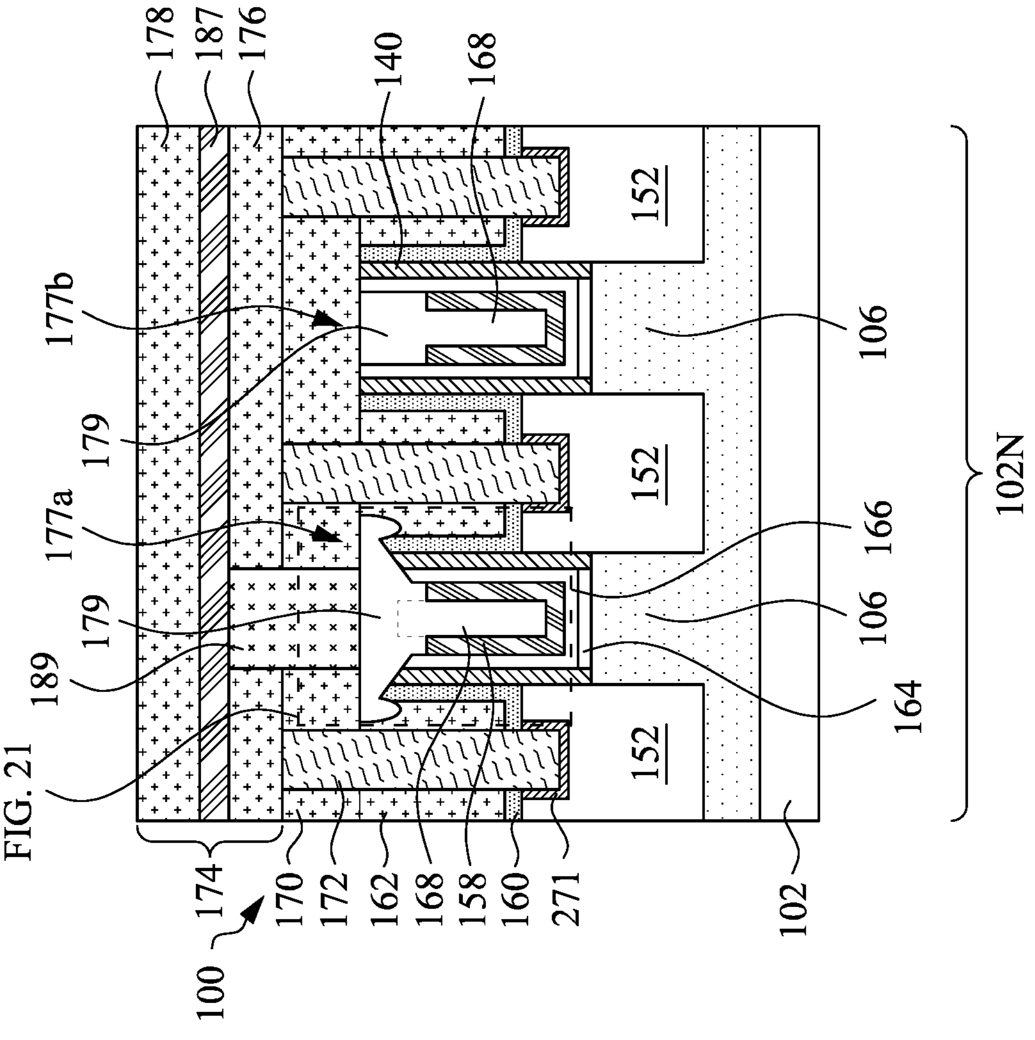
FIGS. 20C, 33C, and 42C are cross-sectional side views of one stage of manufacturing the semiconductor device structure of FIG. 4 taken along cross-section C-C, in accordance with some embodiments.

In FIGS. 20A-20C, an interconnect structure 174 is formed over the semiconductor device structure 100. The interconnect structure 174 may include one or more interlayer dielectrics and a plurality of interconnect features formed in each interlayer dielectric. In one exemplary embodiment shown in FIGS. 20A-20B, the interconnect structure 174 may include a first intermetal dielectric (IMD) 176 and a second IMD 178 formed over the first IMD 176, and a plurality of vertical interconnect features 185, such as vias, and horizontal interconnect features 187, such as metal lines, embedded in the first and second IMD 176, 178, respectively. The vertical interconnect features 185 are selectively formed to provide electrical connection to some of the S/D contacts (e.g., conductive feature 172). The horizontal interconnect features 187 are formed to selectively provide electrical connection between the S/D contacts in the N-type region 102N and the P-type region 102P. A conductive via 189 (FIG. 20C) may form through the first IMD 176 and the second ILD 170 to electrically connect the gate electrode (e.g., fill material 179 and gate electrode layer 168) to the horizontal interconnect features 187. The conductive via 189, the vertical interconnect features 185, and the horizontal interconnect features 187 may include or be formed of W, Ru, Co, Cu, Ti, TiN, Ta, TaN, Mo, Ni, or combinations thereof. The first and second IMD 176, 178 may be formed of the same material as the first ILD 162.

FIGS. 20B and 20C also illustrate that a core gate electrode profile of the at least one replacement gate structure is different from the core gate electrode profile of the at least one neighboring replacement gate structure. That is, different core gate electrode profiles may co-exist in the same semiconductor device structure 100. In such cases, the core gate electrode of the at least one replacement gate structure (e.g., replacement gate structure 177*a*) may have a profile and features as the core gate electrode 2100 to be discussed in FIG. 21 below, and the core gate electrode of the at least one neighboring replacement gate structure (e.g., replacement gate structure 177*b*) may have a substantial T-shaped profile, as shown in FIGS. 20B and 20C. In this disclosure, the gate electrode layer 168 and the fill material 179 together may be referred to as the core gate electrode. Alternatively, the core gate electrode profile of the at least one replacement gate structure (e.g., replacement gate structure 177*a*) may be identical to the core gate electrode profile of the at least one neighboring replacement gate structure (e.g., replacement gate structure 177*b*). In such cases, the core gate electrode of the at least one replacement gate structure (e.g., replacement gate structure 177*a*) and the core gate electrode of the at least one neighboring replacement gate structure (e.g., replacement gate structure 177*b*) may both include the same profile and features as the core gate electrode 2100 of FIG. 21.

A power rail (not shown) may be formed in the second IMD layer 178 and configured to be in electrical connection with the S/D epitaxial features 152, 154 through the S/D contacts (e.g., conductive feature 172), the vertical interconnect feature 185, and the horizontal interconnect features 187. Depending on the application and/or conductivity type of the devices in the N-type region 102N and the P-type region 102P, the power rail may be fed with a positive voltage (VDD) or a negative voltage (VSS) (i.e., ground or zero voltage). For example, the VDD may be provided to the horizontal interconnect features 187*a* and the VSS may be provided to the horizontal interconnect features 187*b*, as shown in FIG. 20A.

Figure 21:
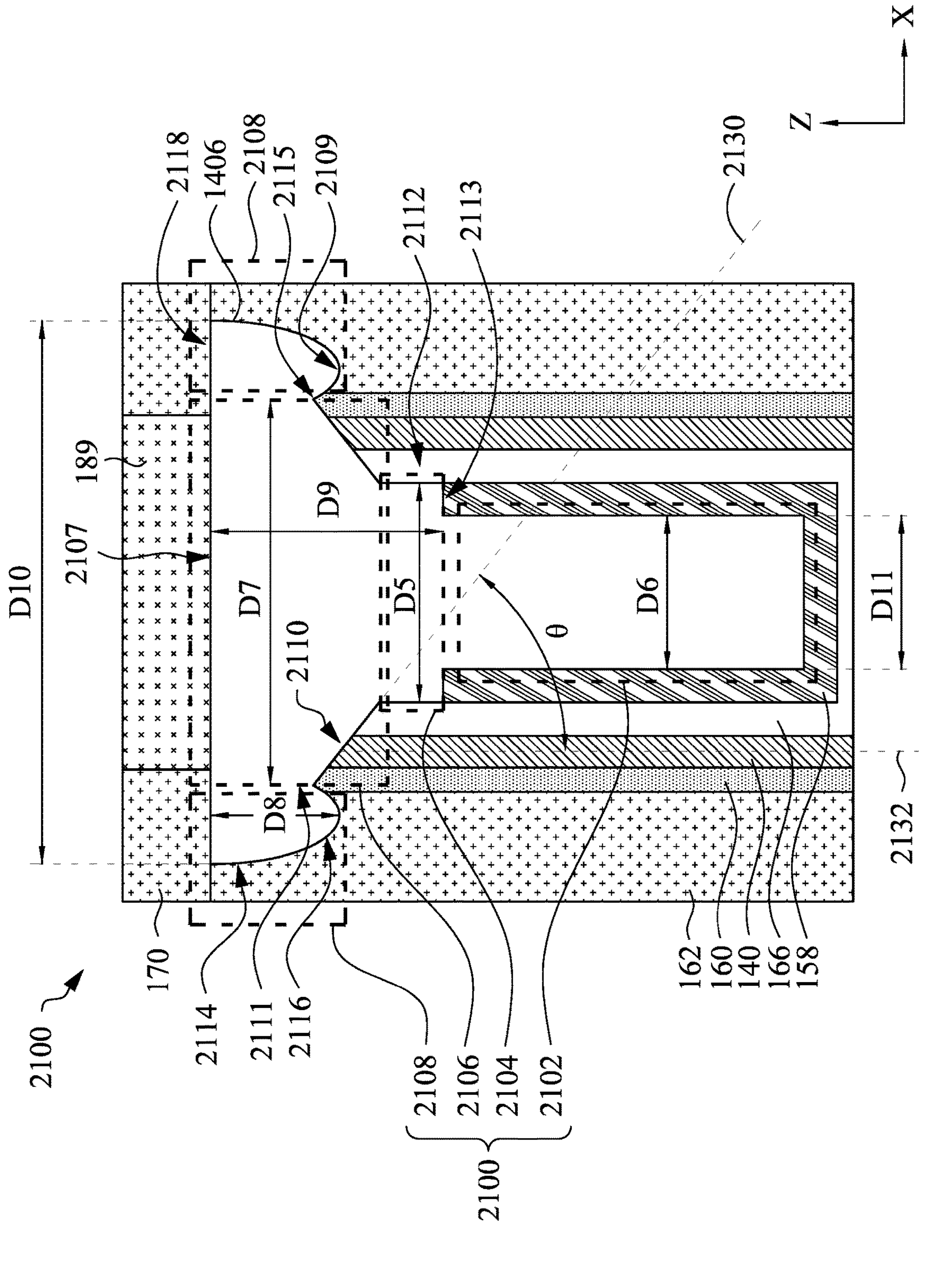
FIG. 21 is an enlarged view of a portion of the semiconductor device structure of FIG. 20C showing a core gate electrode, in accordance with some embodiments.

FIG. 21 is an enlarged view of a portion of the semiconductor device structure 100 of FIG. 20C showing a core gate electrode 2100 in accordance with some embodiments. The core gate electrode 2100 has a cross-sectional profile that is different from the core gate electrode profile shown in FIGS. 20B and 20C. The core gate electrode 2100 is formed of an integral body and may be considered to have four sections, such as a first section 2102, a second section 2104, a third section 2106, and a fourth section 2108 represented by dashed line boxes in FIG. 21. The first section 2102 has a rectangular-shaped profile when viewed from the side in the Z-X plane of the semiconductor device structure 100. The first section 2102 extends along the Z direction and has at least three sides in contact with the one or more conformal layers 158.

The second section 2104 has a rectangular-shaped profile when viewed from the side in the Z-X plane. The second section 2104 extends from an end of the first section 2102 along a direction that is substantially perpendicular to the longitudinal direction of the first section 2102. The second section 2104 has a diameter D5 greater than a diameter D6 of the first section 2102. The second section 2104 is in contact with the one or more conformal layers 158 and the gate dielectric layer 166. For example, the second section 2104 may have straight sidewalls 2112 in contact with the gate dielectric layer 166 and a bottom surface 2113 in contact with the one or more conformal layers 158.

The third section 2106 has a rectangular shape with two cut corners when viewed from the side in the Z-X plane. The third section 2106 extends along the Z direction from an end of the second section 2104. The third section 2106 includes imaginary straight sidewalls 2111 and slanted sidewalls 2110 connecting the straight sidewalls 2111 of the third section 2106 to the straight sidewalls 2112 of the second section 2104. The presence of the slanted sidewalls 2110 results in the third section 2106 with a diameter gradually increased from the side adjacent the second section 2104 towards the side adjacent the conductive via 189. The third section 2106 has a top surface 2107 in contact with the conductive via 189 and optionally a portion of the second ILD 170. The top surface 2107 of the third section 2106 has a diameter D7 greater than the diameter D5 of the second section 2104. The slanted sidewalls 2110 are in contact with the gate dielectric layers 166 and the gate spacers 140. In some embodiments, the slanted sidewalls 2110 may be further in contact with the CESL 160. The slanted sidewall 2110 extends along a first direction 2130, which is at an angle "θ" with respect to a longitudinal direction 2132 of the gate spacers 140 (or gate dielectric layer 166) extending along the Z direction. In various embodiments, the angle "θ" is greater than zero degree, such as greater than about 10 degrees. In some embodiments, the angle "θ" is in a range of about 30 degrees to about 60 degrees.

The fourth section 2108 extends radially (along the X direction) from both sidewalls (e.g., imaginary straight sidewalls 2111) of the third section 2106. In some embodiments, the fourth section 2108 may have straight sidewalls 2114 and curved bottom 2116 connecting the straight sidewalls 2114 of the fourth section 2108 to the slanted sidewalls 2110 of the third section 2106. The fourth section 2108 has a height D8 measuring from a lowest point 2109 of the curved bottom 2116 to a top surface 2118 of the fourth section 2108. The top surface 2118 of the fourth section 2108 is co-planar with the top surface 2107 of the third section 2106. The second section 2104 and the third section 2106 may have a combined height D9, which is a distance measuring from the bottom surface 2113 of the second section 2104 to the top surface 2107 of the third section 2106. In some embodiments, the height D8 of the fourth section 2108 and the combined height D9 of the second and third sections 2104, 2106 are at a ratio (D8:D9) of about 1:1.5 to about 1:2. In various embodiments, a point 2115 where the curved bottom 2116 and the slanted sidewall 2110 intersect is at an elevation that is higher than the lowest point 2109 of the curved bottom 2116. The fourth section 2108 is in contact with the first ILD 162 and the second ILD 170. For example, the straight sidewalls 2114 and the curved bottom 2116 may be in contact with the first ILD 162, while the top surface 2118 of the fourth section 2108 may be in contact with the second ILD 170. In some embodiments, a portion of the curved bottom 2116 is further in contact with the CESL 160.

The core gate electrode 2100 has a top critical dimension (CD) D10 and a bottom CD, which equals to the diameter D6 of the first section 2102. The top CD D10 is defined as the combined gate length (along the X direction) of the third section 2106 and the fourth section 2108. In some embodiments, the top CD D10 and the bottom CD D6 are at a ratio (D10:D6) of about 1.5:1 to about 3:1. The core gate electrode 2100 may be beneficial in applications that require high switching speed because its unique profile provides greater volume of the gate electrode material, which in turn reduces the gate resistance ($R_g$) of the FET. As a result, the switching speed of the FET is increased and the device performance is improved.

Figure 22A:
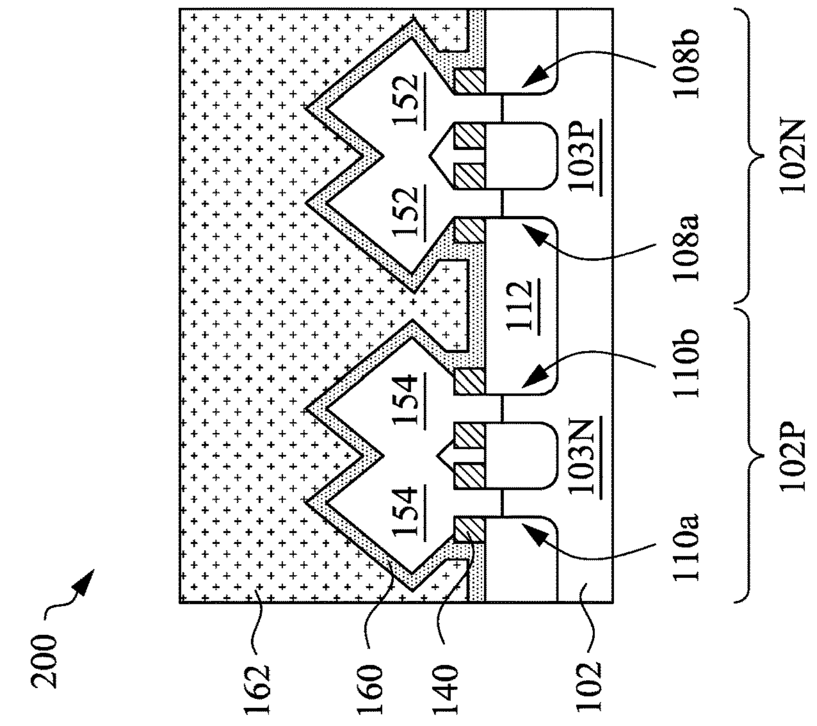
Figure 22B:
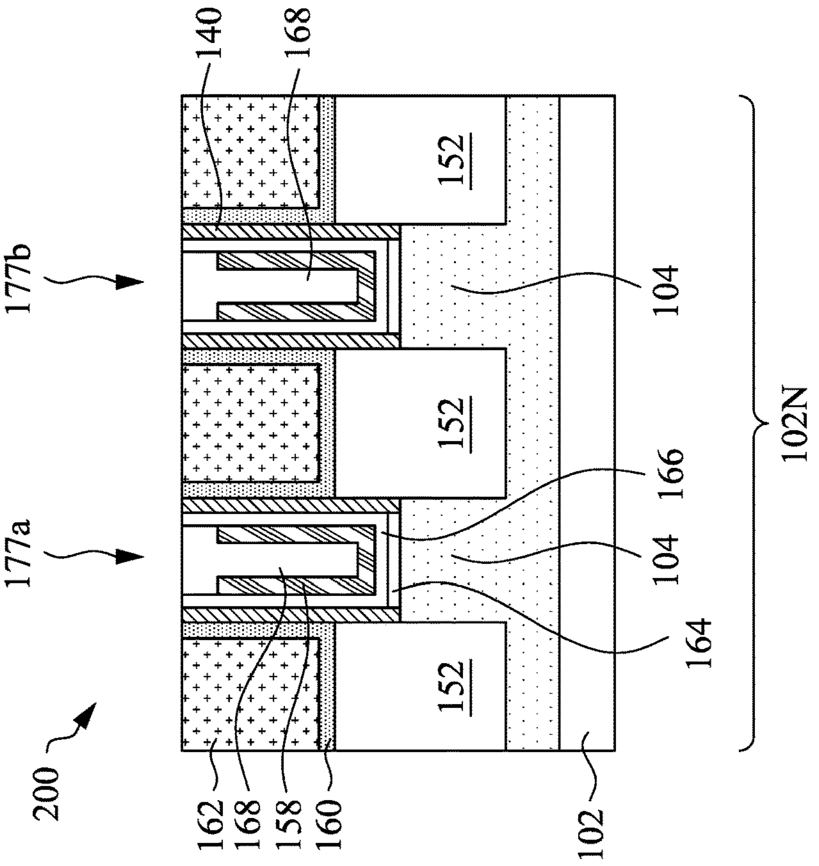
Figure 23B:
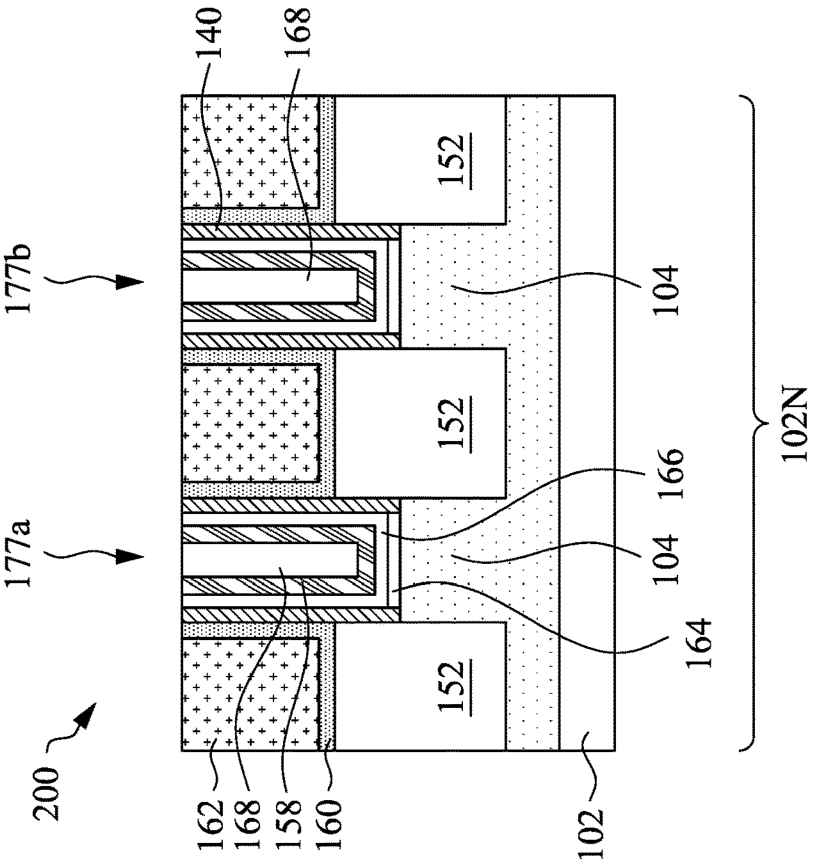
Figure 23A:
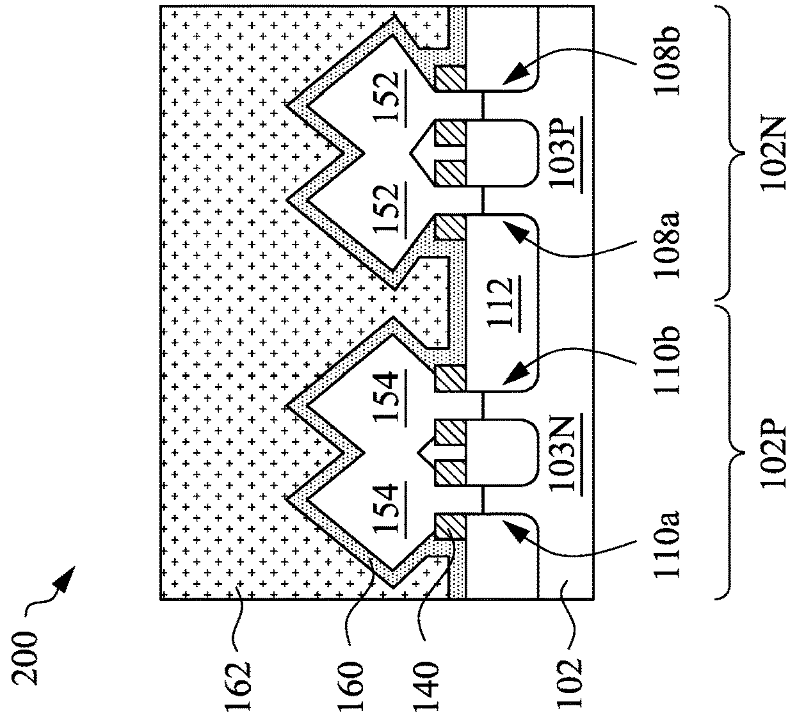
Figure 24A:
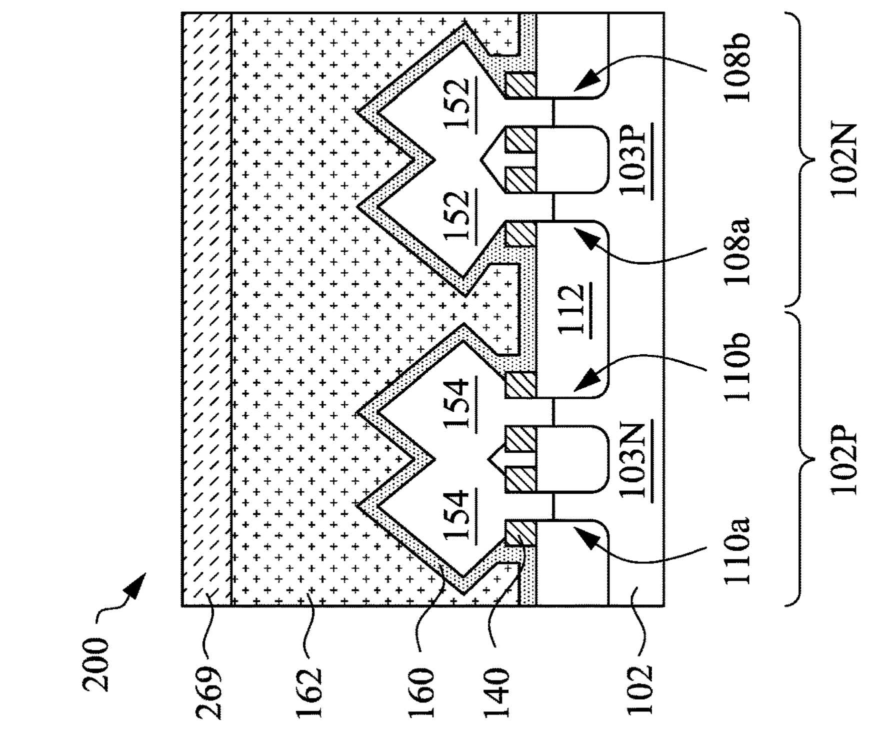
Figure 24B:
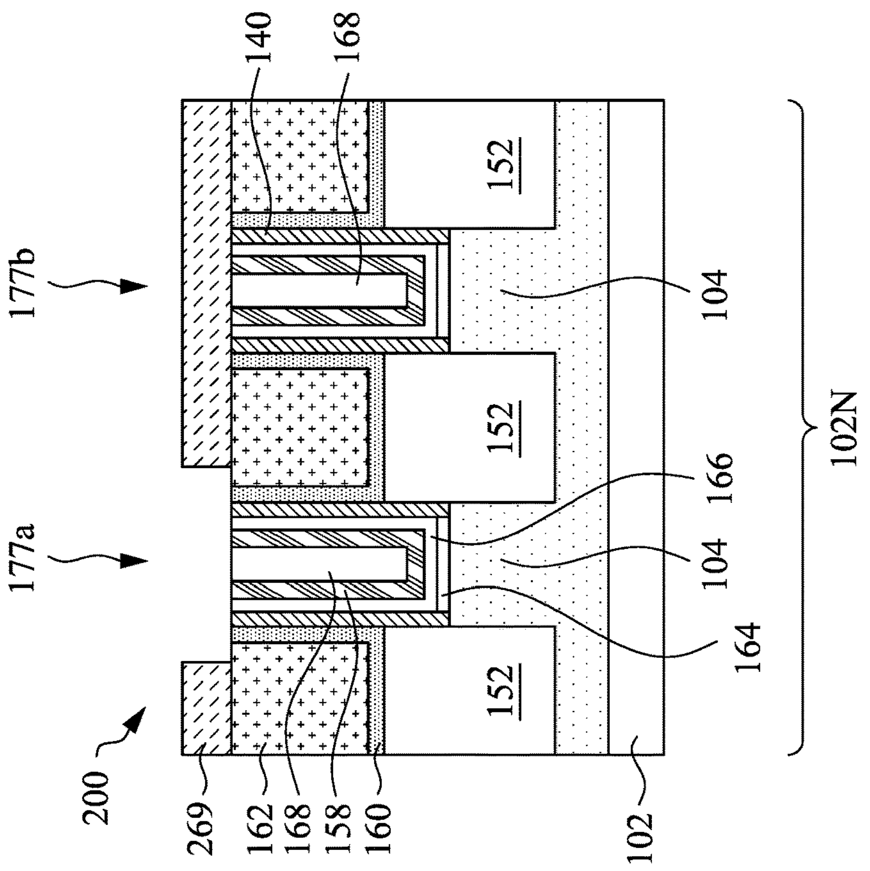
Figure 25B:
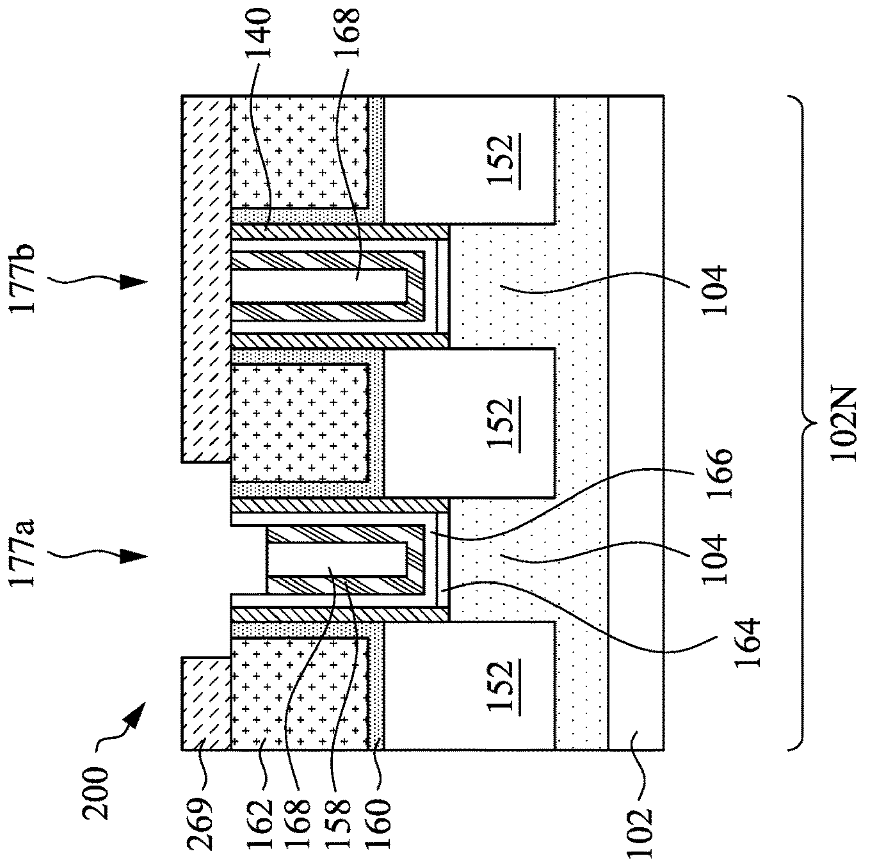
Figure 25A:
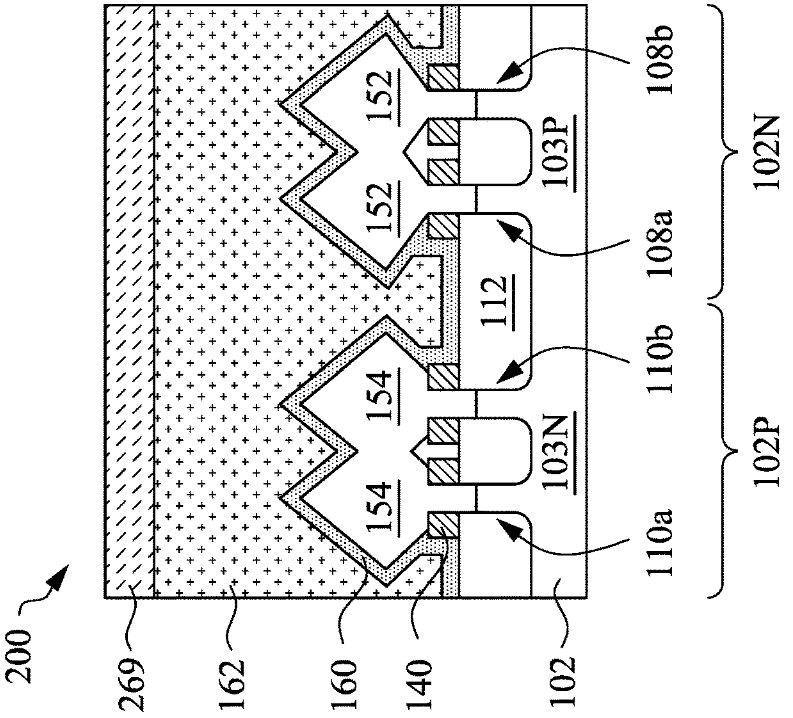
Figure 26B:
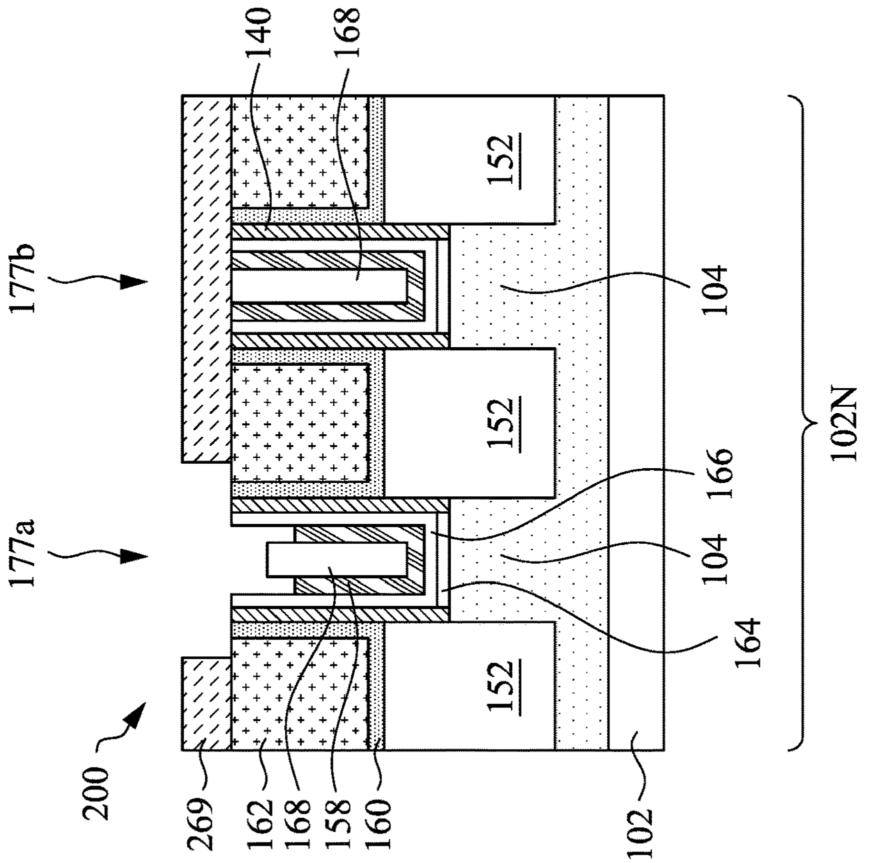
Figure 26A:
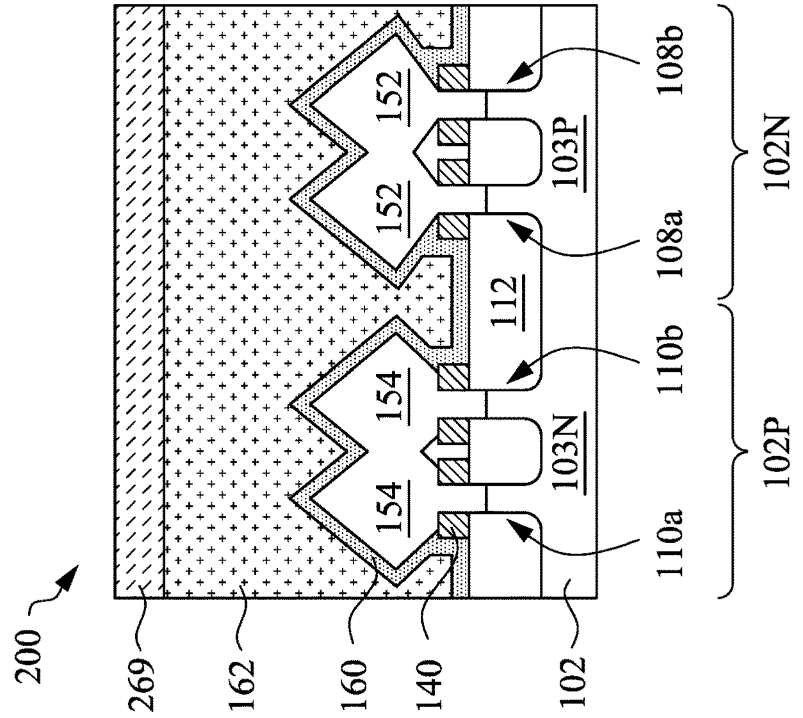
Figure 27B:
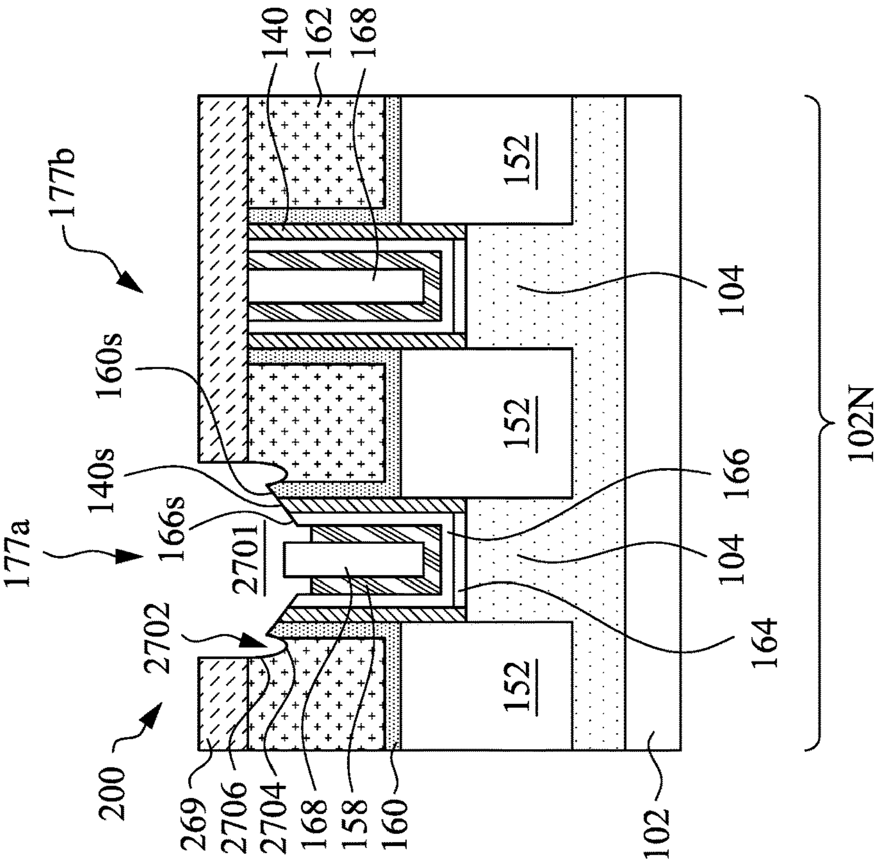
Figure 27A:
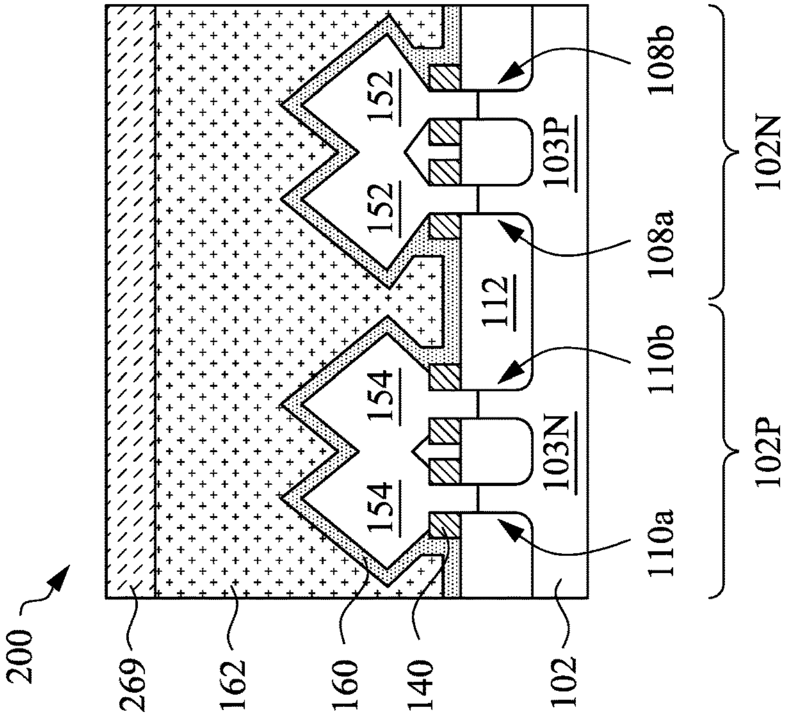
Figure 28B:
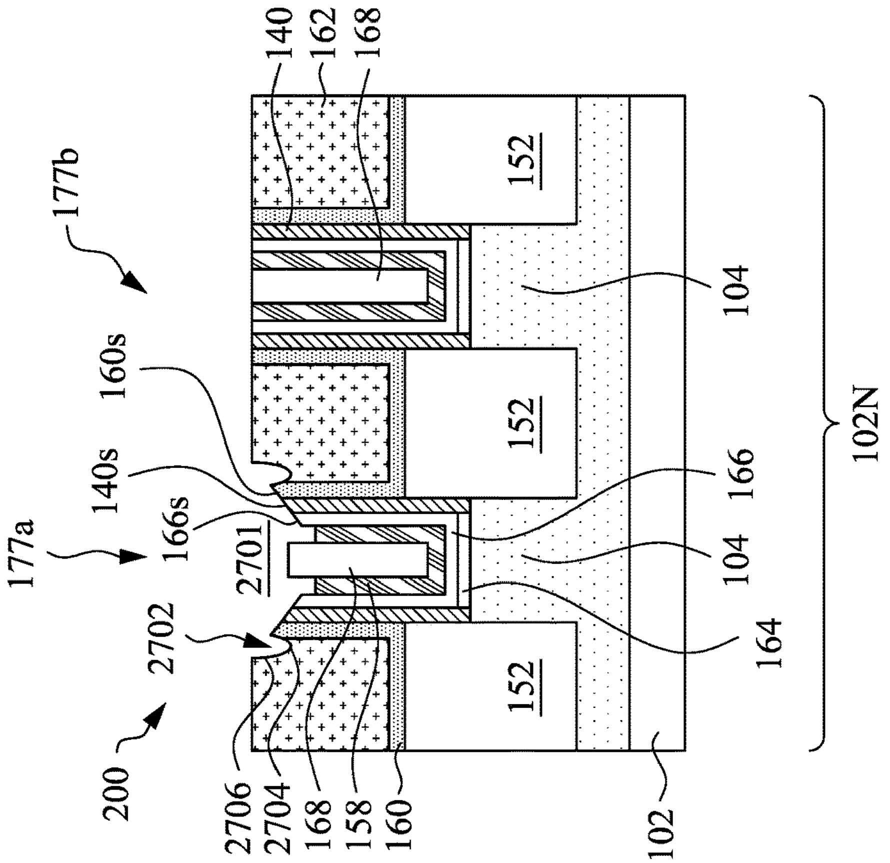
Figure 28A:
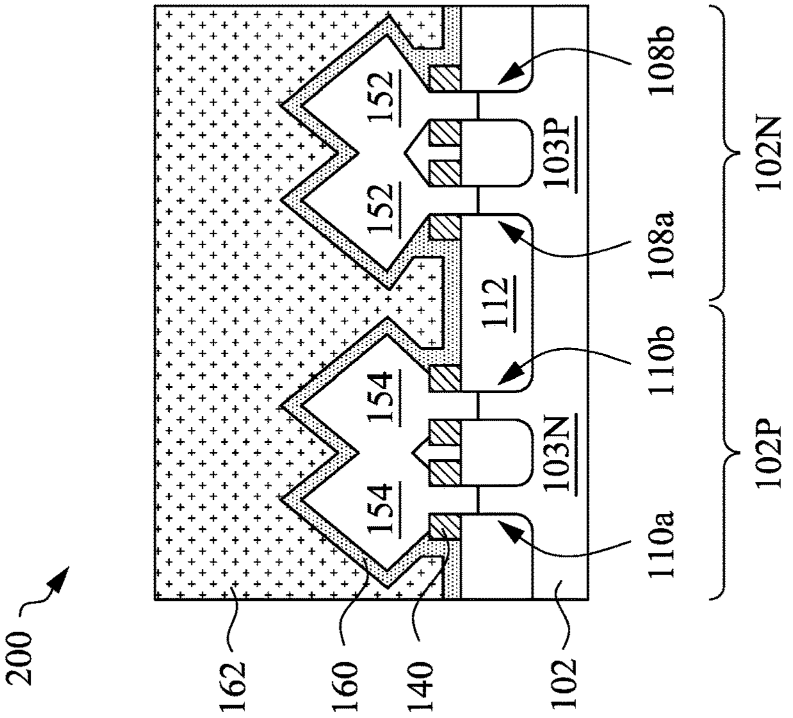

FIGS. 22A-22B to 33A-33C illustrate various stages of manufacturing a semiconductor device structure 200, in accordance with some embodiments. For ease of brevity, the semiconductor device structure 200 in FIGS. 22A-22B show a stage after the recesses are formed as a result of the removal of the sacrificial gate electrode layers 132 and the sacrificial gate dielectric layers 130, as discussed above with respect to FIG. 8B. In FIGS. 22A-22B, the replacement gate structures 177 are formed in the recesses. The replacement gate structures 177 generally includes a gate dielectric layer 166, one or more conformal layers 158 formed on the gate dielectric layer 166, and a gate electrode layer 168 formed on the one or more conformal layers 158 and in contact with the gate dielectric layer 166. The replacement gate structures 177 may be formed in the similar fashion as discussed above with respect to FIGS. 9A-9B to 10A-10B.

In FIGS. 23A-23B to 24A-24B, a planarization process, such as a CMP process, is performed on the semiconductor device structure 200 until the one or more conformal layers 158 are exposed. After the planarization process, the top surfaces of the gate electrode layer 168, the first ILD 162, the CESL 160, the gate spacers 140, the gate dielectric layers 166, and the one or more conformal layers 158 are substantially co-planar. A mask layer 269, such as the mask layer 169 (FIG. 13B), is then formed on the top surfaces of the gate electrode layer 168, the first ILD 162, the CESL 160, the gate spacers 140, the gate dielectric layers 166, and the one or more conformal layers 158. A portion of the mask layer 269 is removed to expose at least one or more replacement gate structures 177 (e.g., replacement gate structure 177*a*) along the X direction, and portions of the first ILD 162, the CESL 160, the gate spacers 140, the gate dielectric layers 166, and the one or more conformal layers 158 adjacent the exposed replacement gate structure 177. The mask layer 269 protects at least one or more neighboring replacement gate structures 177 (e.g., replacement gate structure 177*b*) along the X direction from subsequent etching process(es).

In FIGS. 25A-25B to 27A-27B, a metal gate etching back (MGEB) process and an etch-back process, such as the MGEB process and the etch-back process and discussed above with respect to FIGS. 11A-11B to 14A-14B, are performed to selectively remove portions of the gate electrode layer 168, the one or more conformal layers 158, the gate dielectric layers 166, the gate spacers 140, the CESL 160, and the first ILD 162. As a result of the MGEB process and the etch-back process, the exposed portions of the first ILD 162 are etched to form a recess 2702 in the exposed portions of the first ILD 162, while the exposed portions of each of the CESL 160, the gate spacers 140, and the gate dielectric layers 166 are etched to have a slanted top surface 160*s*, 140*s*, 166*s*, respectively. The recess 2702 includes a curved bottom 2704 and a straight sidewall 2706, and the slanted top surfaces 160*s*, 140*s*, 166*s* are substantially co-planar. Openings 2701 are formed above the exposed replacement gate structures 177 as a result of removal of the portions of the first ILD 162, the CESL 160, the gate spacers 140, and the gate dielectric layers 166. The openings 2701 and the recess 2702 are to be filled with a material, such as a fill material 279 to be discussed below with respect to FIG. 29B.

Figure 29B:
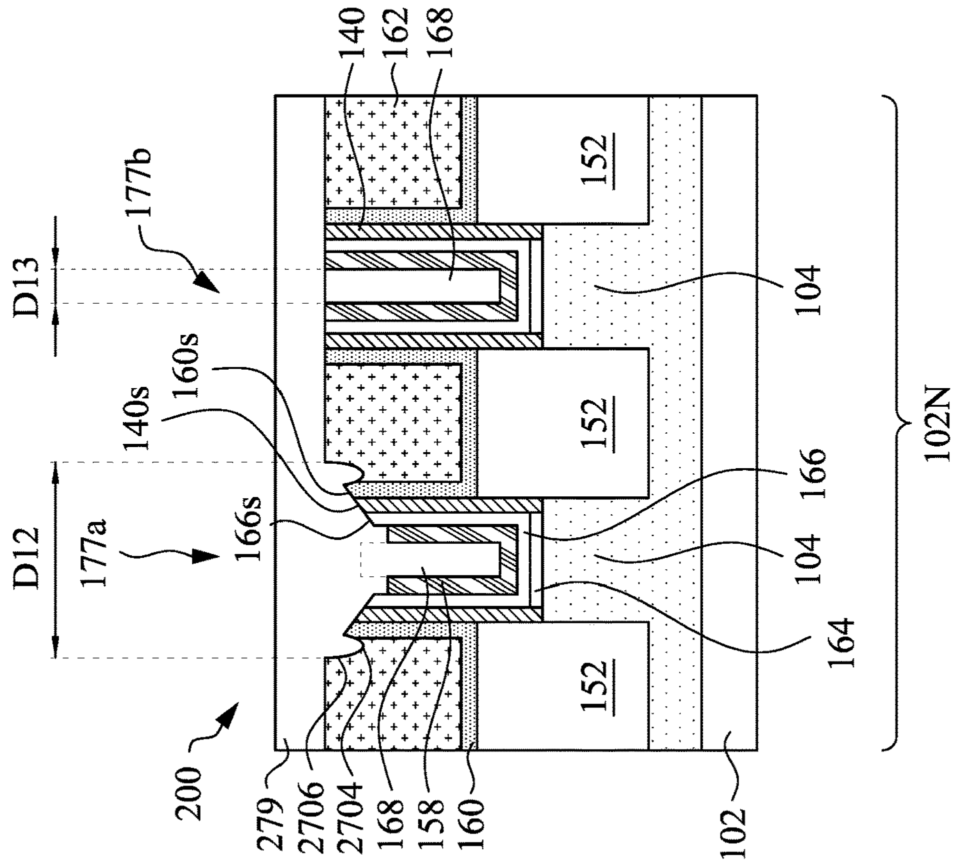
Figure 29A:
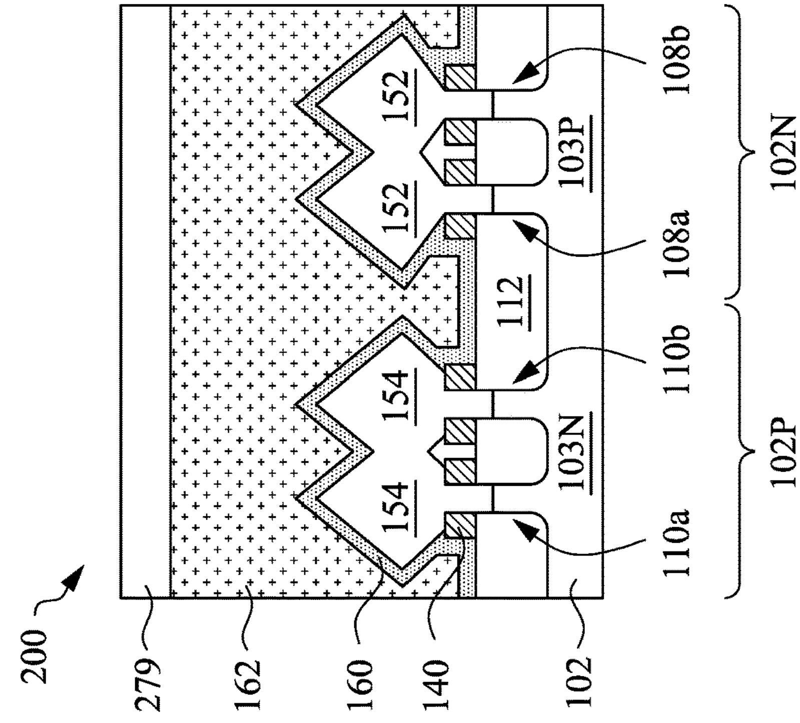
Figure 30B:
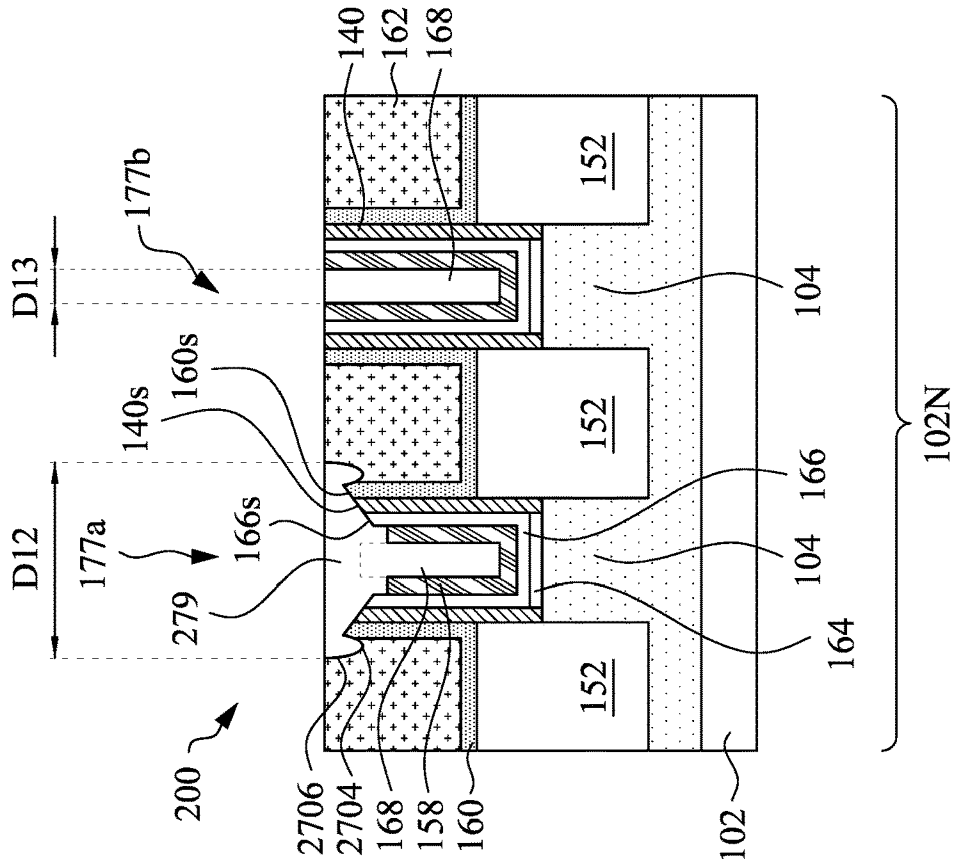
Figure 30A:
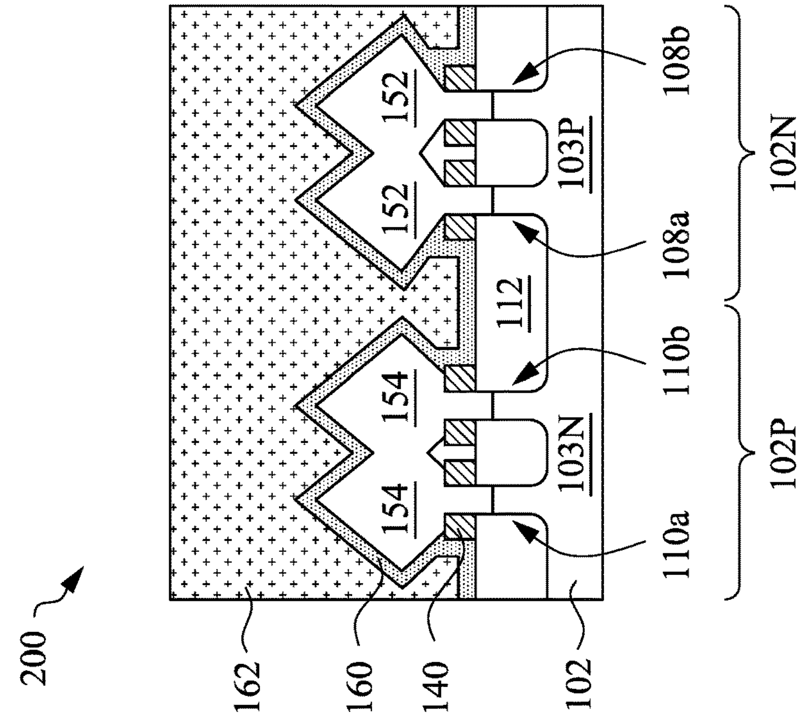
Figure 31B:
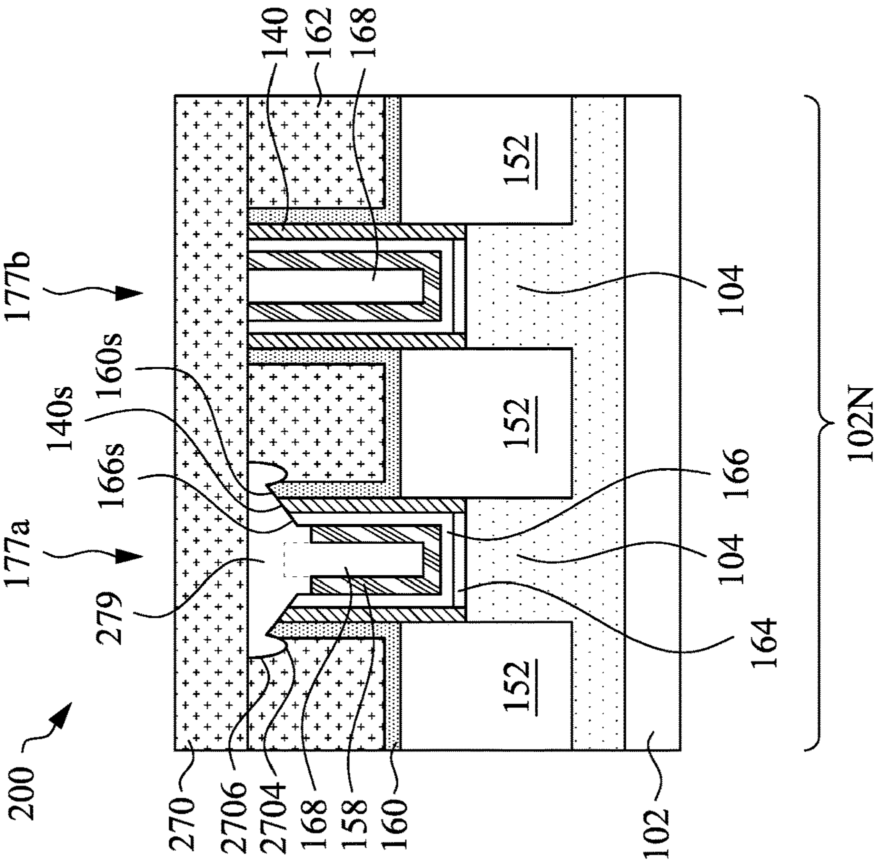
Figure 31A:
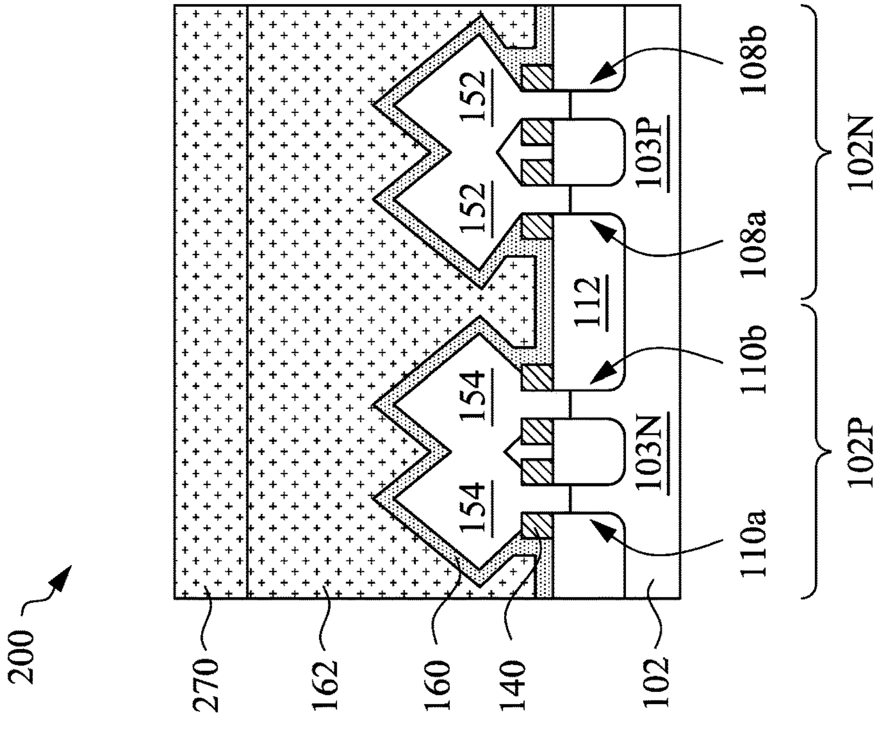
Figure 32B:
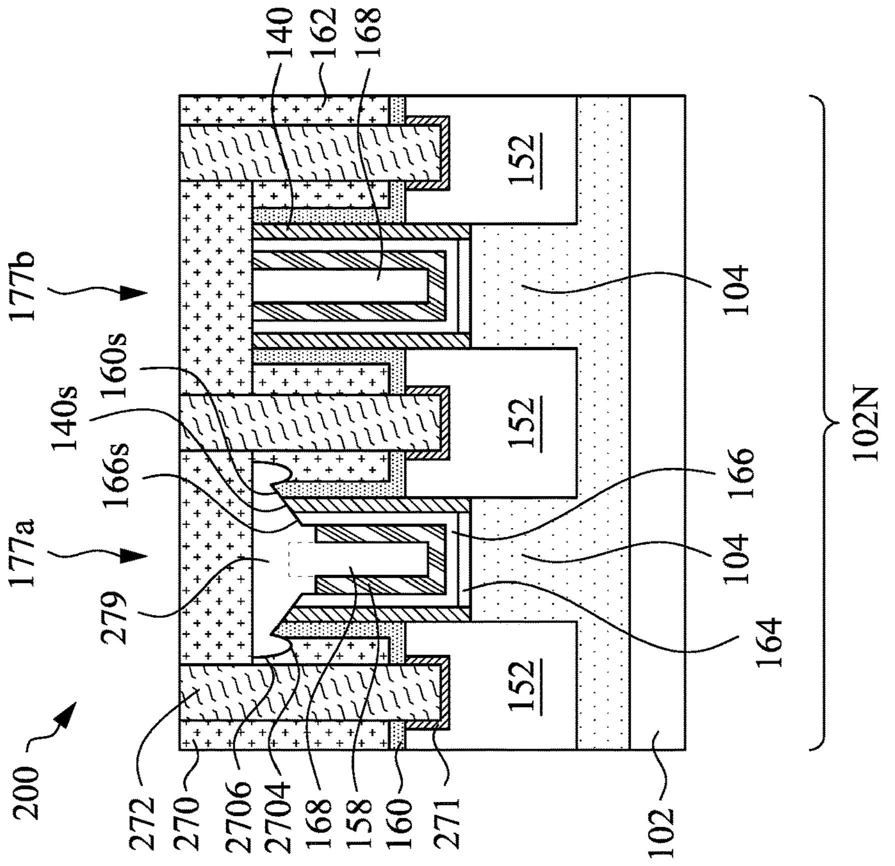
Figure 32A:
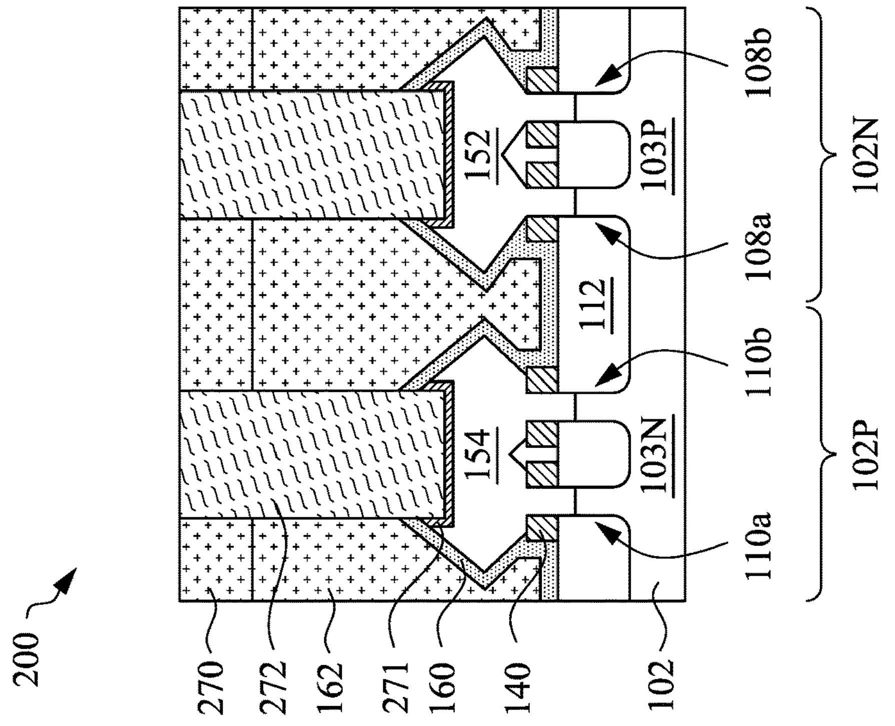

In FIGS. 28A-28B to 30A-30B, the mask layer 269 is removed and a fill material 279, such as the fill material 179 (FIG. 16B), is formed on the exposed surfaces of the first ILD 162, the CESL 160, the gate spacers 140, the gate dielectric layers 166, the one or more conformal layers 158, and the gate electrode layers 168. The fill material 279 fills in the recess 2702 and the openings 2701 (FIG. 28B) and over the top surface of the first ILD 162, as shown in FIG. 29B. The fill material 279 may include the same or different material as the gate electrode layers 168. Thereafter, a planarization process is performed until the first ILD 162 is exposed, as shown in FIG. 30B. Particularly, the fill material 279 above at least one replacement gate structure 177 (e.g., replacement gate structure 177*a*) in the N-type and P-type regions 102N, 102P has a length D12 along the X direction and the gate electrode layer 168 above at least one neighboring replacement gate structure (e.g., replacement gate structure 177*b*) in the N-type and P-type regions 102N, 102P has a length D13 along the X direction, and the length D12 is greater than the length D13. In some embodiments, the length D12 and the length D13 have a ratio (D12:D13) in a range of about 4:1 to about 8:1, for example about 5:1 to about 6:1.

In FIGS. 31A-31B to 33A-33C, a second ILD 270, such as the second ILD 170 (FIG. 18B), is formed on the first ILD 162. The second ILD 270 is in contact with the fill materials 279, the CESL 160, the gate spacers 140, and the gate dielectric layers 166. Next, contact openings are formed through the first ILD 162, the second ILD 270, and the CESL 160 to expose the S/D epitaxial features 152, 154, respectively. A conductive feature 272, such as the conductive feature 172 (FIG. 19B), is then formed in the contact openings over the S/D epitaxial features 152, 154. A silicide layer 271, such as the silicide layer 171 (FIG. 19B), may be formed between each S/D epitaxial feature 152, 154 and the conductive feature 272. The silicide layer 271 conductively couples the S/D epitaxial features 152, 154 to the conductive feature 272. Thereafter, an interconnect structure 274, such as the interconnect structure 174 (FIG. 20B), is formed over the semiconductor device structure 200. Similar to the interconnect structure 174, the interconnect structure 274 may include one or more intermetal dielectrics 276, 278 and a plurality of interconnect features 285, 287 formed in each of the intermetal dielectrics 276, 278. The interconnect features 285 are selectively formed to provide electrical connection to some of the S/D contacts (e.g., conductive feature 272). The interconnect features 287 are formed to selectively provide electrical connection between the S/D contacts in the N-type region 102N and the P-type region 102P. A conductive via 289 (FIG. 33C) may form through the intermetal dielectric 276 and the second ILD 270 to electrically connect the gate electrode (e.g., fill material 279 and gate electrode layer 168) to the interconnect features 287.

Figure 33B:
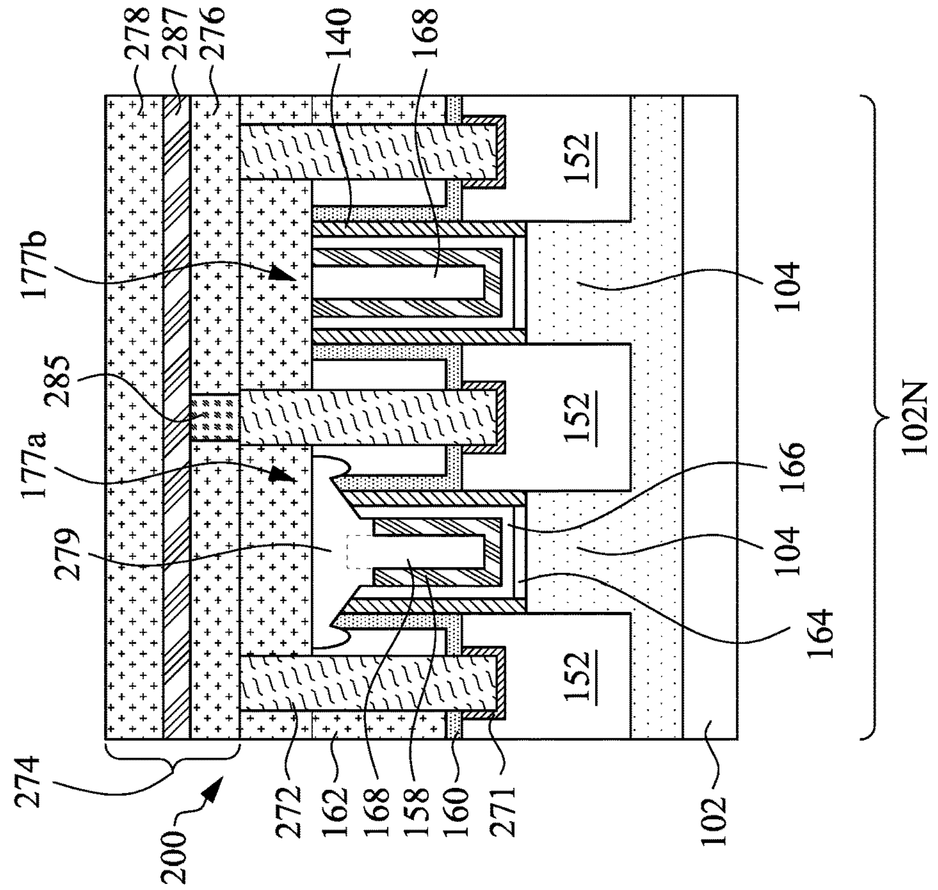
Figure 33A:
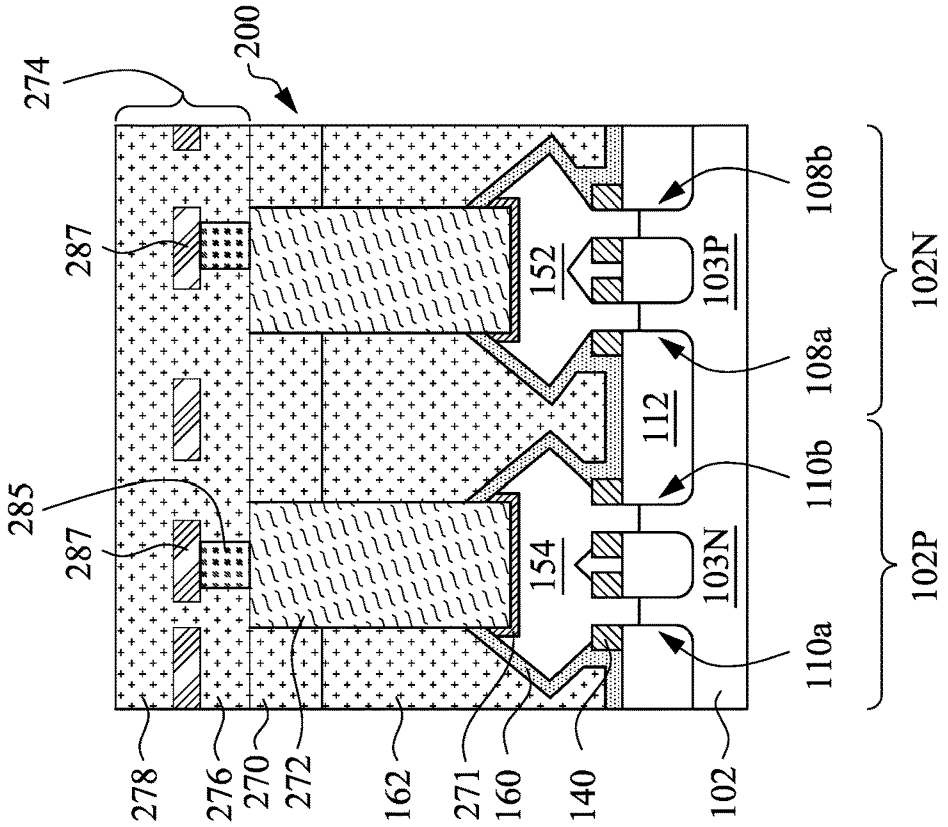
Figure 33C:
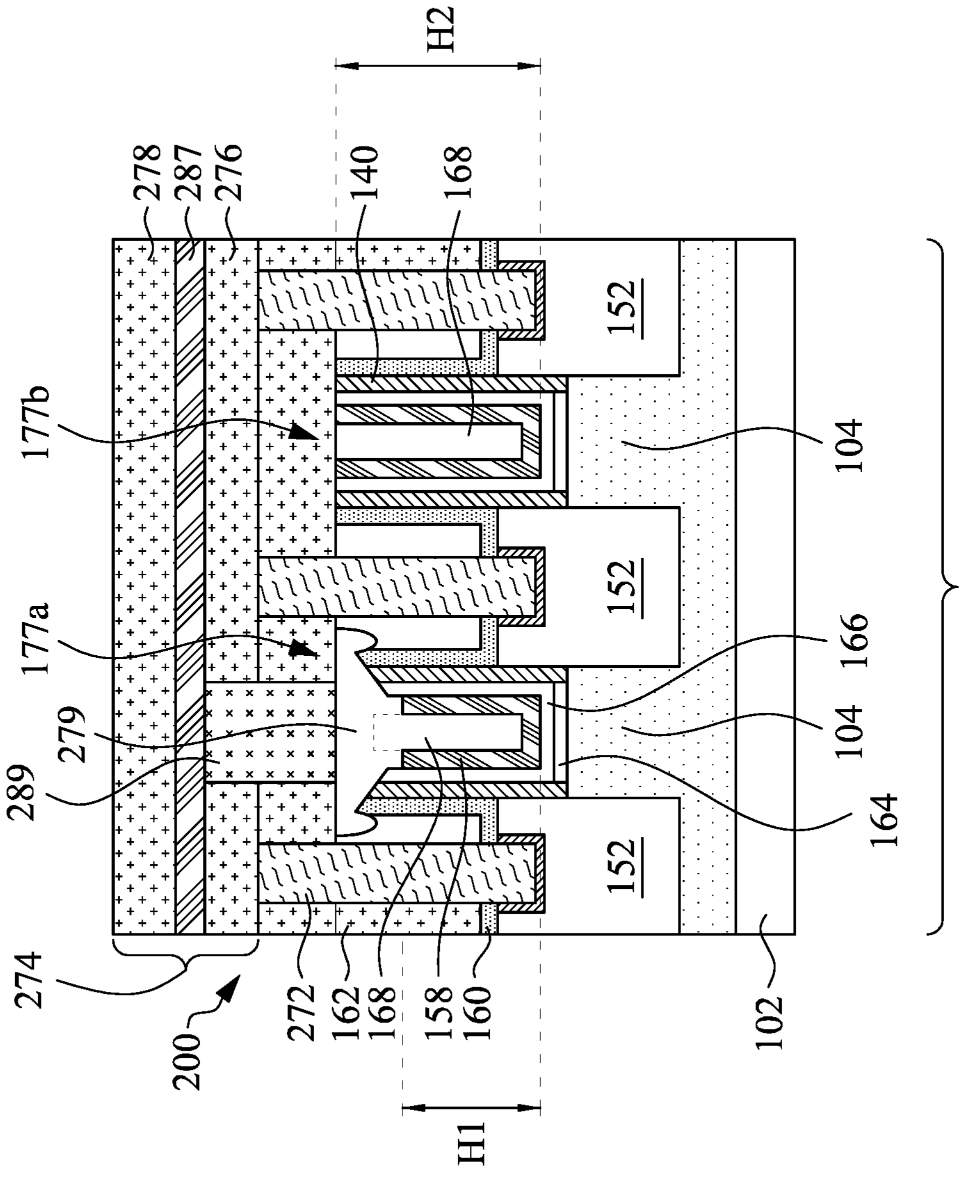

FIGS. 33B and 33C also illustrate that the gate electrode profile of the at least one replacement gate structure is different from the gate electrode profile of the at least one neighboring replacement gate structure. In one embodiment, the gate electrode (e.g., fill material 279 and gate electrode layer 168) of the at least one replacement gate structure (e.g., replacement gate structure 177*a*) may have a profile and features as the core gate electrode 2100 shown in FIG. 21 discussed above, and the gate electrode (e.g., gate electrode layer 168) of the at least one neighboring replacement gate structure (e.g., replacement gate structure 177*b*) may have a substantial rectangular-shaped profile, in which at least three sides of the gate electrode layer 168 are in contact with the one or more conformal layers 158. In some embodiments, the one or more conformal layers 158 of the at least one replacement gate structure (e.g., replacement gate structure 177*a*) have a first height H1 and the one or more conformal layers 158 of the at least one neighboring replacement gate structure (e.g., replacement gate structure 177*b*) have a second height H2 greater than the first height H1. Each of the first and second heights H1, H2 is measured from a top surface of the one or more conformal layers to a bottom surface of the one or more conformal layers. In one embodiment, and the first height H1 and the second height H2 are at a ratio (H1:H2) of about 1:1.2 to about 1:2, for example about 1.1.5 to about 1:1.8.

Figure 34A:
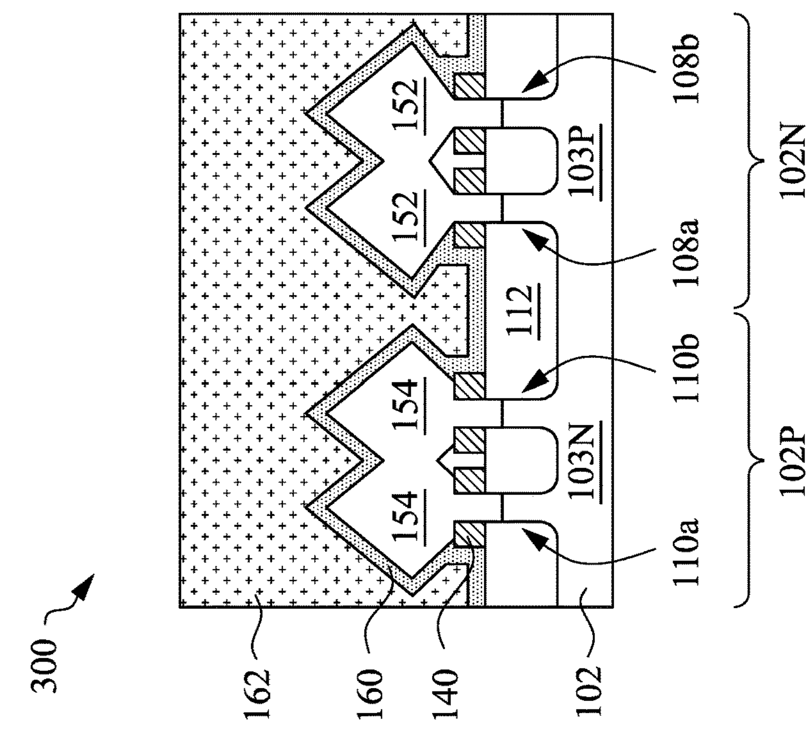
Figure 34B:
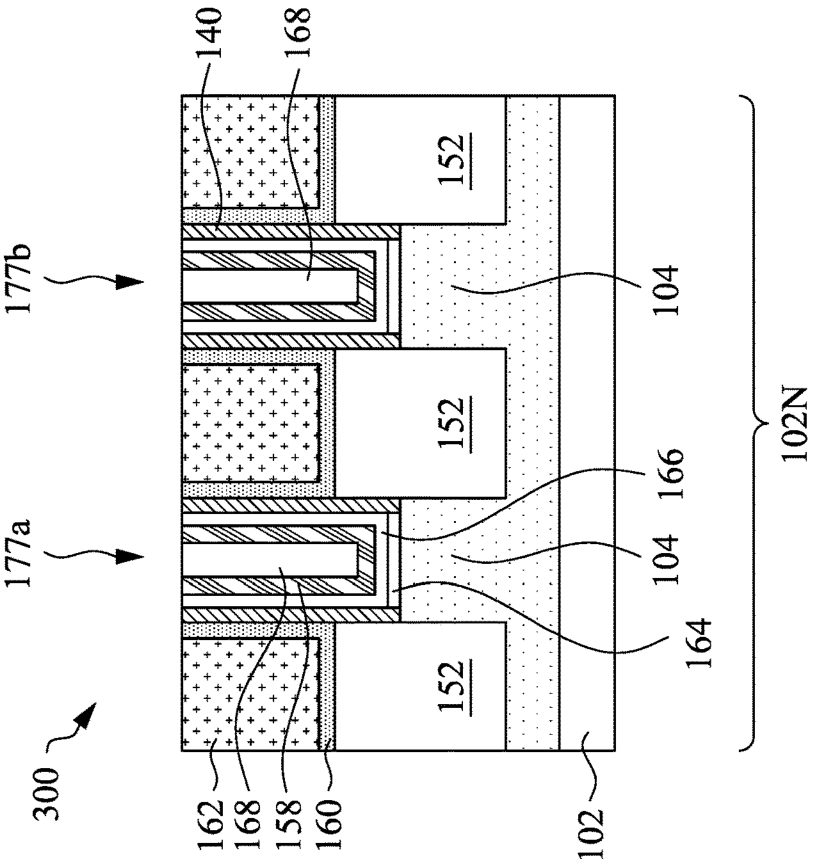
Figure 43:
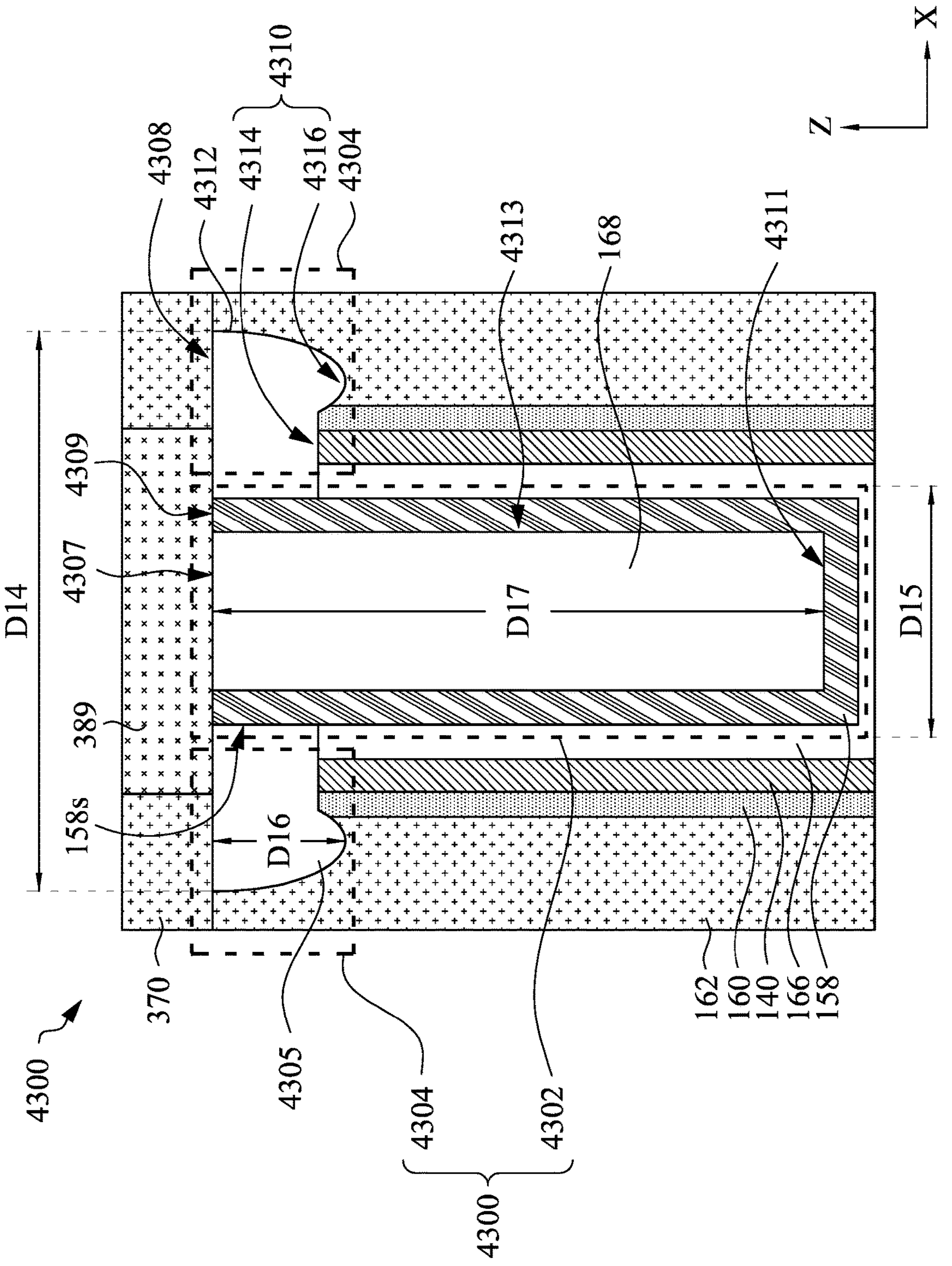
FIG. 43 is an enlarged view of a portion of the semiconductor device structure of FIG. 42C showing a gate electrode, in accordance with some embodiments.

FIGS. 34A-34B to 43 illustrate various stages of manufacturing a semiconductor device structure 300, in accordance with some embodiments. For ease of brevity, the semiconductor device structure 300 in FIGS. 34A-34B show a stage after the recesses are formed as a result of the removal of the sacrificial gate electrode layers 132 and the sacrificial gate dielectric layers 130, as discussed above with respect to FIG. 8B. In FIGS. 34A-34B, the replacement gate structures 177 are formed in the recesses. The replacement gate structures 177 generally includes a gate dielectric layer 166, one or more conformal layers 158 formed on the gate dielectric layer 166, and a gate electrode layer 168 formed on the one or more conformal layers 158 so that at least three sides of the gate electrode layer 168 are in contact with the one or more conformal layers 158. The replacement gate structures 177 may be formed in the similar fashion as discussed above with respect to FIGS. 9A-9B to 10A-10B except that no etch-back process is performed to recess down the top surfaces of the one or more conformal layers 158. After the replacement gate structures 177 are formed, a planarization process, such as a CMP process, is performed on the semiconductor device structure 300 until the top surfaces of the gate electrode layer 168, the first ILD 162, the CESL 160, the gate spacers 140, the gate dielectric layers 166, and the one or more conformal layers 158 are substantially co-planar.

Figure 35B:
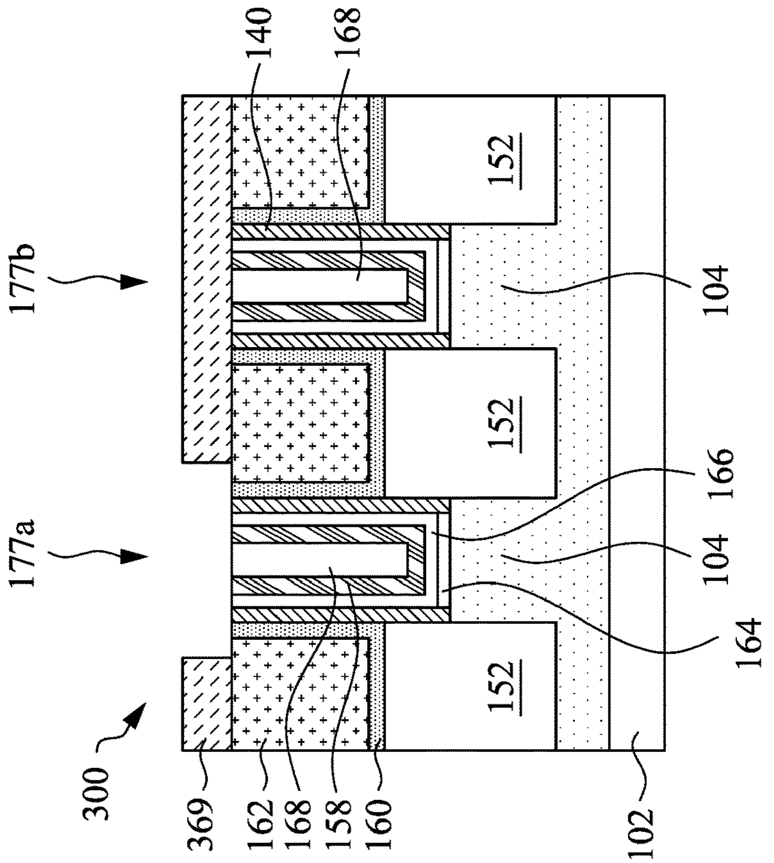
Figure 35A:
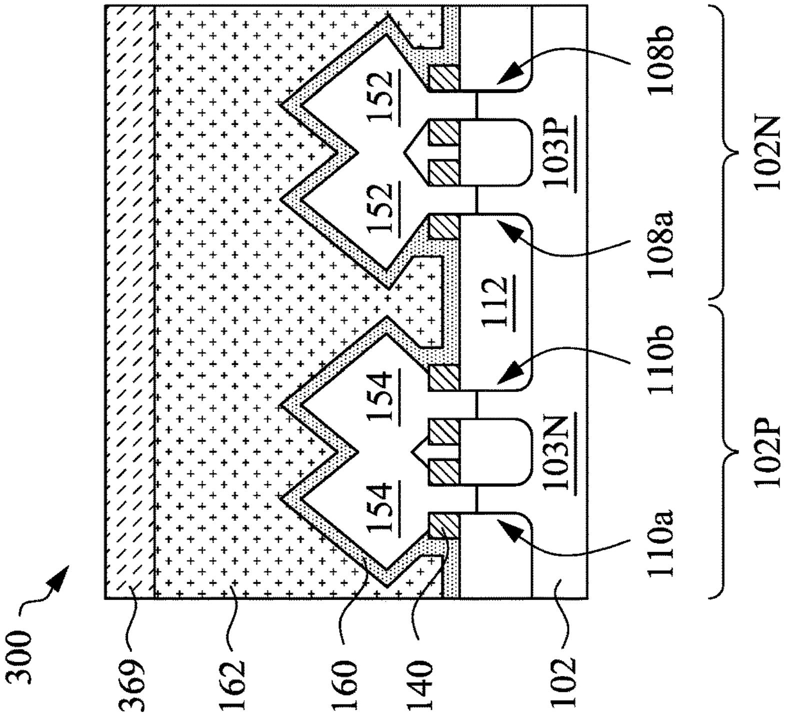

In FIGS. 35A-35B, a mask layer 369, such as the mask layer 169 (FIG. 13B), is formed on the top surfaces of the gate electrode layer 168, the first ILD 162, the CESL 160, the gate spacers 140, the gate dielectric layers 166, and the one or more conformal layers 158. A portion of the mask layer 369 is removed to expose at least one or more replacement gate structures 177 (e.g., replacement gate structure 177*a*) along the X direction, and portions of the first ILD 162, the CESL 160, the gate spacers 140, the gate dielectric layers 166, and the one or more conformal layers 158 adjacent the exposed replacement gate structure 177. The mask layer 369 protects at least one or more neighboring replacement gate structures 177 (e.g., replacement gate structure 177*b*) along the X direction from subsequent etching process(es).

Figure 36A:
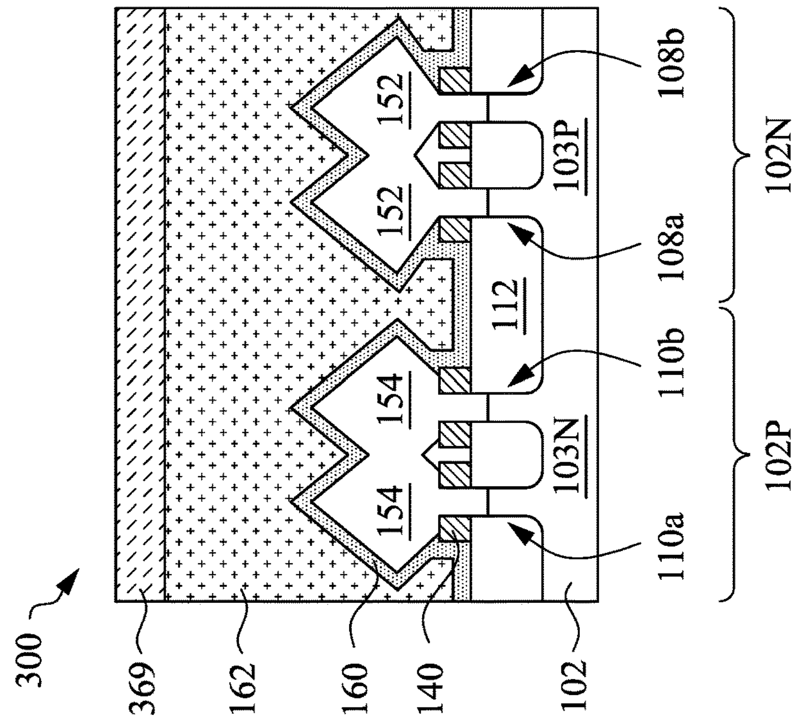
Figure 36B:
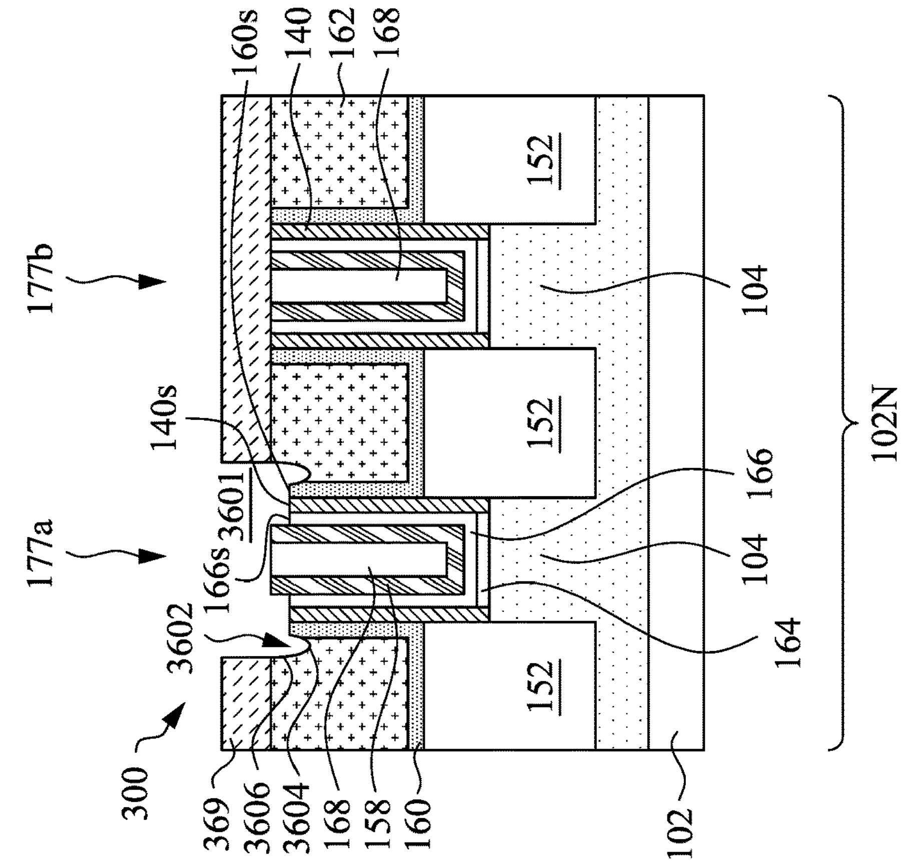
Figure 37B:
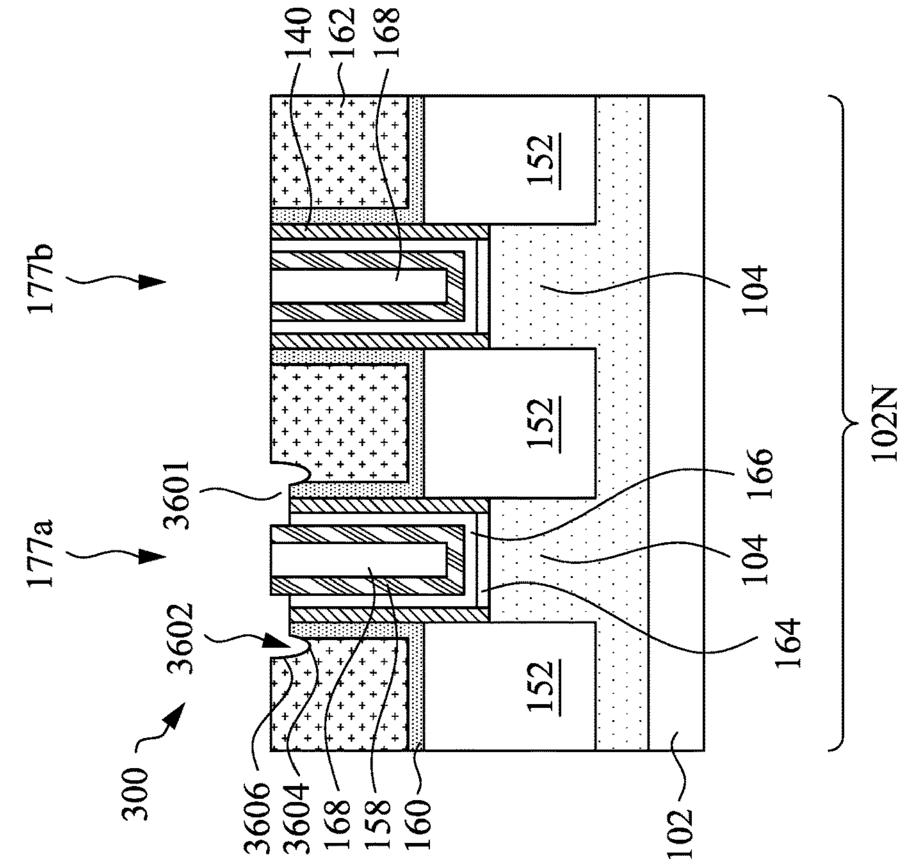
Figure 37A:
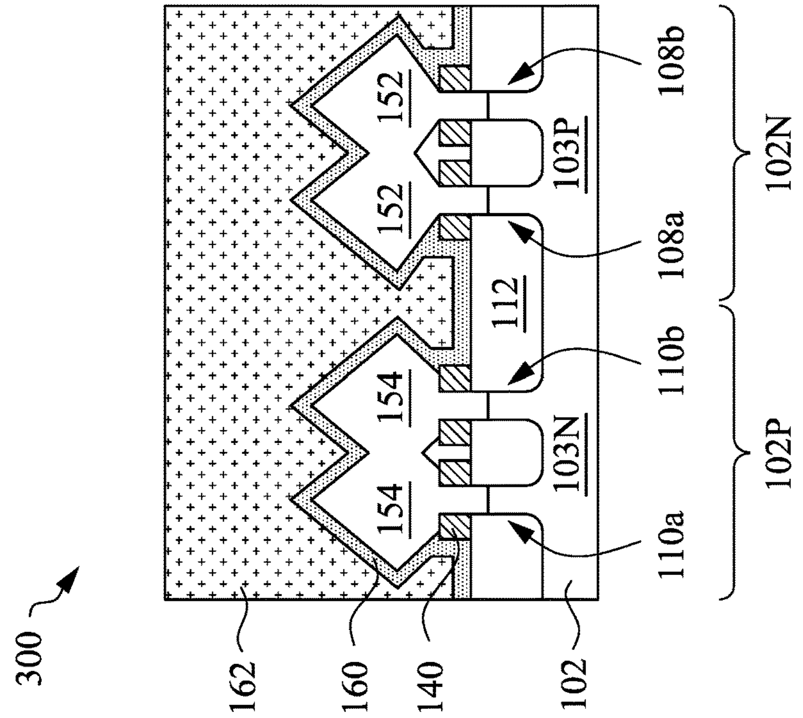

In FIGS. 36A-36B, exposed portions of the gate dielectric layers 166, the gate spacers 140, the CESL 160, and the first ILD 162 are removed by one or more etch processes, such as dry etch process, wet etch process, or a combination thereof. Similar to the etch processes discussed above with respect to FIGS. 14A and 14B, the one or more etch processes selectively remove the gate dielectric layers 166, the gate spacers 140, the CESL 160, and the first ILD 162 without substantially affects the gate electrode layers 168 and the one or more conformal layers 158. Openings 3601 are also formed above the gate dielectric layers 166, the gate spacers 140, and the CESL 160 as a result of removal of the portions of the gate dielectric layers 166, the gate spacers 140, the CESL 160, and the first ILD 162. In some embodiments, the exposed portions of the first ILD 162 are etched to form a recess 3602 in the exposed portions of the first ILD 162 due to the effect of over-etching, while the top surfaces of the gate dielectric layers 166, the gate spacers 140, and the CESL 160 are recessed to an elevation below the top surfaces of the gate electrode layers 168 and the one or more conformal layers 158. Likewise, the recess 3602 includes a curved bottom 3604 and a straight sidewall 3606, and the top surfaces 160*s*, 140*s*, 166*s* are substantially co-planar. The openings 3601 and the recess 3062 are to be filled with a material, such as a fill material 379 to be discussed below with respect to FIG. 38B.

Figure 38B:
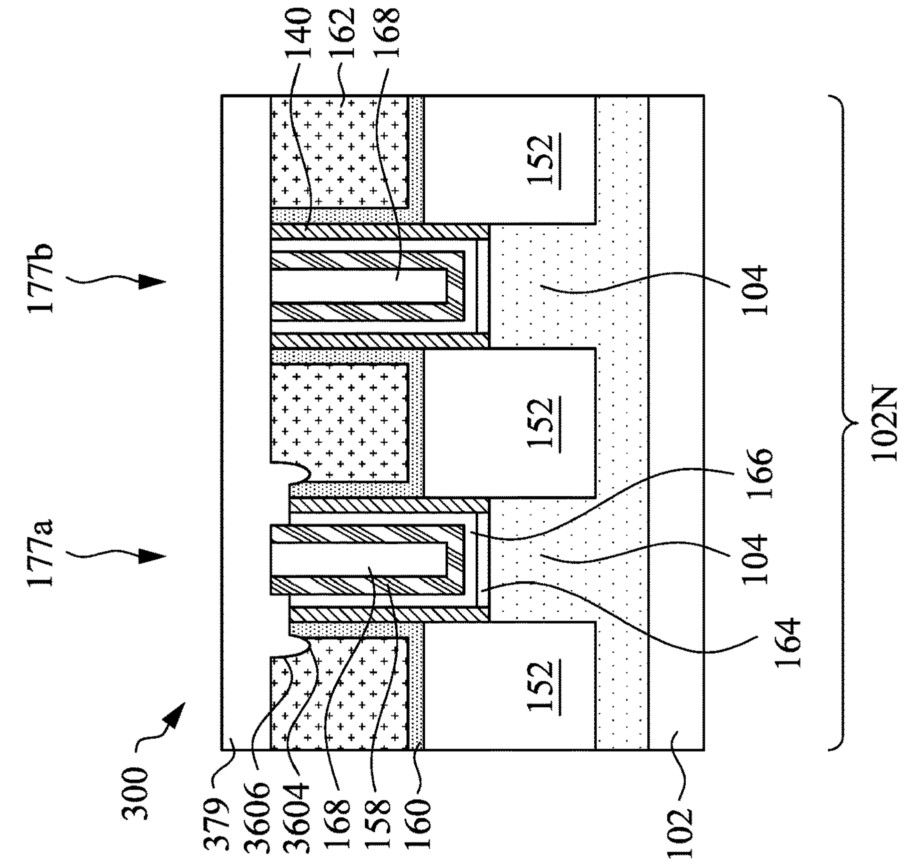
Figure 38A:
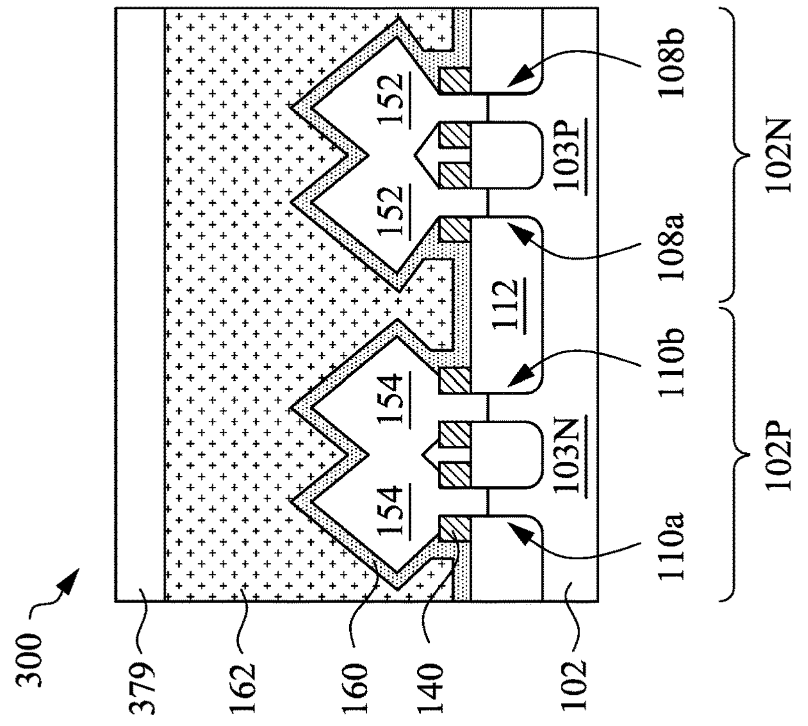
Figure 39B:
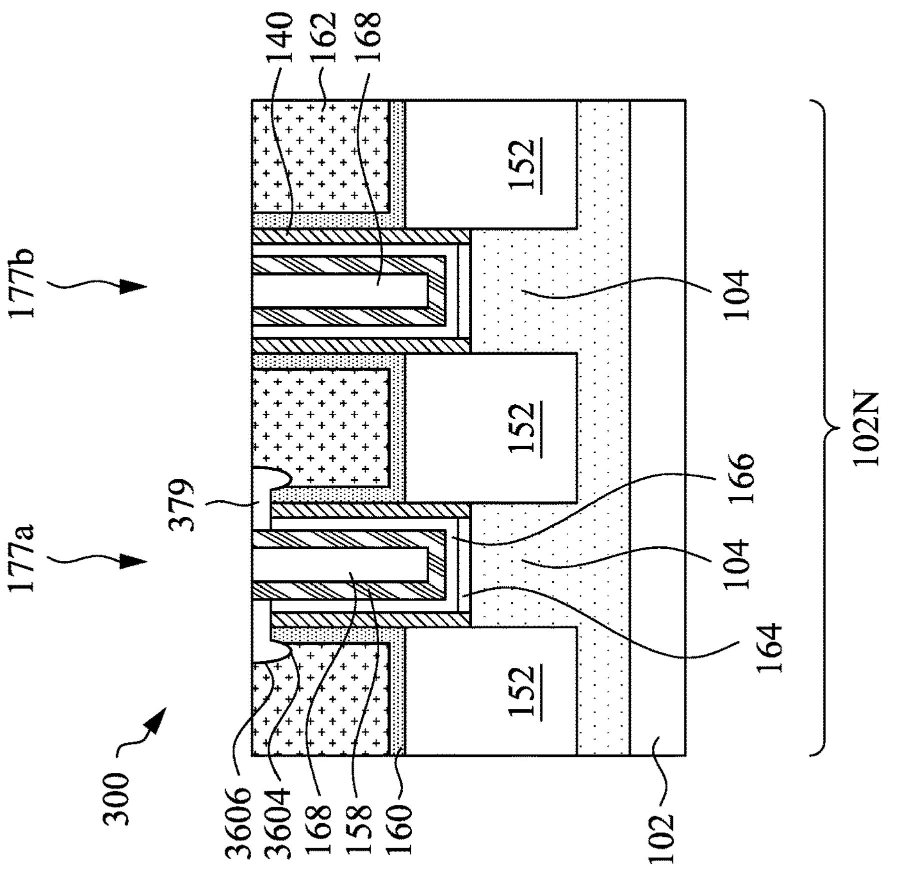
Figure 39A:
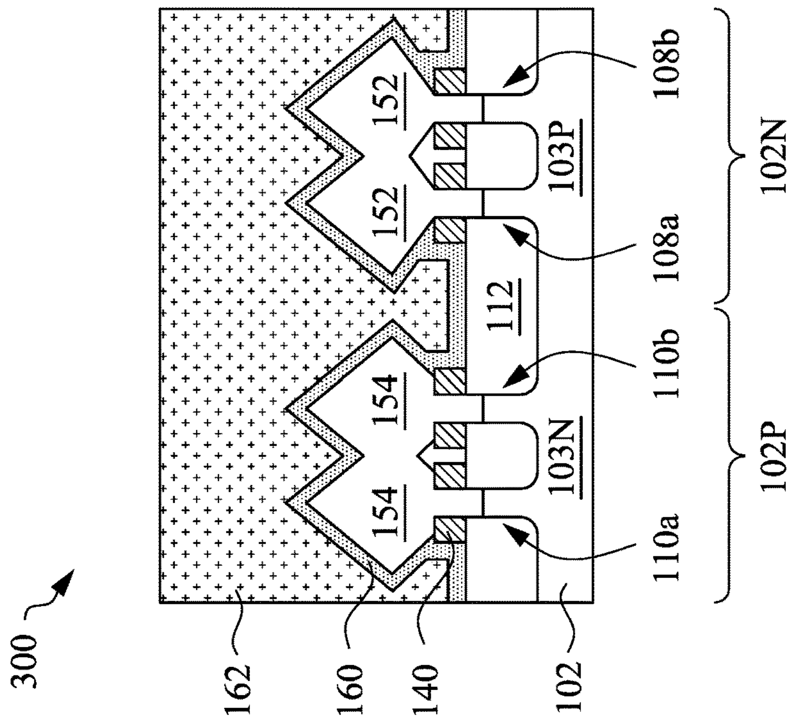
Figure 40B:
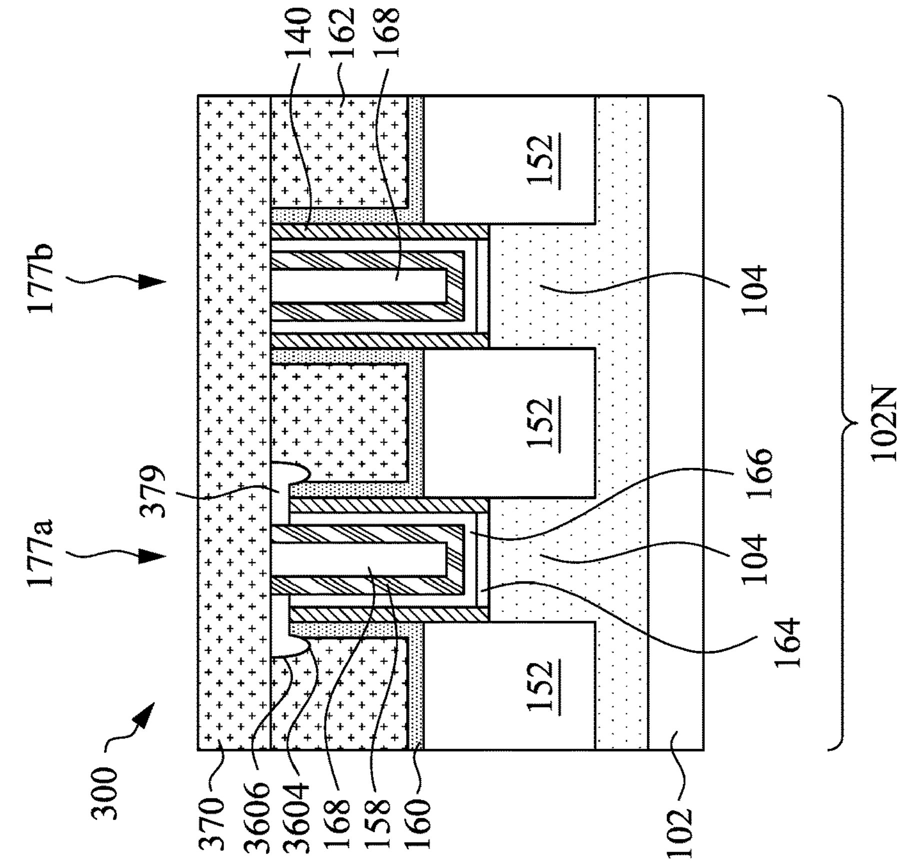
Figure 40A:
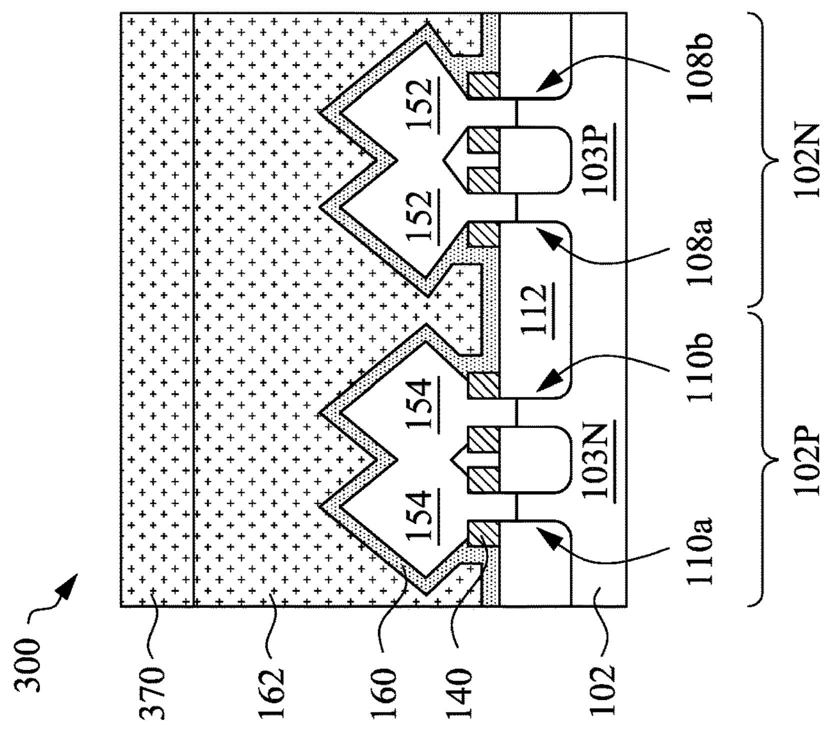
Figure 41B:
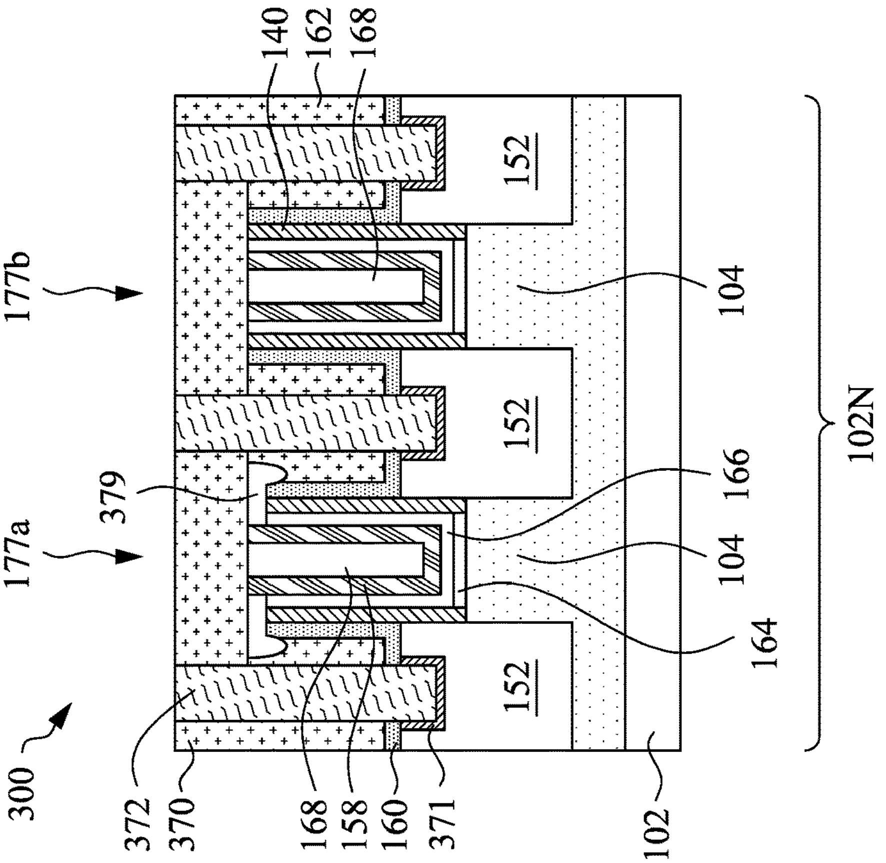
Figure 41A:
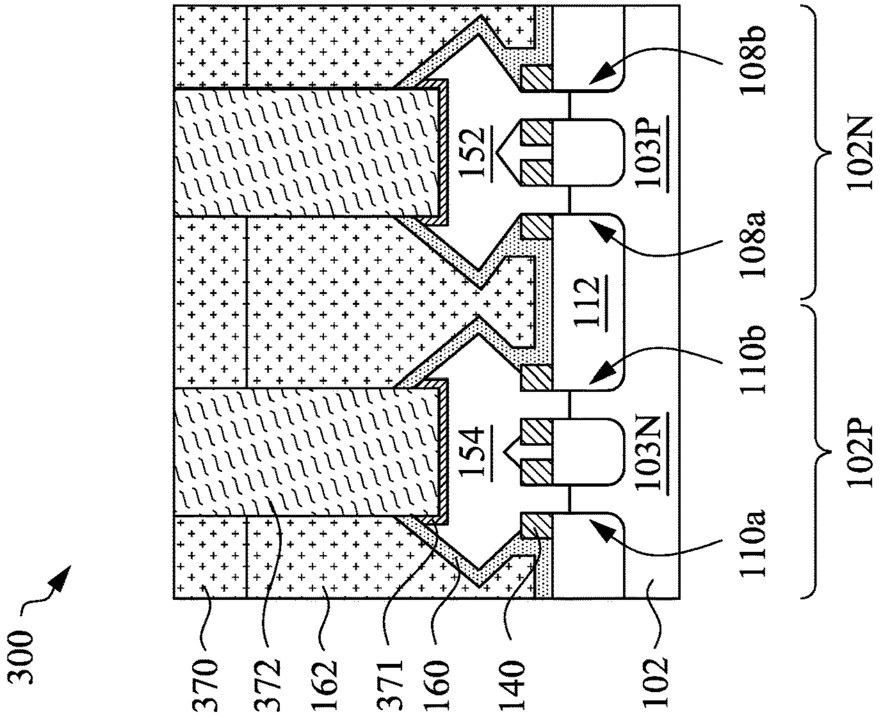

In FIGS. 37A-37B to 38A-38B, the mask layer 369 is removed and a fill material 379, such as the fill material 179 (FIG. 16B), is formed on the exposed surfaces of the first ILD 162, the CESL 160, the gate spacers 140, the gate dielectric layers 166, the one or more conformal layers 158, and the gate electrode layers 168. The fill material 379 fills in the openings 3601 and the recess 3602 (FIG. 37B) and over the top surface of the first ILD 162, as shown in FIG. 38B. The fill material 379 may include the same or different material as the gate electrode layers 168. Thereafter, a planarization process is performed on the semiconductor device structure 300 until the first ILD 162 is exposed, as shown in FIG. 39B.

In FIGS. 39A-39B to 42A-42C, a second ILD 370, such as the second ILD 170 (FIG. 18B), is formed on the first ILD 162. The second ILD 370 is in contact with the fill materials 379, the CESL 160, the gate spacers 140, and the gate dielectric layers 166. Next, contact openings are formed through the first ILD 162, the second ILD 370, and the CESL 160 to expose the S/D epitaxial features 152, 154, respectively. A conductive feature 372, such as the conductive feature 172 (FIG. 19B), is then formed in the contact openings over the S/D epitaxial features 152, 154. A silicide layer 371, such as the silicide layer 171 (FIG. 19B), may be formed between each S/D epitaxial feature 152, 154 and the conductive feature 372. The silicide layer 371 conductively couples the S/D epitaxial features 152, 154 to the conductive feature 372. Thereafter, an interconnect structure 374, such as the interconnect structure 174 (FIG. 20B), is formed over the semiconductor device structure 300. Similar to the interconnect structure 174, the interconnect structure 374 may include one or more intermetal dielectrics 376, 378 and a plurality of interconnect features 385, 387 formed in each of the intermetal dielectrics 376, 378. The interconnect features 385 are selectively formed to provide electrical connection to some of the S/D contacts (e.g., conductive feature 372). The interconnect features 387 are formed to selectively provide electrical connection between the S/D contacts in the N-type region 102N and the P-type region 102P. A conductive via 389 (FIG. 42C) may form through the intermetal dielectric 376 and the second ILD 370 to electrically connect the gate electrode (e.g., fill material 379 and gate electrode layer 168) to the interconnect features 387.

Figure 42B:
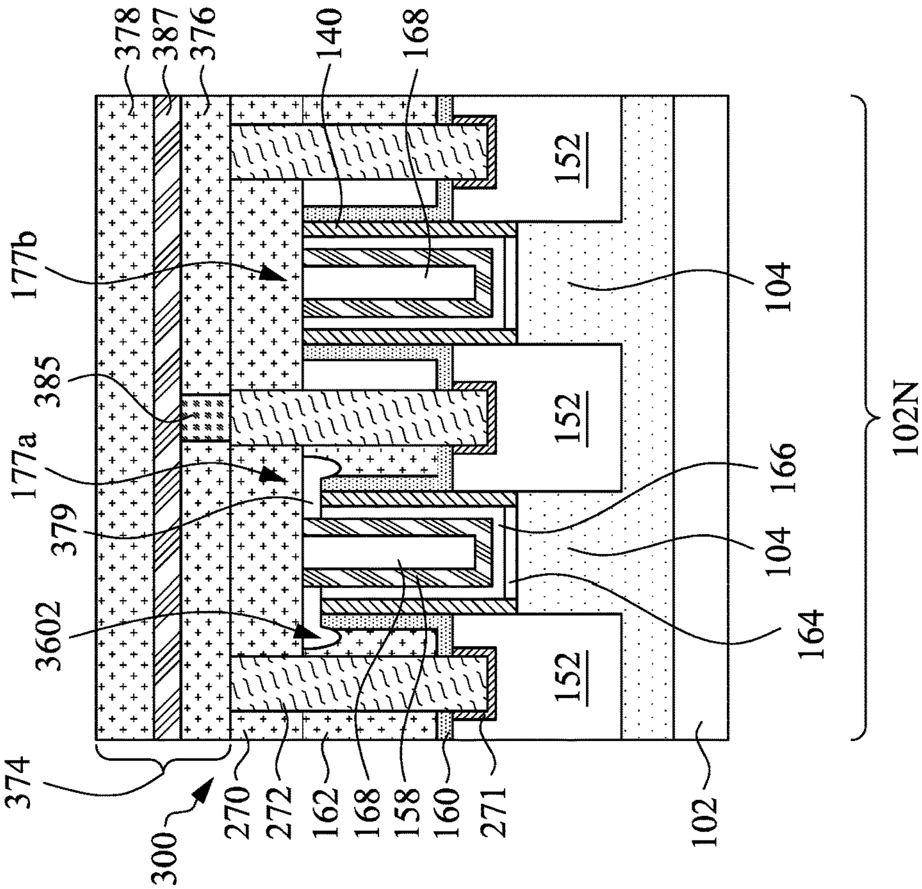
Figure 42A:
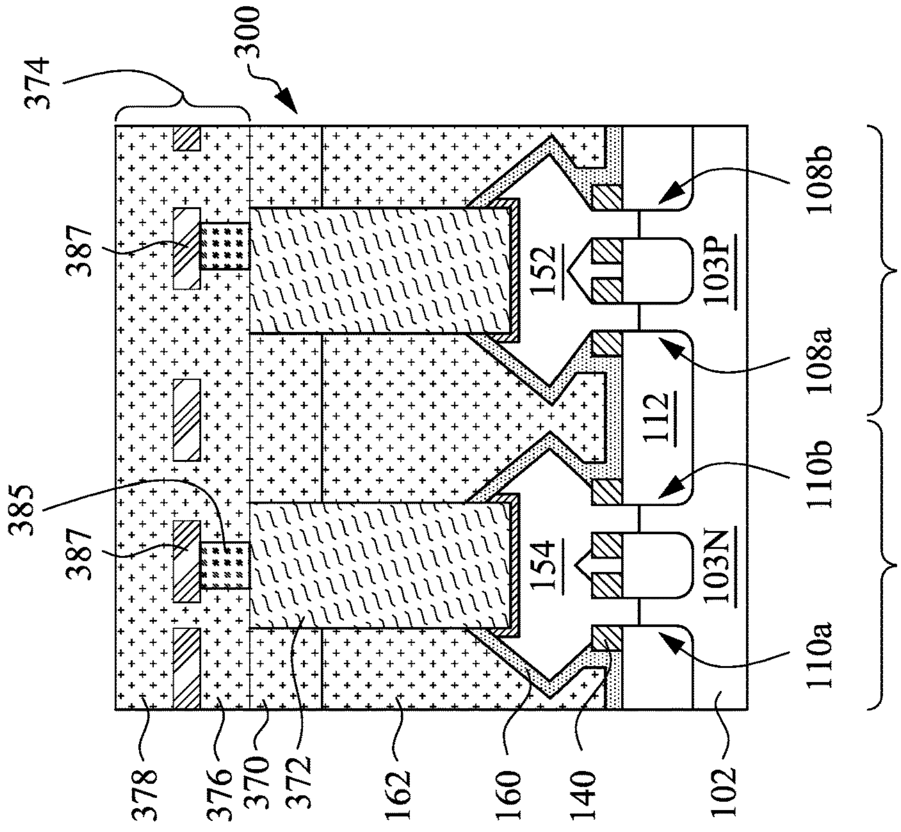
Figure 42C:
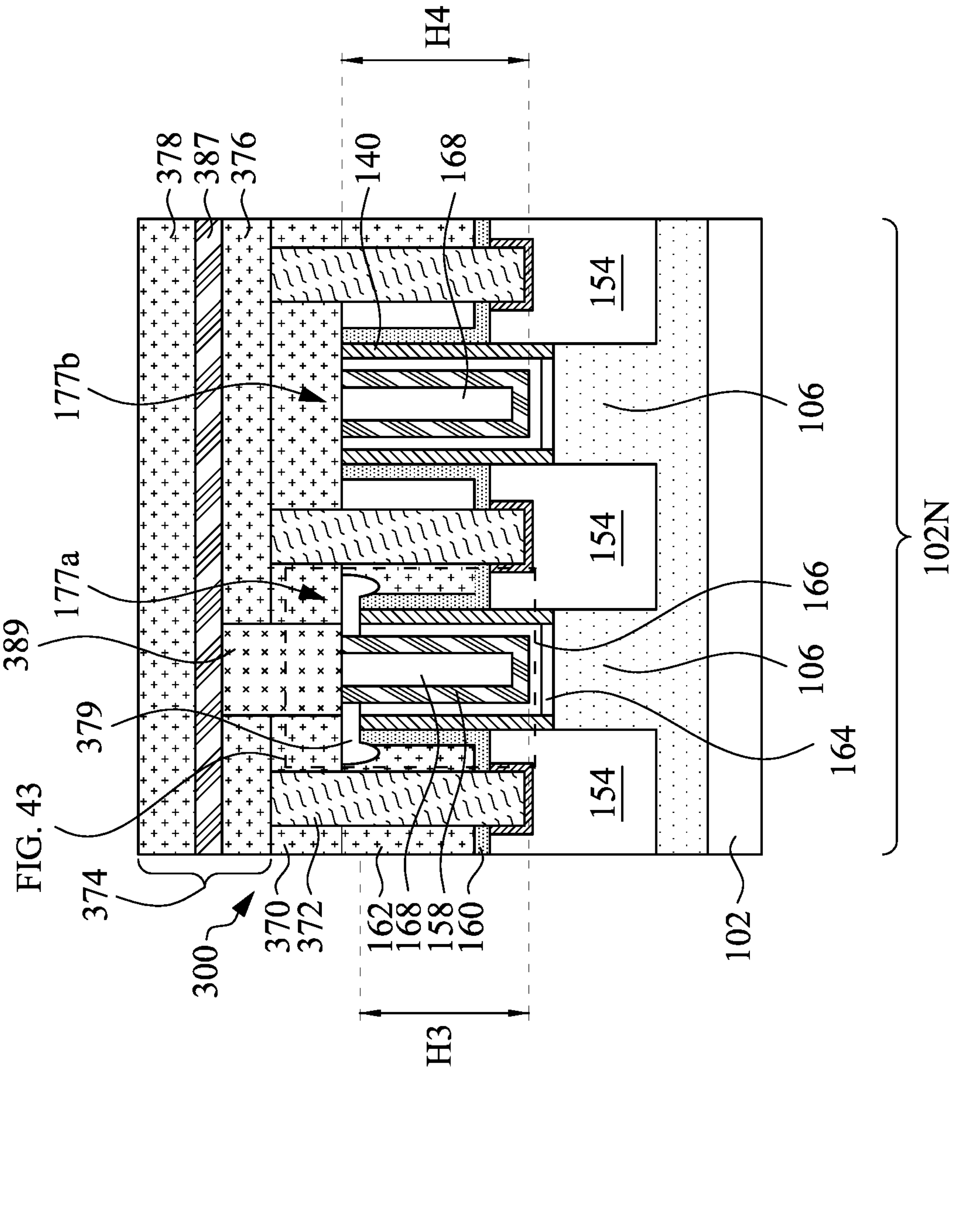

FIGS. 42B and 42C also illustrate that the gate electrode profile of the at least one replacement gate structure is different from the gate electrode profile of the at least one neighboring replacement gate structure. In one embodiment, the gate electrode (e.g., fill material 379 and gate electrode layer 168) of the at least one replacement gate structure (e.g., replacement gate structure 177*a*) may have a profile and features as the gate electrode 4300 shown in FIG. 43, and the gate electrode (e.g., gate electrode layer 168) of the at least one neighboring replacement gate structure (e.g., replacement gate structure 177*b*) may have a substantial rectangular-shaped profile, in which at least three sides of the gate electrode layer 168 are in contact with the one or more conformal layers 158. Alternatively, the gate electrode profile of the at least one replacement gate structure may be identical to the gate electrode profile of the at least one neighboring replacement gate structure. In such cases, the gate electrode of the at least one replacement gate structure (e.g., replacement gate structure 177*a*) and the gate electrode of the at least one neighboring replacement gate structure (e.g., replacement gate structure 177*b*) may both include the same profile and features as the gate electrode 4300 to be discussed in FIG. 43 below.

In some embodiments, the one or more gate dielectric layers 166 of the at least one replacement gate structure (e.g., replacement gate structure 177*a*) have a first height H3 and the one or more gate dielectric layers 166 of the at least one neighboring replacement gate structure (e.g., replacement gate structure 177*b*) have a second height H4 greater than the first height H3. Each of the first and second heights H3, H4 is measured from a top surface of the one or more gate dielectric layers to a bottom surface of the one or more gate dielectric layers 166. In one embodiment, and the first height H3 and the second height H4 are at a ratio (H3:H4) of about 1:1.1 to about 1:1.8, for example about 1.1.2 to about 1:1.5.

FIG. 43 is an enlarged view of a portion of the semiconductor device structure 300 of FIG. 42C showing a gate electrode 4300 in accordance with some embodiments. The gate electrode 4300 may be considered to have two sections, such as a first section 4302 and a second section 4304 represented by dashed line boxes in FIG. 43. The first section 4302 has a rectangular-shaped profile extending along the Z direction when viewed from the side in the Z-X plane of the semiconductor device structure 300. The first section 4302 includes the gate electrode layer 168 and the one or more conformal layers 158. The gate electrode layer 168 has one side (e.g., a top surface 4307) in contact with the conductive via 389, and at least three sides (e.g., a bottom surface 4311 and a sidewall 4313 of the gate electrode layer 168) in contact with the one or more conformal layers 158. In some embodiments, the one or more conformal layers 158 are in contact with the gate dielectric layer 166, the conductive via 389, and the second section 4304.

The second section 4304 has a rectangular-shaped profile with a curved portion 4305 extending downwardly (along the Z direction) from a corner of the second section 4304. The second section 4304 extends radially (along the X direction) from the sidewalls 158*s* of the one or more conformal layers 158 (i.e., first section 4302). The second section 4304 may have a top surface 4308, a bottom surface 4310, and straight sidewalls 4312 connecting the top surface 4308 to the bottom surface 4310. In some embodiments, the bottom surface 4310 has a straight part 4314 and a curved part 4316 connecting to the straight part 4314. The curved part 4316 of the bottom surface 4310 defines the boundary of the curved portion 4305. The lowest point of the curved part 4316 is at an elevation lower than that of the straight part 4314 of the bottom surface 4310. For example, a point where the curved part 4316 and the straight part 4314 meet is at an elevation that is higher than the lowest point of the curved part 4316.

In some embodiments, the top surface 4308 of the second section 4304 is in contact with the conductive via 389 and the second ILD 370, and the bottom surface 4310 is in contact with the gate dielectric layer 166, the gate spacer 140, the CESL 160, and the first ILD 162. In some embodiments, the curved portion 4305 is in contact with the first ILD 162. In some embodiments, the curved portion 4305 is in contact with the first ILD 162 and the CESL 160. In some embodiments, the curved portion 4305 is in contact with the first ILD 162 and the CESL 160, the CESL 160, and the gate spacer 140. In various embodiments, the top surface 4307 of the gate electrode layer 168 and the top surface 4309 of the one or more conformal layers 158 are substantially co-planar with the top surface 4308 of the second section 4304.

The gate electrode 4300 may have a top critical dimension (CD) D14 and a bottom CD D15. The top CD D14 is defined as the combined gate length (along the X direction) of first section 4302 and the second section 4304, while the bottom CD D15 is defined as the gate length of the first section 4302. In some embodiments, the top CD D14 and the bottom CD D15 are at a ratio (D14:D15) of about 1.5:1 to about 2:1. The second section 4304 has a height D16 measuring from a lowest point of the curved portion 4305 to the top surface 4308 of the second section 4304. The gate electrode layer 168 has height D17, which is a distance measuring from the bottom surface 4311 of the gate electrode layer 168 to the top surface 4307 of the gate electrode layer 168. In some embodiments, the height D16 of the second section 4304 and the height D17 of the gate electrode layer 168 are at a ratio (D16:D17) of about 1:1.5 to about 1:4, for example about 1:2 to about 1:3.

The present disclosure provides an improved FinFET by providing gate structures with different profiles. In some embodiments, the gate structures are formed with a gate electrode having different top and bottom critical dimensions. In some embodiments, the gate structures are formed so that the gate electrode have a section extended radially with a curved portion. In some embodiments, the gate structures are formed so that a gate dielectric of a first gate structure has a height that is different than a gate dielectric of a second gate structure adjacent the first gate structure. In some embodiments, the gate structures are formed so that gate spacers and the gate dielectric layers have slanted top surfaces. The transistors formed using embodiments of the present disclosure are useful in applications that require high switching speed because the unique profile can provide greater volume of the gate electrode material, which may reduce the gate resistance ($R_g$) of the FinFET by about 30% to about 50%. As a result, the switching speed of the FET is increased and the device performance is improved.

A semiconductor device structure, along with methods of forming such, are described. An embodiment is a semiconductor device structure. The semiconductor device structure includes a first gate electrode, which includes a first section having a slanted sidewall and an imaginary straight sidewall, a second section extending radially from the imaginary straight sidewall of the first section, the second section has a curved bottom, and a third section extending downwardly from the first section, wherein the third section has a straight sidewall, and the slanted sidewall of the first section connects the straight sidewall of the third section to the curved bottom of the second section. The semiconductor device structure also includes a first gate dielectric layer in contact with the straight sidewall of the third section and the slanted sidewall of the first section, and a first gate spacer in contact with the first gate dielectric layer and the slanted sidewall of the first section Another embodiment is a semiconductor device structure. The semiconductor device structure includes a first gate structure and a second gate structure disposed adjacent the first gate structure. The first gate structure includes a first gate electrode section having a top surface, a bottom surface, and a sidewall, one or more first conformal layers in contact with the bottom surface of the first gate electrode section and the sidewall of the first gate electrode section, and a second gate electrode section extending radially from the one or more first conformal layers, wherein the top surface of the first gate electrode section, a top surface of the one or more first conformal layers, and a top surface of the second gate electrode section are substantially co-planar. The second gate structure includes a third gate electrode section having a top surface, a bottom surface, and a sidewall, and one or more second conformal layers in contact with the bottom surface of the third gate electrode section and the sidewall of the third gate electrode section, wherein the top surface of the third gate electrode section and a top surface of the one or more second conformal layers are substantially co-planar.

A further embodiment is a method. The method includes forming a first gate structure and a second gate structure adjacent the first gate structure, wherein each first and second gate structure is surrounded by a contact etch stop layer (CESL) and a first interlayer dielectric (ILD). Each first and second gate structure includes a gate electrode layer, one or more conformal layers surrounding at least three sides of the gate electrode layer, a gate dielectric layer surrounding at least three sides of the one or more conformal layers, and a gate spacer disposed between and in contact with the gate dielectric layer and the CESL. The method also includes removing a portion of the one or more conformal layers so that a top surface of the one or more conformal layers is at an elevation lower than a top surface of the gate electrode layer, forming a patterned mask layer over the semiconductor device structure, the patterned mask layer exposing the first gate structure and portions of the CESL and first ILD adjacent the first gate structure, performing one or more etch processes so that each of the exposed gate dielectric layer, the gate spacer, and the CESL has a slanted top surface, removing the patterned mask layer, forming a fill material on the exposed surfaces of the gate electrode layers and the one or more conformal layers, as well as the slanted top surfaces of the gate dielectric layers, the gate spacers, and the CESLs, performing a planarization process so that a top surface of the fill material is substantially co-planar with top surfaces of the first ILD, the CESLs, the gate spacers, and the gat dielectric layers, and forming a second ILD on the top surfaces of the fill material, the first ILD, the CESLs, the gate spacers, and the gat dielectric layers.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

The invention claimed is:

1. A semiconductor device structure, comprising:
- a first gate electrode comprising:
  - a first section having a slanted sidewall;
  - a second section extending radially from the first section, the second section has a curved bottom; and
  - a third section extending downwardly from the first section, wherein the third section has a sidewall, and the slanted sidewall of the first section connects the sidewall of the third section to the curved bottom of the second section;
- a first gate dielectric layer in contact with the sidewall of the third section and the slanted sidewall of the first section; and
- a first gate spacer in contact with the first gate dielectric layer and the slanted sidewall of the first section.

2. The semiconductor device structure of claim 1, wherein the curved bottom has a lowest point at a first elevation, and a point where the slanted sidewall of the first section and the curved bottom intersect is at a second elevation higher than the first elevation.

3. The semiconductor device structure of claim 1, wherein the slanted sidewall extends along a first direction, and a longitudinal direction of the first gate spacer extends along a second direction that is at an angle greater than about 10 degrees with respect to the first direction.

4. The semiconductor device structure of claim 1, wherein the first gate electrode further comprises a fourth section extending downwardly from the third section, and at least three sides of the fourth section are in contact with one or more first conformal layers.

5. The semiconductor device structure of claim 4, wherein the fourth section and the one or more first conformal layers have a first combined dimension, and the first and second sections have a second combined dimension greater than the first combined dimension.

6. The semiconductor device structure of claim 4, further comprising:
- a second gate electrode; and
- one or more second conformal layers in contact with at least three sides of the second gate electrode, wherein a top surface of the one or more second conformal layers and a top surface of the second gate electrode are co-planar.

7. The semiconductor device structure of claim 6, wherein the one or more first conformal layers have a first height and the one or more second conformal layers have a second height greater than the first height.

8. The semiconductor device structure of claim 1, further comprising:
- an interlayer dielectric (ILD) in contact with the curved bottom of the second section.

9. The semiconductor device structure of claim 8, further comprising:
- a contact etch stop layer (CESL) disposed between and in contact with the ILD and the first gate spacer, and the curved bottom of the second section is further in contact with the CESL.

10. The semiconductor device structure of claim 1, further comprising:
- a conductive feature in contact with a top surface of the first section.

11. A semiconductor device structure comprising:
- a plurality of fins extending upwardly from a substrate;
- a gate structure disposed over the fins, the gate structure comprising:
  - a gate dielectric layer;
  - one or more conformal layers disposed on the gate dielectric layer;
  - a core gate electrode overlying the one or more conformal layers, the core gate electrode comprising a first section, a second section, a third section, and a fourth section,
  - wherein the first section extends along a first direction and has at least three sides in contact with the one or more conformal layers,
  - wherein the second section extends from an end of the first section along a second direction substantially perpendicular to the first direction,
  - wherein the third section extends along the first direction from an end of the second section and comprises slanted sidewalls forming an angle with respect to the first direction, and
  - wherein the fourth section extends laterally from both sides of the third section and each has a curved bottom surface connecting to the slanted sidewalls of the third section.

12. The semiconductor device structure of claim 11, wherein the curved bottom surface of the fourth section has a lowest point positioned below a junction between the curved bottom surface and the slanted sidewalls of the third section.

13. The semiconductor device structure of claim 11, wherein the slanted sidewalls form the angle of about 30 degrees to about 60 degrees with respect to the first direction.

14. The semiconductor device structure of claim 11, further comprising:
- a first interlayer dielectric (ILD) in contact with the curved bottom surface of the fourth section; and
- a second ILD disposed on a top surface of the fourth section.

15. The semiconductor device of claim 11, wherein the third section has a top surface and the fourth section has a top surface that is co-planar with the top surface of the third section.

16. A semiconductor device comprising:
- a gate dielectric layer disposed over a substrate;
- a core gate electrode disposed on the gate dielectric layer, the core gate electrode comprising:
  - a first rectangular section having a first width;
  - a second rectangular section disposed on the first section and having a second width greater than the first width;
  - a third section disposed on the second section, the third section having slanted sidewalls extending outwardly from the second section to a third width greater than the second width; and
  - a fourth section disposed on the third section and extending laterally from both sides of the third section, the fourth section having a curved bottom surface and a top surface substantially co-planar with a top surface of the third section, wherein the core gate electrode is in contact with a conductive via extending through a second interlayer dielectric (ILD) and electrically connected to an interconnect structure.

17. The semiconductor device of claim 16, wherein the core gate electrode comprises a gate electrode layer and a fill material, and wherein the gate electrode layer and the fill material together define the first through fourth sections.

18. The semiconductor device of claim 16, wherein the first section, the second section, and the third section are integrally formed of a same conductive material.

19. The semiconductor device of claim 16, wherein the fourth section is in contact with both a contact-etch-stop layer (CESL) and a first ILD, and a top surface of the fourth section is substantially co-planar with the second ILD.

20. The semiconductor device of claim 18, wherein the first section, the second section, and the third section are formed of an integral body.

* * * * *